United States Patent
Jenekhe et al.

(10) Patent No.: US 8,871,884 B2
(45) Date of Patent: Oct. 28, 2014

(54) COPOLYMER SEMICONDUCTORS COMPRISING THIAZOLOTHIAZOLE OR BENZOBISTHIAZOLE, OR BENZOBISOXAZOLE ELECTRON ACCEPTOR SUBUNITS, AND ELECTRON DONOR SUBUNITS, AND THEIR USES IN TRANSISTORS AND SOLAR CELLS

(75) Inventors: Samson A. Jenekhe, Seattle, WA (US); Selvam Subramaniyan, Seattle, WA (US); Eilaf Ahmed, Cambridge, MA (US); Hao Xin, Seattle, WA (US); Felix Sunjoo Kim, Seattle, WA (US)

(73) Assignee: University of Washington, Seattle, WA (US)

( * ) Notice: Subject to any disclaimer, the term of this patent is extended or adjusted under 35 U.S.C. 154(b) by 267 days.

(21) Appl. No.: 13/504,058

(22) PCT Filed: Oct. 26, 2010

(86) PCT No.: PCT/EP2010/066179
§ 371 (c)(1),
(2), (4) Date: Jul. 10, 2012

(87) PCT Pub. No.: WO2011/051292
PCT Pub. Date: May 5, 2011

(65) Prior Publication Data
US 2012/0273732 A1    Nov. 1, 2012

Related U.S. Application Data

(60) Provisional application No. 61/255,726, filed on Oct. 28, 2009, provisional application No. 61/389,013, filed on Oct. 1, 2010.

(51) Int. Cl.
*C08F 30/08* (2006.01)
*C08F 234/04* (2006.01)
(Continued)

(52) U.S. Cl.
CPC .......... *C08G 73/22* (2013.01); *C08G 2261/364* (2013.01); *C08G 2261/3223* (2013.01); *C08G*
(Continued)

(58) Field of Classification Search
CPC ...... C08F 230/08; C08F 30/08; C08F 234/04; C08F 34/04
See application file for complete search history.

(56) References Cited

U.S. PATENT DOCUMENTS 3,326,627 A    6/1967   Dressier et al.
6,730,793 B1   5/2004   Kannan et al.
(Continued)

FOREIGN PATENT DOCUMENTS

EP    2085401 A1    8/2009
JP    58009149      1/1983
(Continued)

OTHER PUBLICATIONS

Bjorstrom et al. "Multilayer formation in spin-coated thin films of low-bandgap polyfluorene:PCDM blends", J. Phys.: Condens. Matter 17, 2005, L529-L534.*

(Continued)

*Primary Examiner* — Robert S Loewe
(74) *Attorney, Agent, or Firm* — Foley & Lardner LLP

(57) ABSTRACT

The inventions disclosed, described, and/or claimed herein relate to copolymers comprising copolymers comprising electron accepting A subunits that comprise thiazolothiazole, benzobisthiazole, or benzobisoxazoles rings, and electron donating subunits that comprise certain heterocyclic groups. The copolymers are useful for manufacturing organic electronic devices, including transistors and solar cells. The invention also relates to certain synthetic precursors of the copolymers. Methods for making the copolymers and the derivative electronic devices are also described.

19 Claims, 39 Drawing Sheets

(51) Int. Cl.
H01L 51/42 (2006.01)
H01L 51/00 (2006.01)
C08G 61/12 (2006.01)
C08G 73/22 (2006.01)
H01L 51/05 (2006.01)

(52) U.S. Cl.
CPC .............. 2261/3243 (2013.01); C08G 2261/91 (2013.01); H01L 51/4253 (2013.01); H01L 51/0043 (2013.01); C08G 61/123 (2013.01); C08G 61/124 (2013.01); C08G 2261/92 (2013.01); C08G 2261/3246 (2013.01); C08G 2261/512 (2013.01); C08G 2261/414 (2013.01); C08G 2261/3247 (2013.01); Y02E 10/549 (2013.01); C08G 61/126 (2013.01); C08G 2261/1424 (2013.01); C08G 2261/3241 (2013.01); H01L 51/0558 (2013.01); C08G 2261/1412 (2013.01)
USPC ........... 526/279; 526/280; 526/286; 526/288; 252/500

(56) References Cited

U.S. PATENT DOCUMENTS

| | | | |
|---|---|---|---|
| 8,008,421 B2* | 8/2011 | Gaudiana et al. | 528/40 |
| 2005/0082525 A1* | 4/2005 | Heeney et al. | 257/40 |
| 2007/0131270 A1* | 6/2007 | Gaudiana et al. | 136/244 |
| 2007/0246094 A1* | 10/2007 | Brabec et al. | 136/244 |
| 2007/0282094 A1* | 12/2007 | Marks et al. | 528/377 |
| 2008/0121281 A1 | 5/2008 | Gaudiana et al. | |
| 2009/0230386 A1 | 9/2009 | Yamamoto et al. | |
| 2010/0236631 A1* | 9/2010 | Kiselev et al. | 136/263 |
| 2013/0167929 A1* | 7/2013 | Wen et al. | 136/263 |

FOREIGN PATENT DOCUMENTS

| | | |
|---|---|---|
| JP | 2005206750 | 8/2005 |
| WO | WO2007145482 A1 | 12/2007 |
| WO | WO2008100084 A1 | 8/2008 |
| WO | WO2009103952 A1 | 8/2009 |

OTHER PUBLICATIONS

Jung et al. "Synthesis and Electronluminescent Properties of Fluorine-Based Copolymers Containing Electron-Withdrawing Thiazole Derivatives", Journal of Polymer Science: Part A: Polymer Chemistry, 46, 2008, 7148-7161.*

Zen et al. "Effect of Molecular Weight and Annealing of Poly(3-hexylthiophene)s on the Performance of Organic Field-Effect Transistors", Adv. Funct. Mater. 2004, 14(8), 757-764.*

Lee et al. "Fluorene-Based Alternating Polymers Contianing Electron-Withdrawing Bithazole Units: Preparation and Device Applications", Journal of Polymer Science: Part A: Polymer Chemistry, 43, 2006, 1845-1857.*

Andersson and Inganas, "Non-equilibrium effects on electronic transport in organic field effect transistors." Organic Electronics, vol. 8, No. 4, pp. 423-430, dated Feb. 13, 2007.

Office Action dated Nov. 6, 2013 issued in connection with Chinese Application No. 201080059379.3, with English translation.

Ahmed et al. "Benzobisthiazole-Thiophene Copolymer Semiconductors: Synthesis, Enhanced Stability, Field-Effect Transistors, and Efficient Solar Cells," Macromolecules, (2009), vol. 42, pp. 8615-8618.

Anderson et al. "Non-equilibrium effects on electronic transport in organic field effect transistors," Organic Electronics, (2007), vol. 8, pp. 423-430.

Ando et al., "Characterization and Field-Effect Transistor Performance of Heterocyclic Oligomers Containing a Thiazolothiazole Unit," Chemistry Letters, (2004), vol. 33, No. 9, 1170-1171.

Ando et al., "High Performance n-Type Organic Field-Effect Transistors Based on π-Electronic Systems with Trifluoromethylphenyl Groups," J. Am. Chem. Soc., (2005), vol. 127, pp. 5336-5337.

Ando et al., "Physical properties and field-effect transistors based on novel thiazolothiazole/heterocyclic and thiazolothiazole/phenylene co-oligomers," Synthetic Metals, vol. 156 (2006), pp. 327-331.

Ando et al., "Synthesis, physical properties, and field-effect transistors of novel thiophene/thiazolothiazole co-oligomers," J. Mater. Chem., (2004), vol. 14, pp. 1787-1790.

Babel et al., "Alkyl chain length dependence of the field-effect carrier mobility in regioregular poly(3-alkylthiophene)s," Synthetic Metals, (2005), vol. 148, pp. 169-173.

Beaujuge et al., "Tailoring Structure-Property Relationships in Dithienosilole-Benzothiadiazole Donor-Acceptor Copolymers," J. Am. Chem. Soc., (2009), vol. 131, pp. 7514-7515.

Belfield et al., "Synthesis and characterization of novel rigid two-photon absorbing polymers", Polym. Adv. Technol., (2005), vol. 16, pp. 150-155.

Blouin et al., "A Low-Bandgap Poly(2,7-Carbazole) Derivative for Use in High-Performance Solar Cells," Adv. Mater., (2007), vol. 19, pp. 2295-2300.

Boudreault et al., "A New Poly(2,7-Dibenzosilole) Derivative in Polymer Solar Cells," Macromol. Rapid Commun., (2007), vol. 28, pp. 2176-2179.

Chen et al., "Regiocontrolled Synthesis of Poly(3-alkylthiophenes) Mediated by Rieke Zinc: Their Characterization and Solid-State Properties," J. Am. Chem. Soc., (1995), vol. 117, pp. 233-244.

Huo et al., "Bandgap and Molecular Level Control of the Low-Bandgap Polymers Based on 3,6-Dithiophen-2-yl-2,5-dihydropyrrolo[3,4-c]pyrrole-1,4-dione toward Highly Efficient Polymer Solar Cells," Macromolecules, (2009), vol. 42, pp. 6564-6571.

Huo et al., "Synthesis, Characterization, and Photovoltaic Properties of a Low Band Gap Polymer Based on Silole-Containing Polythiophenes and 2,1,3-Benzothiadiazole," J. Am. Chem. Soc., (2008), vol. 130, pp. 16144-16145.

Jung et al., "Synthesis and Photovoltaic Properties of Cyclopentadithiophene-Based Low-Bandgap Copolymers That Contain Electron-Withdrawing Thiazole Derivatives," Chem. Eur. J., (2010), vol. 16, pp. 3743-3752.

Kim et al., "Air-Stable Ambipolar Field-Effect Transistors and Complementary Logic Circuits from Solution-Processed n/p Polymer Heterojunctions," ACS Appl. Mater. Interfaces, (2010), vol. 2, No. 11, pp. 2974-2977.

Lee et al., "Low band-gap polymers based on quinoxaline derivatives and fused thiophene as donor materials for high efficiency bulk-heterojunction photovoltaic cells," J. Mater. Chem., (2005), vol. 19, pp. 4938-4945.

Liang et al., "Highly Efficient Solar Cell Polymers Developed via Fine-Tuning of Structural and Electronic Properties," JACS, (2009), vol. 131, pp. 7792-7799.

Liao et al., "Photovoltaic-Active Dithienosilole-Containing Polymers," Macromolecules, (2007), vol. 40, pp. 9406-9412.

Liu et al., "Highly Disordered Polymer Field Effect Transistors: N-Alkyl Dithieno[3,2-b:2',3'-d]pyrrole-Based Copolymers with Surprisingly High Charge Carrier Mobilities," JACS, (2008), vol. 130, pp. 13167-13176.

Lu et al., "Synthesis, Characterization, and Transistor Response of Semiconducting Silole Polymers with Substantial Hole Mobility and Air Stability. Experiment and Theory," J. Am. Chem. Soc., (2008), vol. 130, pp. 7670-7685.

Mamada et al., "Preparation, Characterization, and Field-effect Transistor Performance of Benzo[1,2-d:4,5-d]bisthiazole Derivatives," Chemistry Letters, (2008), vol. 37, No. 7, pp. 766-767.

Miao Yang et al., "Synthesis and Photovoltaic Properties of Copolymers from Benzodithiophene and Thiazole," J. Phys. Chem. C (2010), vol. 114, pp. 17989-17994.

Mishra et al., "Highly Air-Stable Thieno[3,2-b]thiopheneThiophene-Thiazolo[5,4-d]thiazole-Based Polymers for Light-Emitting Diodes," Macromolecular Chemistry and Physics, (2010), vol. 211, pp. 1890-1899.

Naraso et al., "Two Poly(2,5-thienythiazolothiazole)s: Observation of Spontaneous Ordering in Thin Films," Macromolecules, (2008), vol. 41, pp. 3169-3174.

(56) References Cited

OTHER PUBLICATIONS

Osaka et al., "High-Lamellar Ordering and Amorphous-Like π-Network in Short-Chain Thiazolothiazole-Thiophene Copolymers Lead to High Mobilities," J. Am. Chem. Soc., (2009), vol. 131, pp. 2521-2529.

Osaka et al., "Highly Stable Semiconducting Polymers Based on Thiazolothiazole," Chem. Mater., (2010), vol. 22, pp. 4191-4196.

Osaka et al., "Novel Thiophene-Thiazolothiazole Copolymers for Organic Field-Effect Transistors," Adv. Mater., (2007), vol. 19, pp. 4160-4165.

Parker, Vernon D., "Energetics of electrode reactions. II. The relationship between redox potentials, ionization potentials, electron affinities, and solvation energies of aromatic hydrocarbons," J. Am. Chem. Soc., (1976), vol. 98, No. 1, pp. 98-103.

Peng et al., "Synthesis and Electroluminescent Properties of Copolymers Based on Fluorene and 2,5-Di(2-hexyloxyphenyl)thiazolothiazole," Macromolecules, (2005), vol. 38, pp. 7292-7298.

Scharber et al., "Influence of the Bridging Atom on the Performance of a Low-Bandgap Bulk Heterojunction Solar Cell," Adv. Mater., (2009), vol. 21, pp. 1-4.

Shi et al., "Synthesis of Copolymers Based on Thiazolothiazole and Their Applications in Polymer Solar Cells," J. Phys. Chem. C (2010), vol. 114, pp. 16843-16848.

Shirota et al., "Charge Carrier Transporting Molecular Materials and Their Applications in Devices," Chem. Rev., (2007), vol. 107, pp. 953-1010.

Tonzola et al., "New n-Type Organic Semiconductors: Synthesis, Single Crystal Structures, Cyclic Voltammetry, Photophysics, Electron Transport and Electroluminiscence of a Series of Diphenylanthrazolines," J. Am. Chem. Soc., (2003), vol. 125, pp. 13548-13558.

Usta et al.,"Dithienosilole- and Dibenzosilole-Thiophene Copolymers as Semiconductors for Organic Thin-Film Transistors," J. Am. Chem. Soc., (2006), vol. 128, pp. 9034-9035.

Zen et al., "Comparative Study of the Field-Effect Mobility of a Copolymer and a Binary Blend Based on Poly(3-alkylthiophene)s," Chem. Mater., (2005), vol. 17, pp. 781-786.

Translation of JP2005206750 (27 pages).

\* cited by examiner

Figure 10 a, b.

COPOLYMER SEMICONDUCTORS COMPRISING THIAZOLOTHIAZOLE OR BENZOBISTHIAZOLE, OR BENZOBISOXAZOLE ELECTRON ACCEPTOR SUBUNITS, AND ELECTRON DONOR SUBUNITS, AND THEIR USES IN TRANSISTORS AND SOLAR CELLS

RELATED APPLICATIONS

This application claims the priority of U.S. Provisional Application No. 61/255,726 filed 28 Oct. 2009, and the priority of U.S. Provisional Application No. 61/389,013 filed 1 Oct. 2010. The entire disclosure of the predecessor application is hereby incorporated herein by reference in its entirety.

STATEMENT OF GOVERNMENT LICENSE RIGHTS

This invention was made with U.S. government support under grants DMR-0805259 from the National Science Foundation and DE-FG02-07ER46467 from the Department of Energy, Basic Energy Sciences. The U.S. Government has certain rights in the invention.

TECHNICAL FIELD OF THE INVENTION

The various inventions disclosed, described, and/or claimed herein relate to the field of semiconducting organic copolymers and their uses, including the manufacture of organic electronic devices, such as transistors and solar cells.

BACKGROUND OF THE INVENTION

Solution-processable conjugated polymer and/or copolymer semiconductors have attracted attention in the art due to their potential applications in making large area, flexible, and low-cost electronic devices, including organic light emitting diodes (OLEDs), solar cells and/or transistors. Variation of the number and kind of copolymer subunits has been used to tune the electronic energy levels of the conjugated copolymers so as to improve the efficiency of the absorption of solar radiation, and/or facilitate charge transport in the solid state polymer semiconductors. Incorporation of heterocyclic aromatic subunits and/or optimizing the polymer chain length have been shown to sometimes enhance intermolecular π-stacking interactions between polymer chains that can induce at least some long range 3-D or 2-D order and/or crystallinity in the solid state, and potentially improve charge carrier mobilities and other desirable electronic properties of the resulting copolymers, and organic electronic devices derived from them. However, given the complexity of the interactions in the relevant electronic states of the polymers, and the complexity of the packing and other physical interactions in the solid state, the predictability of the ultimate solid state properties remains low, and many unexpected results, both positive and negative, are often observed in practice.

Some such polymers and/or copolymers known in the prior art, notably some polythiophene copolymers, have achieved reasonably high hole carrier mobilities and good performance when used to make transistors, or encouraging efficiencies in solar cells for converting solar radiation to electrical energy (3-5%), but most or all such prior art polymers lack good thermal or oxidative stability, or the practical processability characteristics needed in order to make commercially practical electronic devices.

PCT Publication WO 2007/145482 disclosed some broad genera of copolymers comprising thiazolothiazole subunits, and electronic devices comprising, but did not disclose or suggest the copolymers described and claimed herein which comprise or silylene-bithiophene subunits, or the unexpectedly good performance obtained with such copolymers.

US Patent Publication US 2009/0230386 described copolymers comprising benzobisthiazole subunits, and transistors comprising those copolymers, but did not disclose or suggest the use of those copolymers in solar cell devices.

Jung et al (J. Phys. Chem. C 2010, 114, 16843-16848) disclosed certain copolymers comprising thiazolothiazole subunits, and their use in solar cell devices, but did not disclose or suggest the copolymers described and claimed herein which comprise or silylene-bithiophene subunits, or the unexpectedly good performance obtained with such copolymers.

Shi et al (Chem. Eur. J. 2010, 16, 3743-3752) disclosed certain copolymers comprising thiazolothiazole subunits, and their use in transistors and solar cell devices, but did not disclose or suggest the copolymers described and claimed herein which comprise or silylene-bithiophene subunits, or the unexpectedly good performance obtained with such copolymers Nevertheless, there remains an as yet unsatisfied need in the art for new and improved polymeric and/or copolymeric materials, and/or solid materials or compositions derived therefrom that can provide the needed properties for electron or hole transport, as well as improved processability, performance, cost, and thermal and oxidative stability for use in organic electronic devices, especially transistors and solar cells. It is toward solving such as yet unsolved problems that the various embodiments of the various inventions described below are directed.

SUMMARY OF THE INVENTION

The various inventions and/or their many embodiments disclosed herein relate to conjugated copolymers comprising at least one overall repeat unit that itself comprises at least two thiophene or silylene-bithiophene subunits, a thiazolothiazole, benzobisthiazole, or benzobisoxazoles subunit "A," and an additional subunit "D." The inventions described herein also relate to organic electronic devices comprising the copolymers disclosed and described herein, such as OLEDs, transistors and solar cells.

In many embodiments, the inventions described herein relate to copolymers comprising the Formulas (Ia) or (Ib) shown below:

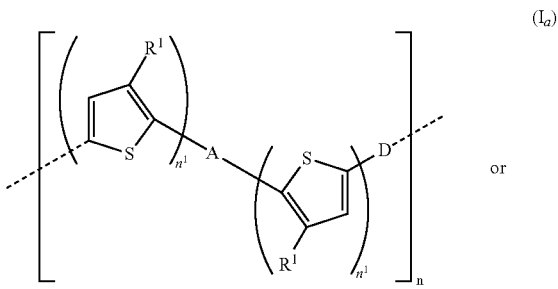

or

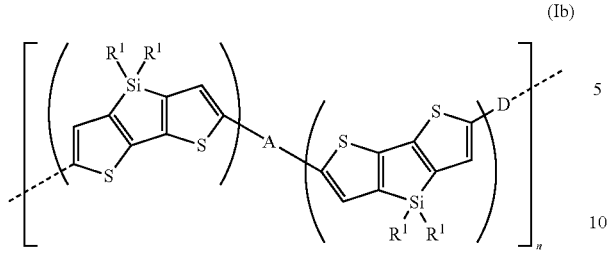

(Ib)

wherein
a) n is a positive integer of 2 or greater,
b) $n^1$ is a positive integer,
c) each $R^1$ is independently selected from hydrogen, a halogen, cyano, or a $C_1$-$C_{18}$ organic radical,
d) A comprises an optionally substituted aromatic aryl or heteroaryl radical comprising a thiazolothiazole, benzobisthiazole, or benzobisoxazoles ring, examples of which include the structures

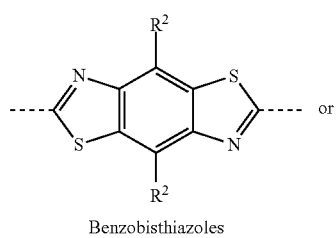

A1

Benzobisthiazoles

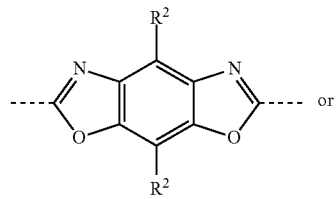

A2

Benzobisoxazoles

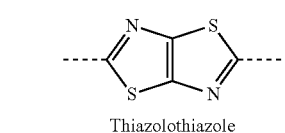

A3

Thiazolothiazole wherein each $R^2$ is an independently selected substituent group, such as for example hydrogen, a halogen, cyano, or a $C_1$-$C_{18}$ organic radical;
e) D comprises an optionally substituted aromatic aryl or heteroaryl radical, examples of which include the structures

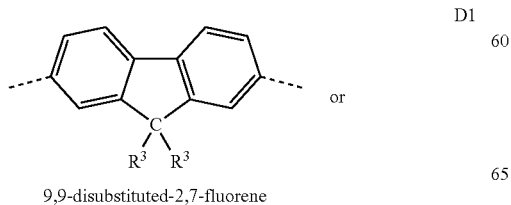

D1

9,9-disubstituted-2,7-fluorene

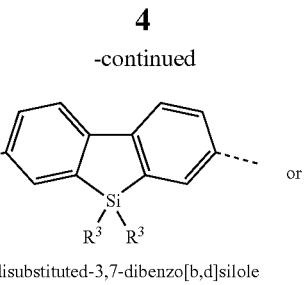

D2

5,5-disubstituted-3,7-dibenzo[b,d]silole

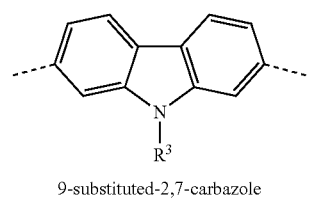

D3

9-substituted-2,7-carbazole

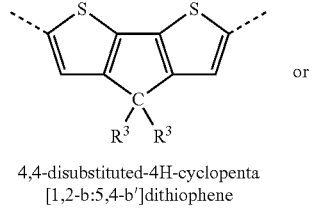

D4

4,4-disubstituted-4H-cyclopenta
[1,2-b:5,4-b']dithiophene

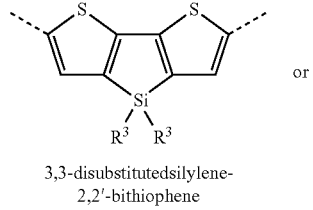

D5

3,3-disubstitutedsilylene-
2,2'-bithiophene

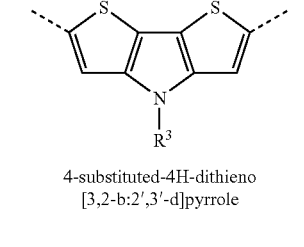

D6

4-substituted-4H-dithieno
[3,2-b:2',3'-d]pyrrole

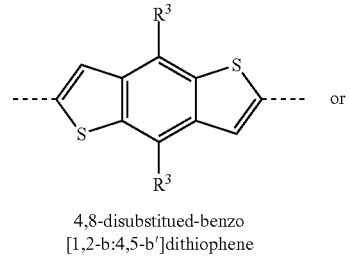

D7

4,8-disubstitued-benzo
[1,2-b:4,5-b']dithiophene

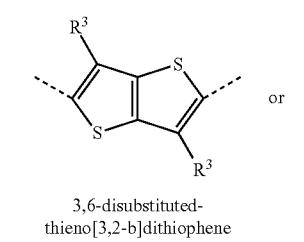

D8

3,6-disubstituted-
thieno[3,2-b]dithiophene

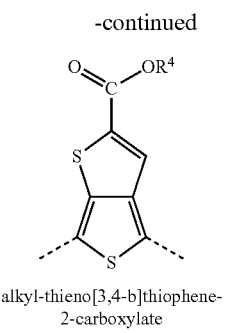

alkyl-thieno[3,4-b]thiophene-
2-carboxylate

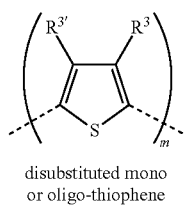

disubstituted mono
or oligo-thiophene wherein each $R^3$ or $R^{3'}$ can be independently selected from hydrogen, a halogen, cyano, or a $C_1$-$C_{18}$ organic radical, and $R^4$ is a $C_1$-$C_{18}$ optionally substituted normal or branched alkyl, or phenyl.

The copolymers having Formulas (Ia) and (Ib) have a conjugated polymer backbone having electronic structures (particularly in their conjugated π orbital systems) that result in highly efficient absorption of ultraviolet, visible, and/or near-infrared light, as well as physical structures and properties that encourage intermolecular facial π-stacking interactions that promotes long range two or three dimensional order in the solid state, which promotes a high mobility of current carriers such as holes. Moreover, the copolymers of Formula (Ia) and (Ib) have been found to possess unexpectedly high melting points and thermal and oxidative stability.

Furthermore, the copolymers of Formulas (Ia) and (Ib) typically have reasonable to good solubility in common organic solvents that allows them to be processed to form thin films, and therefore can be readily employed in solution processes for making organic electronic devices, such as for example transistors, solar cells, and/or organic light emitting diodes (OLEDs).

Furthermore, it has been unexpectedly discovered that a related class of similar copolymers, of Formula (IV) shown below can also be employed to form solar cell devices that convert solar radiation to electrical energy with high efficiency. Accordingly, in some embodiments, the copolymers disclosed herein relate to device for converting solar radiation to electrical energy, comprising a composition comprising a. at least one copolymer comprising the structure:

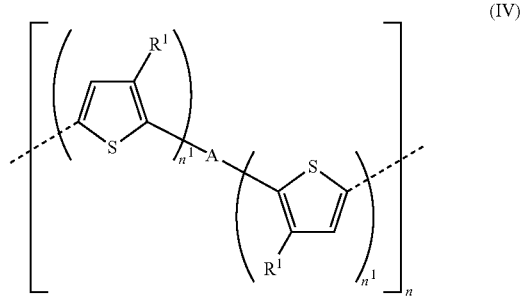

(IV)

wherein
i. n is a positive integer of 2 or greater,
ii. $n^1$ is 1, 2, 3, or 4,
iii. each $R^1$ is independently selected from hydrogen, a halogen, cyano, or a $C_1$-$C_{18}$ organic radical; and
iv. A has one of the structures

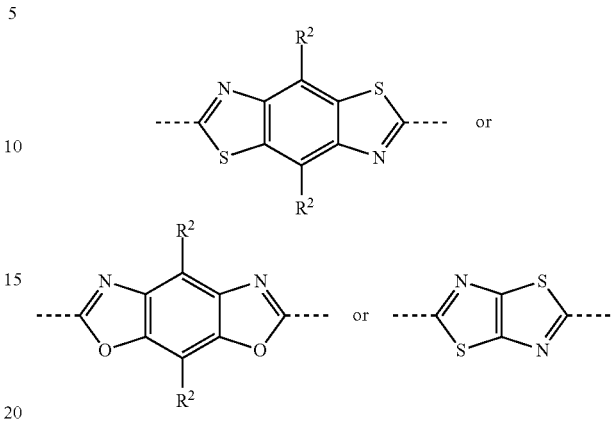

wherein each $R^2$ is independently selected from hydrogen, a halogen, cyano, or a $C_1$-$C_{18}$ organic radical;

b. at least one electron acceptor material.

Further detailed description of preferred embodiments of the various inventions broadly outlined above will be provided below in the Detailed Description section provided below.

DETAILED DESCRIPTION OF THE INVENTION

Figure 1A:
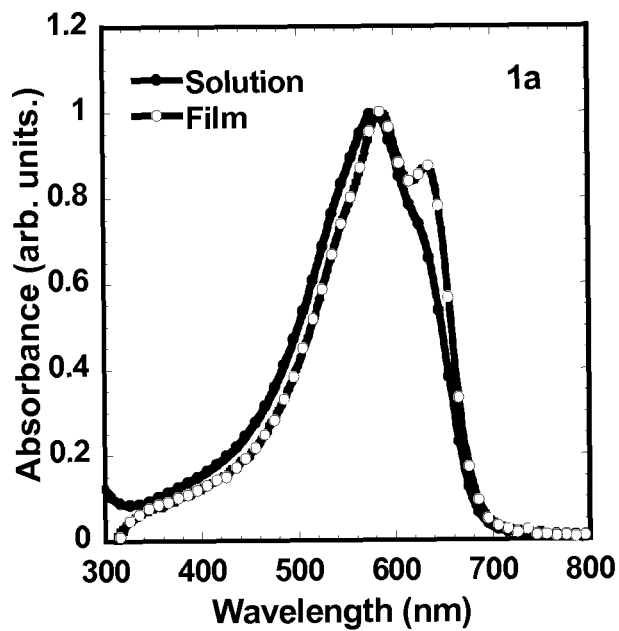
FIG. 1 discloses (a) Absorption spectra of PSOTT in $CHCl_3$ and as a thin film. (b) Cyclic Voltammogram of PSOTT film on a platinum electrode in 0.1 mole/L $Bu_4NPF_6$, $CH_3CN$ solution. See Example 1.

The various inventions and/or their various embodiments disclosed herein generally relate to various genera, subgenera, and/or species of heteroaromatic copolymers having a conjugated polymer backbone comprising at least one repeat unit that itself comprises two thiophene or silylene-bithiophene subunits, an electron acceptor subunit A comprising a thiazolothiazole, benzobisthiazole, or benzobisoxazole ring group, and an additional electron donor subunit D. The inventions described herein also relate to organic electronic devices comprising the various copolymers, including organic light emitting diodes (OLEDs), transistors and solar cells.

In many embodiments, the inventions described herein relate to various genera, subgenera, and/or species of copolymers comprising the repeat units shown in Formula (Ia) shown below, which comprise at least two thiophene repeat subunits:

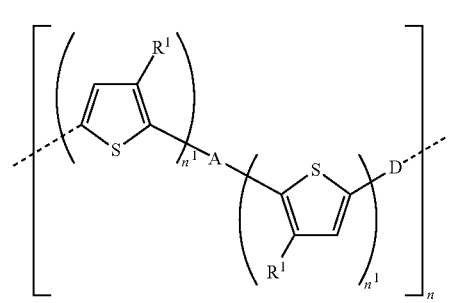

(Ia)

wherein a) n is a positive integer of 2 or greater,
b) $n^1$ is a positive integer,
c) each $R^1$ is independently selected from hydrogen, a halogen, cyano, or a $C_1$-$C_{18}$ organic radical,
d) the A group comprises an optionally substituted aromatic aryl or heteroaryl radical, examples of which include the structures

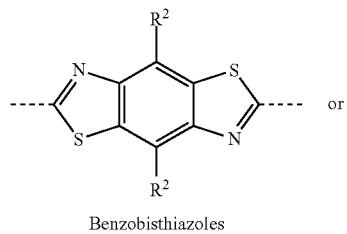

A1

Benzobisthiazoles

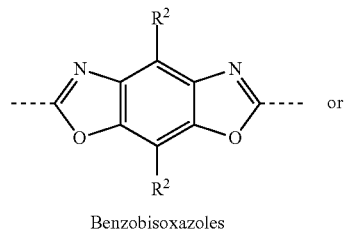

A2

Benzobisoxazoles

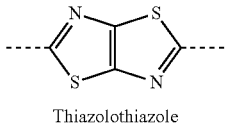

A3

Thiazolothiazole wherein each $R^2$ is an independently selected substituent group, such as for example hydrogen, a halogen, cyano, or a $C_1$-$C_{18}$ organic radical;

e) D comprises an optionally substituted aromatic aryl or heteroaryl radical, examples of which include the structures

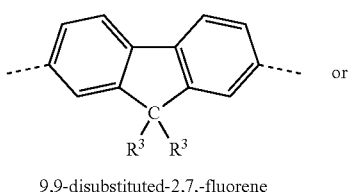

D1

9,9-disubstituted-2,7,-fluorene

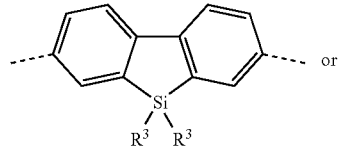

D2

5,5-disubstituted-3,7,-dibenzo[b,d]silole

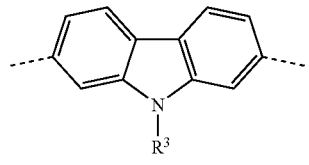

D3

9-substituted-2,7-carbazole

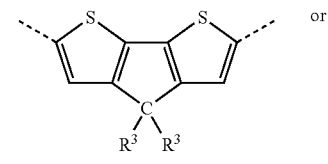

D4

4,4-disubstituted-4H-cyclopenta[1,2-b:5,4-b']dithiophene

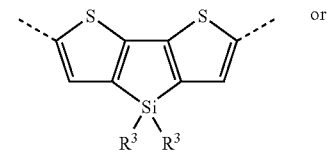

D5

3,3-disubstitutedsilylene-2,2'-bithiophene

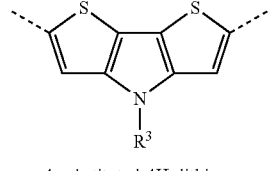

D6

4-substituted-4H-dithieno[3,2-b:2',3'-d]pyrrole

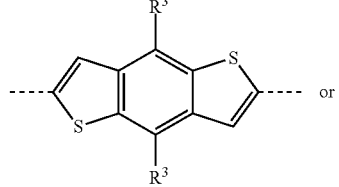

D7

4,8-disubstituted-benzo[1,2-b:4,5-b']dithiophene

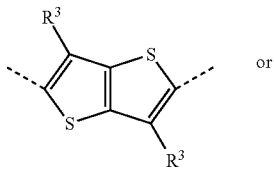

D8

3,6-disubstituted-thieno[3,2-b]thiophene

-continued

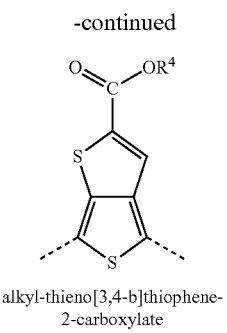

alkyl-thieno[3,4-b]thiophene-
2-carboxylate                                 D9 wherein each $R^3$ is independently selected from hydrogen, a halogen, cyano, or a $C_1$-$C_{18}$ organic radical, and $R^4$ is a $C_1$-$C_{18}$ optionally substituted normal or branched alkyl, or phenyl.

Related genera, subgenera, and/or species of copolymers of Formula (Ib), which comprise two silylene-bithiophene subunits (rather than two thiophene subunits), comprise the repeat units shown in Formula (Ib) shown below:

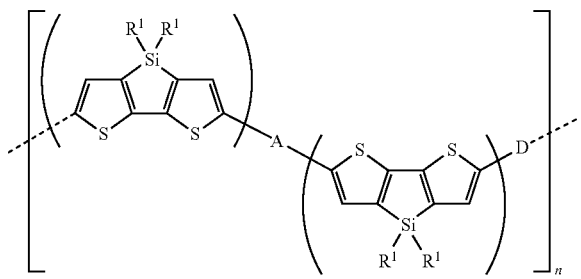

(Ib)

wherein
a. n is a positive integer of 2 or greater,
b. each $R^1$ is an independently $C_1$-$C_{18}$ organic radical;
c. A is a $C_1$-$C_{50}$ optionally substituted heteroaryl group comprising at least one thiazolothiazole, benzobisthiazole, or benzobisoxazole ring group conjugated to both of the neighboring silylene-bithiophene groups, and
d. D is an optional and optionally substituted $C_1$-$C_{50}$ aryl or heteroaryl group comprising at least one aryl or heteroaryl ring group conjugated to both of the neighboring silylene-bithiophene groups In preferred embodiments of the copolymers of Formula (Ib),
a. n is a positive integer of 2 or greater,
b. each $R^1$ is independently selected $C_1$-$C_{18}$ organic radical selected from optionally substituted normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones,
c. A is a $C_1$-$C_{50}$ optionally substituted heteroaryl group comprising at least one thiazolothiazole, benzobisthiazole, or benzobisoxazole ring group conjugated to both of the neighboring silylene-bithiophene groups, and
d. D is a $C_1$-$C_{50}$ optionally substituted aryl or heteroaryl group comprising at least one aryl or heteroaryl ring group conjugated to both of the neighboring silylene-bithiophene groups.

The copolymers of Formulas (Ia) and (Ib) comprise a variety of subgenera and/or species of copolymers, and the additional detailed description below is intended to further describe but not necessarily limit some of those subgenera and species of the copolymers of Formulas (Ia) and/or (Ib). One of ordinary skill in the art will recognize that many additional subgenera and/or species not explicitly described would be obvious and within the scope of the inventions generally disclosed herein.

It should also be understood that the copolymer repeat units defined by Formulas (Ia) and (Ib) do not specify what the terminal groups for the copolymers are, because the identity of the terminal groups, which may include for example hydrogen, any halogen, phenyl, methyl, alkyl, or thiophene, silylene-bithiophene, and the like, and those end groups may vary considerably with the specific details of the method of synthesis of the particular copolymers.

The copolymers described herein, including the copolymers comprising the repeat units of Formulas (Ia) and (Ib) have a conjugated aromatic polymer backbone which comprises at least three different types of repeat subunits, including at least two optionally substituted mono or oligo-thiophene or silylene-bithiophene repeat subunits, and at least one "electron acceptor" subunit "A" comprising a thiazolothiazole, benzobisthiazole, or benzobisoxazole ring group, and at least one "electron donor" repeat subunit D. Both the "electron acceptor" A subunits and "electron donor" repeat subunits D typically comprise from about 4 to about 30 carbon atoms, which can be present in the form of optionally substituted conjugated aromatic aryl or heteroaryl rings, as well as inorganic or organic (carbon containing) or heteroatom-containing substituent groups bonded to those rings. The optional substituents can be varied to modify the electronic and physical properties of the conjugated aryl or hetereoaryl rings in the repeat subunits, so as produce and/or differentiate subunits having "electron acceptor" or "electron donor" electronic properties.

As a result of the combinations of thiophene or silylene-bithiophene subunits, electron donor subunits A, and electron acceptor subunits D, and their optional substituents, internal "charge transfer" absorptions of light or other energy are created that can, upon the absorption of light, transfer electrons from one subunit of the copolymer to another subunit, generating both free electrons in conjugated and mostly unoccupied LUMO orbitals on the acceptor subunit and/or other parts of the copolymer, and corresponding holes in the conjugated HOMO levels of a donor subunit or other part of the copolymer. As a result, the electronic structure of these conjugated copolymers can produce a relatively low energy and conjugated "band" pathway along the conjugated backbone of the polymer, which can produce high mobility of electrons and/or holes, and/or absorption of photons at "tuneable" wavelengths in the ultraviolet, visible, and/or near-infrared range.

It is also possible to "tune" the identity of the copolymer subunits and their optional substituents so as to modulate the electronic and physical properties of the copolymers in the solid state to encourage intermolecular π-stacking that promotes long range two or three dimensional order in the solid state, which promotes a high mobility of current carriers such as holes.

More specifically, the copolymers of Formula (Ia) its subgenera and subspecies copolymers comprise at least two optionally substituted "thiophene" or "oligothiophene" repeat units, typically comprising from about 5 to about 30 carbon atoms, and having the structure

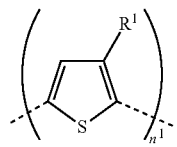

where $n^1$ is a positive integer, for example 1, 2, 3, 4, or more. In many embodiments $n^1$ is 1 or 2, and in many embodiments $n^1$ is 1.

Analogously, the copolymers of Formula (Ib), and its subgenera and subspecies copolymers comprise two optionally substituted "silylene-bithiophene" repeat subunits, typically comprising from about 8 to about 30 carbon atoms, and having the structure

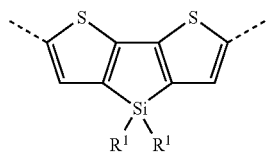

$R^1$ is an optional substituent group for the thiophene or silylene-bithiophene repeat subunits, and are typically independently selected from inorganic groups such as hydrogen or halogens (such as F, Cl, Br, or I), or from organic radical groups that preferably contain from 1 to 18 carbon atoms. Such organic radical groups (a term also used elsewhere herein) could include any organic radical group known to those of ordinary skill in the art that is stable under the conditions of synthesis of the monomers and polymers, and the operating conditions of the organic electronic devices that may contain the copolymers. Such organic radicals can include for example cyano groups, normal or branched alkyls or perfluoroalkyls, normal or branched alkoxy of perfluoroalkoxy groups, and/or normal or branched thioalkyl or perfluorothioalkyl groups and/or their sulfoxide or sulfone derivatives, or small aromatics or heteroaromatics such as phenyl, napthyl, pyridyl, thiophene, furan, pyrrole, and the like, wherein one or all of the hydrogens each of those groups can be optionally substituted with optional heteroatoms or hetereoatomic groups, such as halogens, oxygen or oxygenated organic groups such as ether groups, nitrogen or disubstituted amine groups, such as $N(CH_3)_2$ groups, or the like. In some embodiments, each $R^1$ is independently selected from normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones. In some embodiments, each $R^1$ is independently selected from hydrogen, a halogen, cyano, or a $C_1$-$C_{18}$ organic radical selected from normal or branched alkyls, alkoxys, or thioalkyls.

The copolymers of Formulas (Ia) and (Ib) also comprise at least one optionally substituted subunit A, which typically comprise one or more thiazolothiazole, benzobisthiazole, or benzobisoxazole ring groups conjugated to both of the neighboring thiophene or silylene-bithiophene ring groups having structures including those shown below:

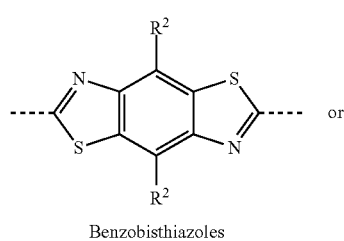

Benzobisthiazoles

A1

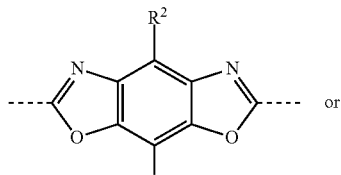

Benzobisoxazoles

A2

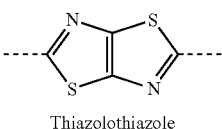

Thiazolothiazole

A3

Moreover, copolymers comprising alternate isomeric forms of the thiazolothiazole, benzobisthiazole, or benzobisoxazole A ring groups such as those shown below are also within the scope of the inventions described and claimed herein.

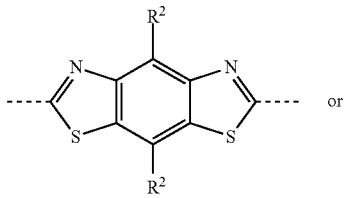

benzo[1,2-d:5,4-d']bis(thiazole)

A1'

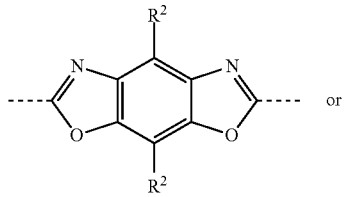

benzo[1,2-d:5,4-d']bis(oxazole)

A2'

The benzobisthiazole, or benzobisoxazole ring groups subunits "A" often comprise up to about 30 carbon atoms.

The A benzobisthiazole, benzobisoxazole, and thiazolothiazole subunits have delocalized LUMO orbitals of relatively low energy, that tend to result in electron accepting or "n-type" electronic properties, including a high electron affinity and/or a high electrochemical reduction potential (See for example, C. J. Tonzola, et al. *J. Am. Chem. Soc.* 2003, 125, 13548-13558 and V. D. Parker, *J. Am. Chem. Soc.* 1976, 98, 98-103). The benzobisthiazole, benzobisoxazole, and thiazolothiazole groups typically also promote high thermal and oxidative stability in the copolymers, and tend to and promote π-stacking interactions between adjacent copolymer molecules, and thereby tend to promote two or three dimensional ordering of the copolymers in the solid state.

The benzobisthiazole and/or benzobisoxazole "A" subunits can comprise one or two independently selected optional $R^2$ substituents, which can be defined analogously to the optional $R^1$ groups for the thiophene or silylene-bithiophene subunits described above. Each $R^2$ substituent can be independently selected from inorganic groups such as hydrogen or halogens (such as F, Cl, Br, or I), or from organic radical groups that preferably contain from 1 to 18 carbon atoms. Such organic radical groups (a term also used elsewhere herein) for $R^2$ could include any organic radical group known to those of ordinary skill in the art that is chemically stable under the conditions of synthesis of the monomers and polymers, and under the operating conditions of the organic electronic devices that may contain the copolymers. Suitable organic radicals for use at $R^2$ can include for example cyano groups, normal or branched alkyls or perfluoroalkyls, normal or branched alkoxy of perfluoroalkoxy groups, and/or normal or branched thioalkyl or perfluorothioalkyl groups and/or their sulfoxide or sulfone derivatives, or small aromatics or heteroaromatics such as phenyl, napthyl, pyridyl, thiophene, furan, pyrrole, and the like, wherein one or all of the hydrogens each of those groups can itself be optionally substituted with optional heteroatoms or hetereoatomic groups, such as halogens, oxygen or oxygenated organic groups such as ether groups, nitrogen or disubstituted amine groups, such as $N(CH_3)_2$ groups, or the like.

In some embodiments, each $R^2$ optional substituent for A can be independently selected from normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones. In some embodiments, each $R^2$ optional substituents for A can be independently selected from hydrogen, a halogen, cyano, or a $C_1$-$C_{18}$ organic radical selected from normal or branched alkyls, alkoxys, or thioalkyls.

The copolymers of Formula (Ia) and (Ib) also comprise at least one optionally substituted subunit D conjugated to both of the neighboring thiophene or silylene-bithiophene subunits. In many embodiments, the D subunits typically comprise one or more conjugated aryl or heteroaryl rings having delocalized HOMO orbitals of relatively high energy that tend to impart electron donor characteristics such as a low ionization potential or a low electrochemical oxidation potential (See for example, Y. Shirota and H. Kageyama, *Chem. Rev.* 2007, 107, 953-1010 and V. D. Parker, *J. Am. Chem. Soc.* 1976, 98, 98-103).

Examples of the D subunits include one or all of the following groups, which are conjugated to both of the neighboring thiophene or silolo-dithiophene groups:

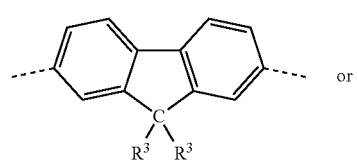

D1

9,9-disubstituted-2,7,-fluorene or

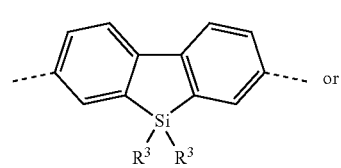

D2

5,5-disubstituted-3,7,-dibenzo[b,d]silole or

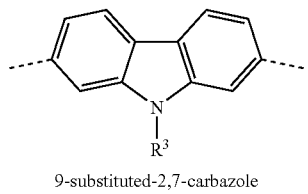

D3

9-substituted-2,7-carbazole

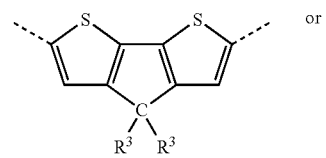

D4

4,4-disubstituted-4H-cyclopenta
[1,2-b:5,4-b′]dithiophene or

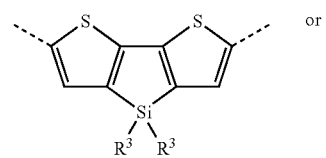

D5

3,3-disubstitutedsilylene-
2,2′-bithiophene or

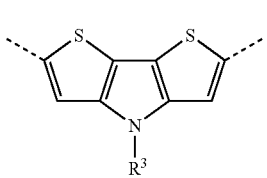

D6

4-substituted-4H-dithieno
[3,2-b:2′,3′-d]pyrrole

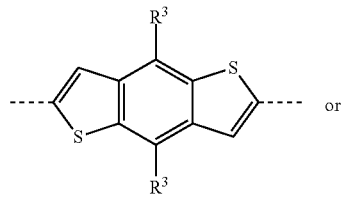

D7

4,8-disubstituted-benzo
[1,2-b:4,5-b′]dithiophene or

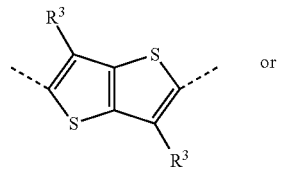

D8

3,6-disubstituted-
thieno[3,2-b]thiophene or

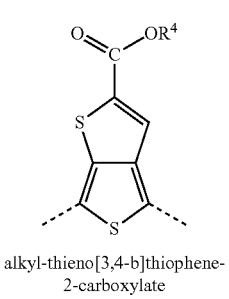

alkyl-thieno[3,4-b]thiophene-
2-carboxylate

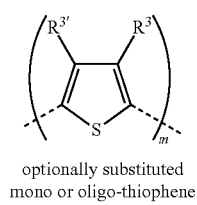

optionally substituted
mono or oligo-thiophene

The D subunits typically comprise from about 2 to about 30 carbon atoms.

Inclusion of the electron donor subunits D in the copolymers (along with the thiophene or polythiophene subunits which are also electron donors) permits fine tuning of the conjugated physical and electronic structure of the resulting copolymers, and also provide a means of varying the structure of the $R^3$ sidechains so as to tune or modulate the solubility of the resulting copolymers in organic solvents, and/or physical properties in the solid state.

$R^3$ (and/or $R^{3'}$) is an optional substituent group for the D repeat subunits, and is typically independently selected from inorganic groups such as hydrogen or halogens (such as F, Cl, Br, or I), or from organic radical groups that can contain from 1 to 18 carbon atoms. In many embodiments, each $R^3$ can be independently selected from hydrogen, a halogen, cyano, or a $C_1$-$C_{18}$ organic radical, such as normal or branched alkyls, normal or branched alkoxy groups, and/or normal or branched thioalkyl groups and/or their sulfoxide or sulfone derivatives, or small aromatics or heteroaromatics such as phenyl, napthyl, pyridyl, thiophene, pyrrole, and the like, and $R^4$ is a $C_1$-$C_{18}$ optionally substituted normal or branched alkyl, or phenyl substituent used to form the carboxylate ester group of the thienothiophene groups D9.

In many embodiments, the optional $R^3$ or $R^{3'}$ substituents for D can include from one to five normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones. In many embodiments, the optional $R^3$ or $R^{3'}$ substituents for D can include independently selected hydrogen, halogen, cyano, or a $C_1$-$C_{18}$ organic radicals selected from normal or branched alkyls, alkoxys, or thioalkyls.

In some embodiments of compounds closely related to copolymers of Formula (Ia) the invention also relates to copolymers comprising the structure:

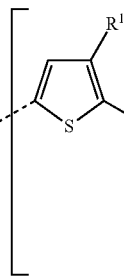

wherein a. n is a positive integer of 2 or greater, b. each $R^1$ is independently selected from hydrogen, a halogen, cyano, or a $C_1$-$C_{18}$ organic radical selected from optionally substituted normal or branched alkyls, alkoxys, or thioalkyls.

The overall number of copolymer repeat units of the copolymers of Formula (Ia) and (Ib) and their subgenera and species, n, is a positive integer of 2 or greater, or between 2 and 10,000, or between 10 and 1000 subunits. Typically higher values of n (and the corresponding copolymer molecular weights) improve the degree of intermolecular π-stacking and/or charge carrier mobilities in the solid state, but higher molecular weights can result in lower solubility in common organic solvents, and therefore can in some cases decrease the practical processability of the polymers and/or the ability to easily cast thin films needed to make organic electronic micro-devices.

The various genera and subgenera of the copolymers of Formulas (Ia) and (Ib) can be used as pure compounds or formulated with other materials to form compositions that are useful for making organic electronic devices, including transistors and solar cells.

In some embodiments, the inventions provided herein relate to certain subgenera of the copolymers of Formula (Ia) having the Formula (IIa) shown below:

(IIa)

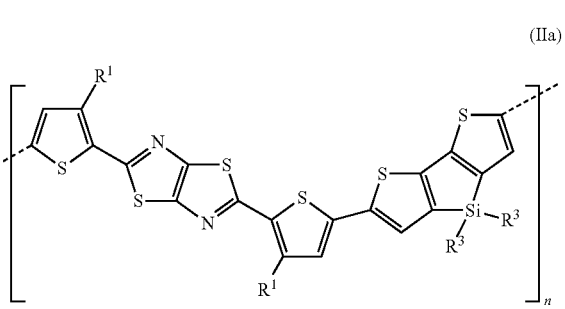

wherein $R^1$ and $R^3$ are independently selected $C_4$-$C_{12}$ normal or branched alkyls or alkoxides.

Examples of species of copolymers within the subgenus of Formula (IIa) is the copolymer PSOTT described in Example 1 below, or PSOxTT as described in Example 2.

In additional embodiments, the inventions provided herein relate to certain subgenera of the copolymers of Formula (Ib) having the Formula (IIb) shown below:

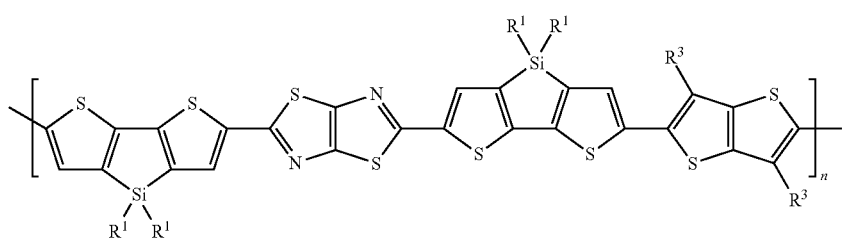

(IIb)

wherein $R^1$ can be independently selected from normal or branched $C_4$-$C_{12}$ alkyls, and $R^3$ can be independently selected normal or branched $C_4$-$C_{12}$ alkyls or alkoxides.

Examples of species of copolymers within the subgenus of Formula (IIb) is the copolymer PTBSTT described in Example 8 below.

In other embodiments, the inventions provided herein relate to certain subgenera of the copolymers of Formula (Ia) having the Formula (III) shown below:

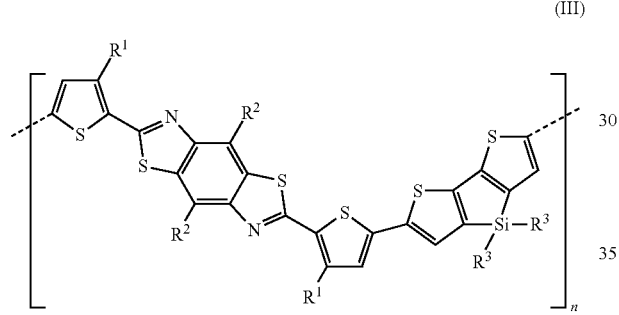

(III)

wherein $R^1$ and $R^3$ are independently $C_4$-$C_{12}$ n-alkyl or n-alkoxide and $R^2$ is hydrogen, $C_4$-$C_{12}$ n-alkyl or n-alkoxides.

The copolymers of Formulas (Ia) and (Ib) and their various subgenera and species have been found to possess unexpectedly high melting points and unexpectedly superior thermal and oxidative stability. Moreover, the copolymers of Formula (I) show unexpectedly superior properties such as very high charge carrier mobilities in the solid state and in applications in transistors (as shown by Example 6) or solar cells (Example 7).

Furthermore, the copolymers of Formulas (Ia) and (Ib) typically have good or adequate solubility in common organic solvents to allow them to be employed to form thin films, and therefore be employed in solution processes for making organic electronic devices, such as for example transistors, solar cells, and/or organic light emitting diodes (OLEDs).

Devices Comprising Copolymers not Having D Repeat Subunits

Furthermore, it has been unexpectedly discovered that a related class of copolymers, of Formula (IV) shown below, which do not comprise the D repeat subunits can also be employed to make solar cell devices that convert solar radiation to electrical energy with good efficiency. Accordingly, in some embodiments, the inventions disclosed herein relate to device for converting solar radiation to electrical energy, comprising a composition comprising a. at least one copolymer comprising the structure:

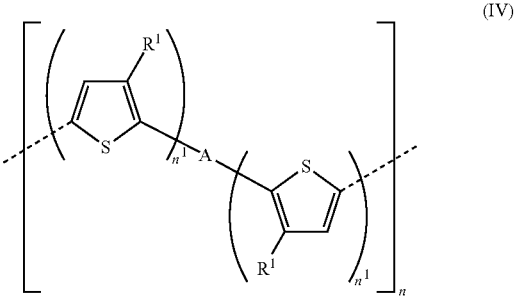

(IV)

wherein
i. n can be a positive integer of 2 or greater,
ii. $n^1$ can be 1, 2, 3, or 4,
iii. each $R^1$ can be independently selected from hydrogen, a halogen, cyano, or a $C_1$-$C_{18}$ organic radical; and
iv. A can be one of the structures

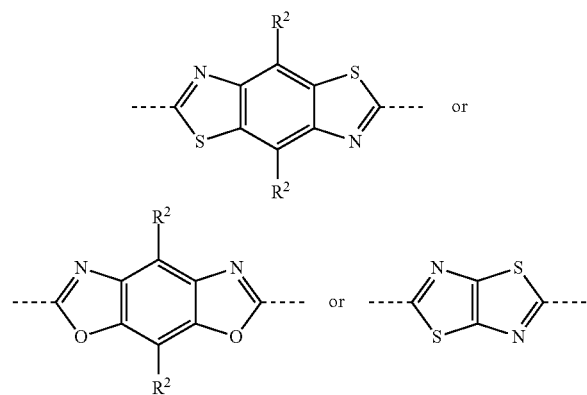

wherein each $R^2$ is independently selected from hydrogen, a halogen, cyano, or a $C_1$-$C_{18}$ organic radical; and
b. at least one electron acceptor material.

In the copolymers of Formula (IV), the definitions of the $R^1$ and $R^2$ groups, n, and $n^1$ can be the same as those of the copolymers of Formula (I) disclosed above.

The electron acceptor material of the composite material can be a variety of materials that have a LUMO energy level that is at least about 0.2 to 0.6 eV more negative than the LUMO energy level of the copolymers described herein and a HOMO energy level that is more negative than the HOMO energy level of the present copolymers. In many embodiments, the electron acceptor material can be a fullerene or a modified fullerene (e.g., $C_{61}$-phenyl-butyric acid methyl ester, $PC_{61}BM$, or $C_{71}$-phenyl-butyric acid methyl ester, $PC_{71}BM$). In other embodiments, the electron acceptor material can be another semiconducting polymer having appropriate LUMO and HOMO energies (at least about 0.2-0.6 eV more negative than the LUMO energy level and a more negative HOMO energy level than the HOMO energy level of the copolymers described herein).

Examples of particular copolymers of Formula (IV), wherein A is a thiazolothiazole group and $R^1$ is an alkyl group (PBTOTT), and where A is a thiazolothiazole group and $R^1$ is an alkoxy group (PBTOxTT) are presented in Examples 3 and 4. An example of a copolymer of Formula (IV) wherein A is a benzobisthiazole group and $R^1$ is an alkyl group (PBTOT) is presented in Example 5. Example 7 presents data on the unexpectedly superior performance of these copolymers as a component in an active light-absorbing composition employed in a solar cell.

Synthesis of Polymerizable Oligomers

Generic synthetic schemes for making polymerizable comonomers required to synthesize the polymers of the invention are presented below, and specific examples of such generic synthetic methods are also provided below in the "Examples" section of this disclosure.

Presented immediately below are generic synthetic schemes for making polymerizable versions of the electron acceptor repeat units, bonded to two polymerizable thiophene units.

Synthesis of Polymerizable Bis(alkylthiophene)Thiazolothiazoles

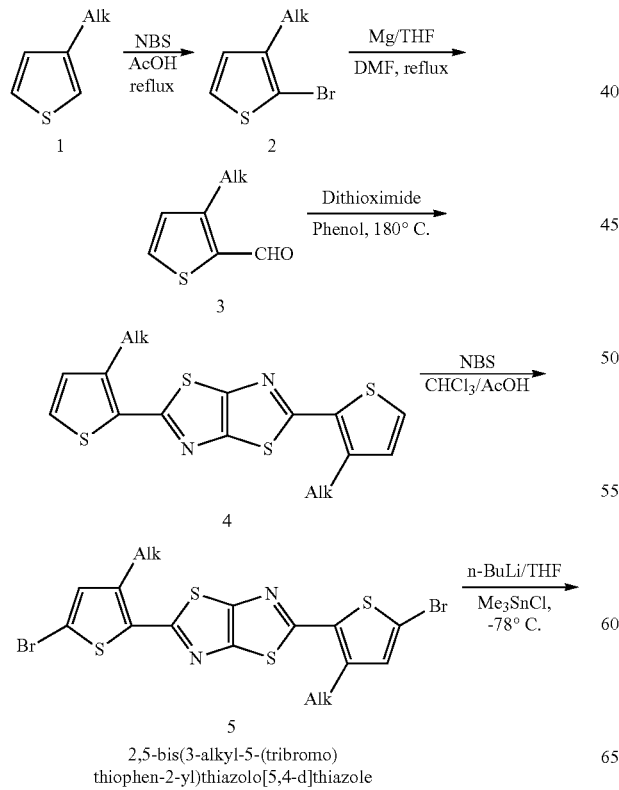

Synthesis of Polymerizable Bis(alkoxythiophene)Thiazolothiazoles

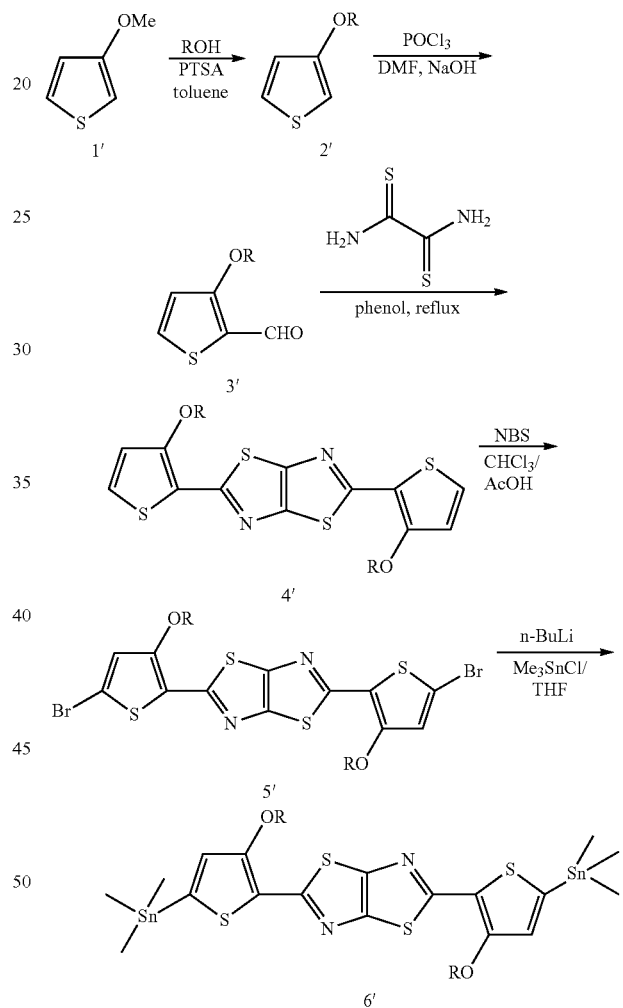

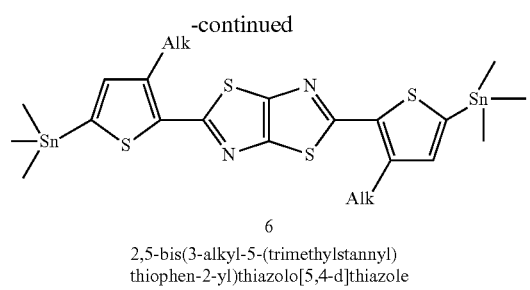

6

2,5-bis(3-alkyl-5-(trimethylstannyl)thiophen-2-yl)thiazolo[5,4-d]thiazole

Synthesis of Polymerizable Bis(alkylthiophene)Benzobisthiazoles

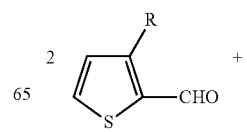

23
-continued
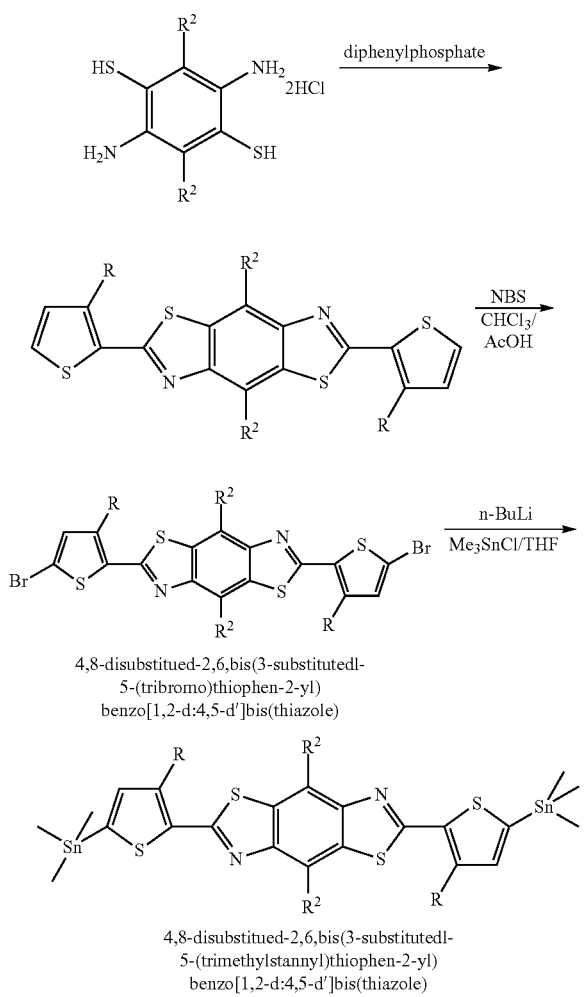
Synthesis of Polymerizable
Bis(alkylthiophene)Benzobisoxazoles
24
-continued
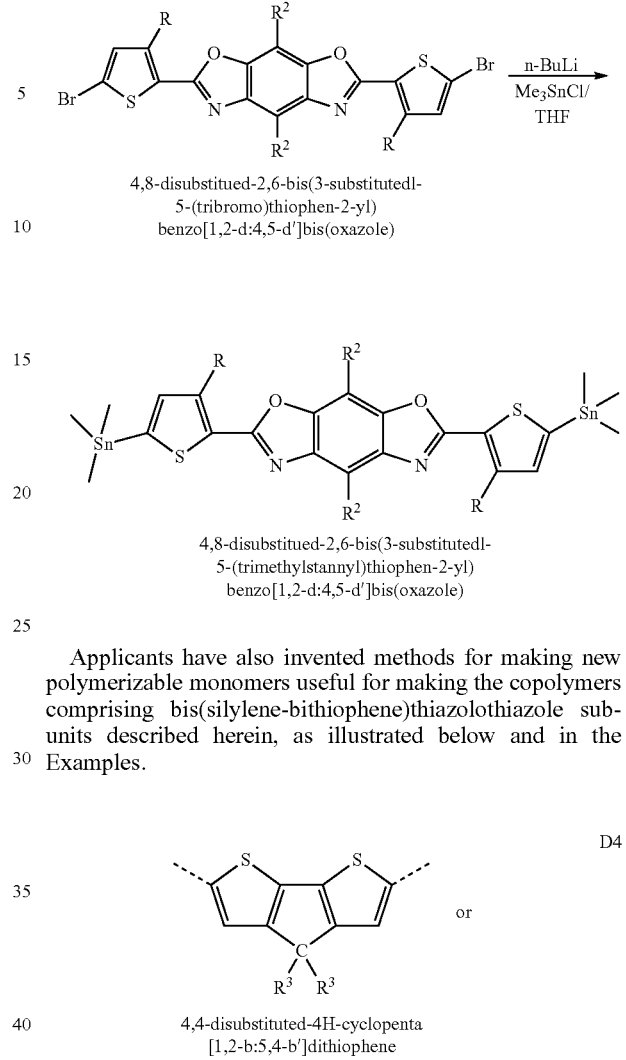
Applicants have also invented methods for making new polymerizable monomers useful for making the copolymers comprising bis(silylene-bithiophene)thiazolothiazole subunits described herein, as illustrated below and in the Examples.
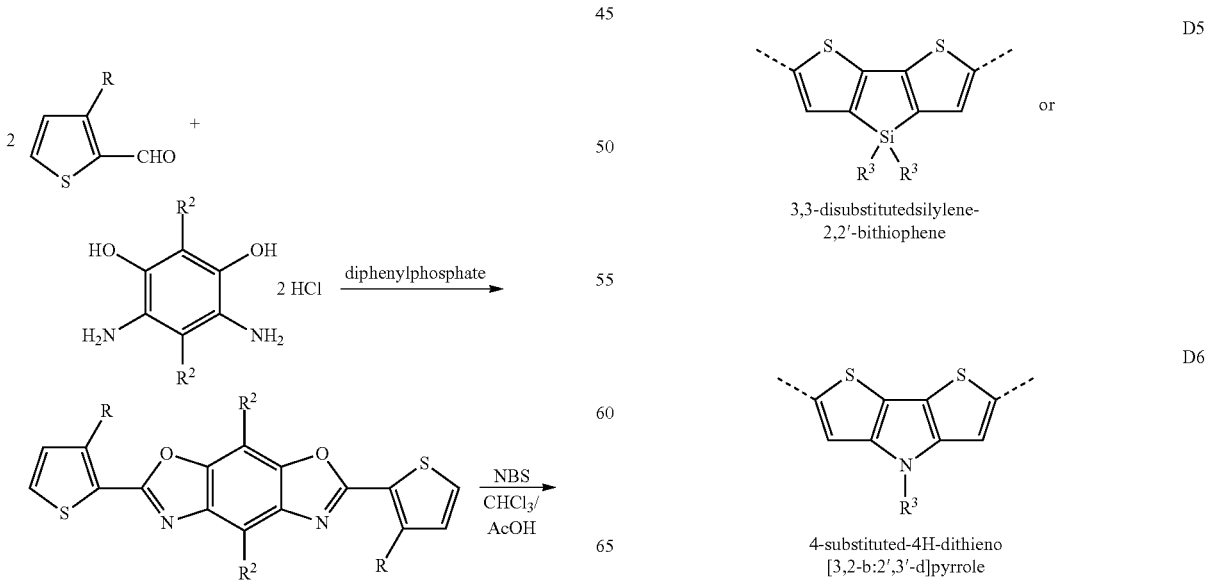

Synthesis of Polymerizable
Bis(silylene-bithiophene)Thiazolothiazoles

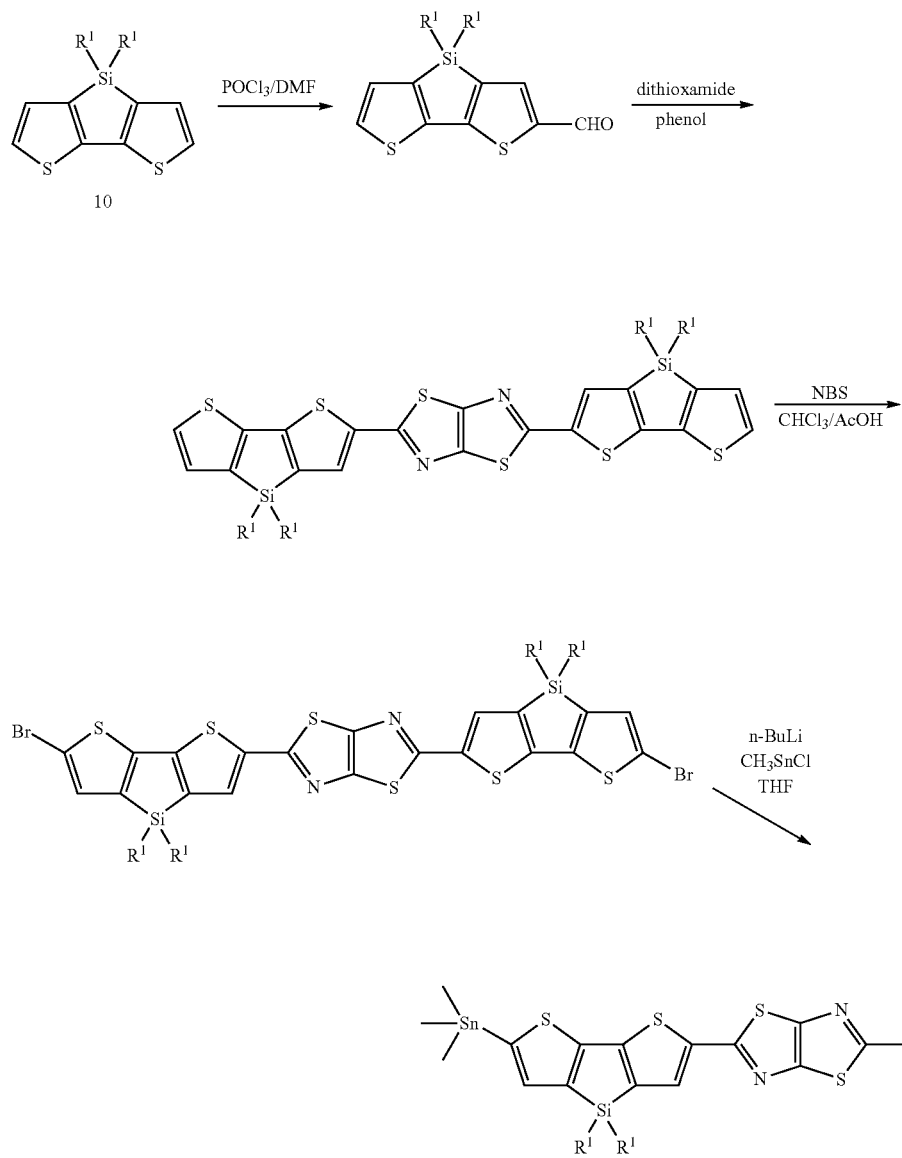

The $R^1$ groups bonded to the silicon atoms in the synthetic scheme above can be a wide variety or organic substituent groups, and a number of potentially polymerizable groups can be introduced at the terminal positions in the illustrated Bis(silylene-bithiophene)thiazolothiazoles, as would be obvious to those of ordinary skill in the art, such as for example the borate ester groups used in the well known palladium catalyzed Suzuki coupling methods. Nevertheless, the illustrated Bis(silylene-bithiophene)thiazolothiazoles are believed to be new and non-obvious compounds useful for making the corresponding copolymers described herein.

Accordingly, in some embodiments, Applicants inventions relate to oligomeric bis(silylene-bithiophene)thiazolothiazole compounds having the structure

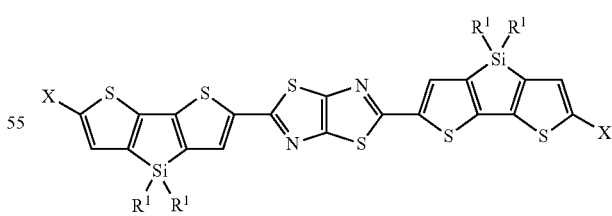

wherein each $R^1$ is independently selected from normal or branched $C_4$-$C_{12}$ alkyls, and each X is independently selected from hydrogen, a halide, $SnR_3$, and $-B(-OR)_2$ wherein each R is an independently selected alkyl or aryl, or the R groups together form an optionally substituted alkylene group bridging the oxygen atoms.

Similarly, Applicants have invented methods for making polymerizable bis(silylene-bithiophene)benzobisthiazole compounds, as illustrated in the synthetic diagram below;

Synthesis of Polymerizable Bis(silylene-bithiophene)Benzobisthiazoles

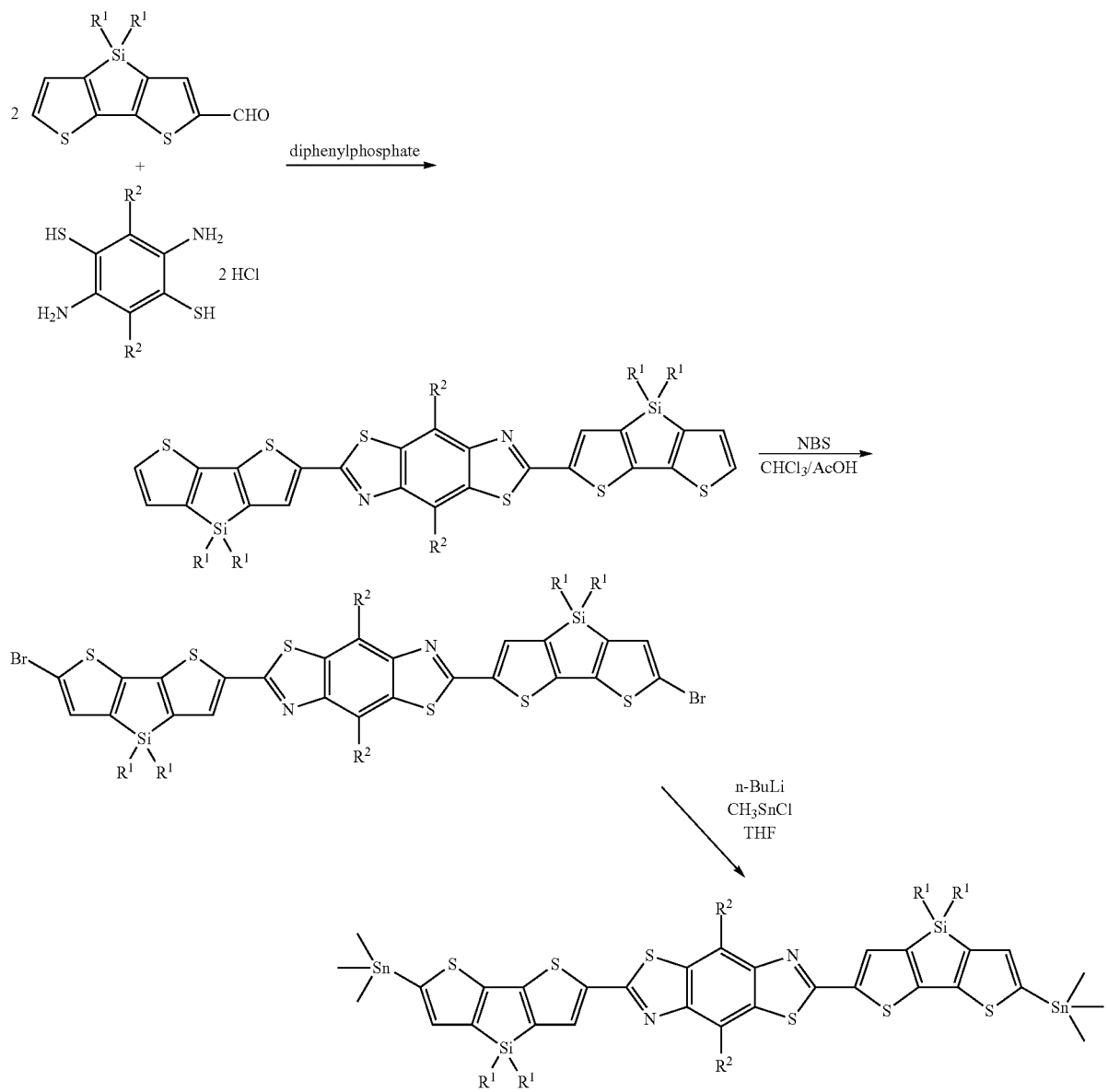

The R¹ groups bonded to the silicon atoms in the synthetic scheme above can be a wide variety or organic substituent groups as described elsewhere herein, and a number of potentially polymerizable groups can be introduced at the terminal positions in the illustrated bis(silylene-bithiophene)benzobisthiazole compounds, as would be obvious to those of ordinary skill in the art, such as for example the borate ester groups used in the well known palladium catalyzed Suzuki coupling methods. Nevertheless, the illustrated bis(silylene-bithiophene)benzobisthiazole compounds are believed to be new and non-obvious compounds useful for making the corresponding copolymers described herein.

Accordingly, in some embodiments, Applicants inventions relate to oligomeric bis(silylene-bithiophene)benzobisthiazole compounds having the structure

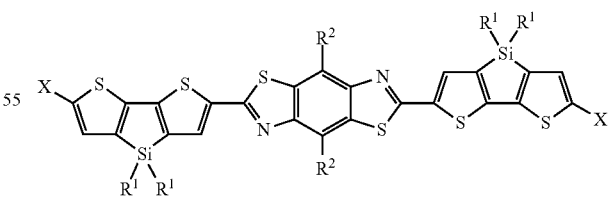

wherein each $R^1$ is independently selected from normal or branched $C_4$-$C_{12}$ alkyls, and each $R^2$ is independently selected from hydrogen, cyano, normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones; and each X is independently selected from hydrogen, a halide, $SnR_3$, and —B(—OR)$_2$ wherein each R is an independently selected alkyl or aryl, or the R groups together form an optionally substituted alkylene group bridging the oxygen atoms.

Similarly again, Applicants have invented methods for making polymerizable bis(silylene-bithiophene)benzobisoxazoles compounds, as illustrated in the synthetic diagram below;

The R$^1$ groups bonded to the silicon atoms in the synthetic scheme above can be a wide variety or organic substituent groups as described elsewhere herein, and a number of potentially polymerizable groups can be introduced at the terminal positions in the illustrated bis(silylene-bithiophene)benzobisoxazole compounds, as would be obvious to those of ordinary skill in the art, such as for example the borate ester groups used in the well known palladium catalyzed Suzuki coupling methods. Nevertheless, the illustrated bis(silylene-bithiophene)benzobisoxazole compounds are believed to be new and non-obvious compounds useful for making the corresponding copolymers described herein.

Synthesis of Polymerizable
Bis(silylene-bithiophene)Benzobisoxazoles

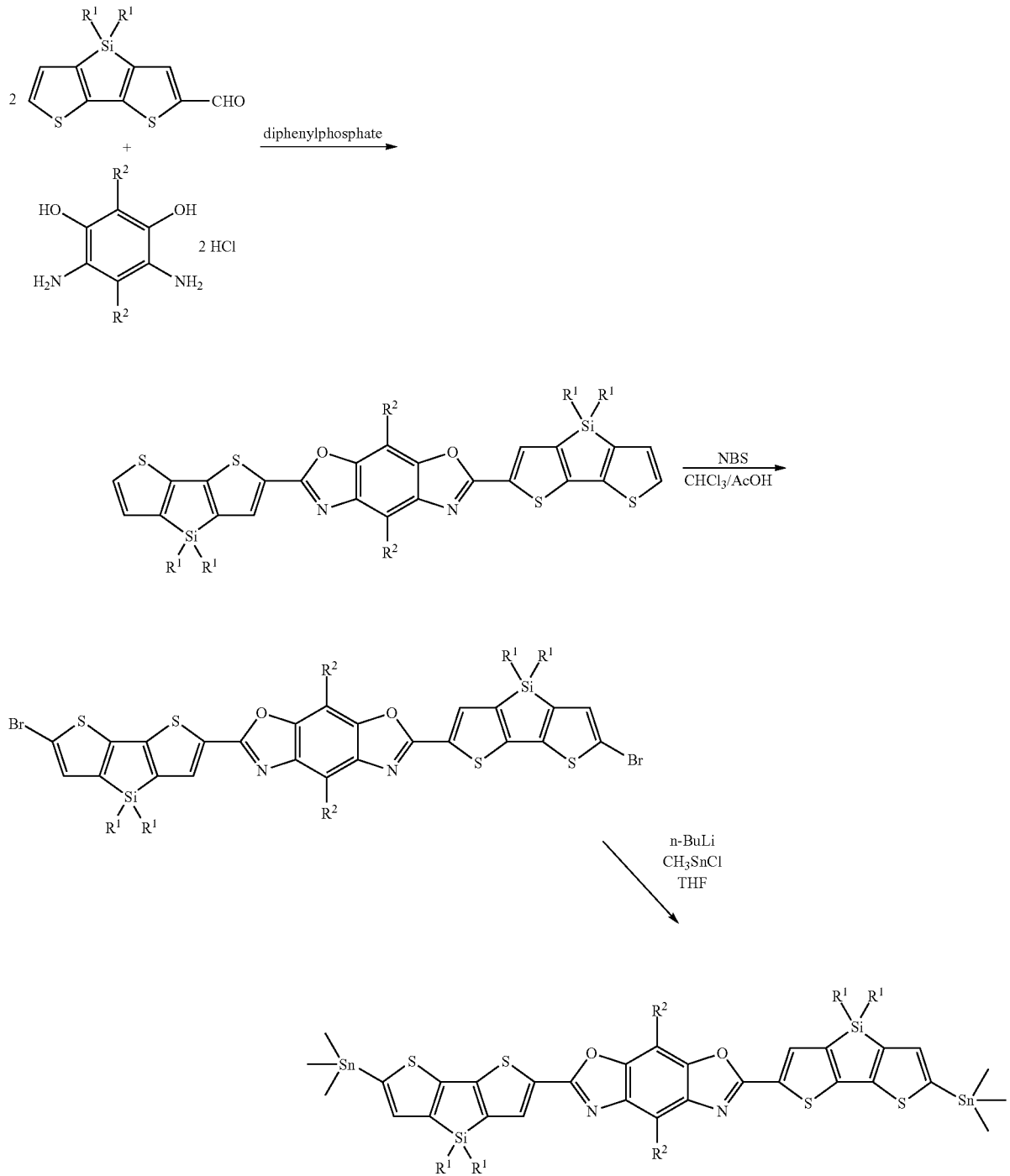

Accordingly, in some embodiments, Applicants inventions relate to oligomeric bis(silylene-bithiophene)benzobisoxazole compounds having the structure

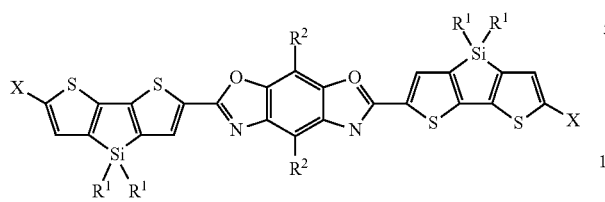

wherein each $R^1$ is independently selected from normal or branched $C_4$-$C_{12}$ alkyls, and each $R^2$ is independently selected from hydrogen, cyano, normal or branched alkyls, perfluoroalkyls, alkoxys, perfluoroalkoxys, thioalkyls, perfluorothioalkyls, alkylsulfoxides, perfluorosulfoxides, alkyl sulfones, or perfluoroalkyl sulfones, and each X is independently selected from hydrogen, a halide, SnR3, and —B(—OR)$_2$ wherein each R is an independently selected alkyl or aryl, or the R groups together form an optionally substituted alkylene group bridging the oxygen atoms.

Synthesis of Polymerizable "D" Comonomers

Presented immediately below are generic synthetic schemes for making copolymerizable monomeric versions of the "D" electron donor repeat units, many of which polymerizable compounds are known in the prior art.

Synthesis of Polymerizable Benzodithazoles

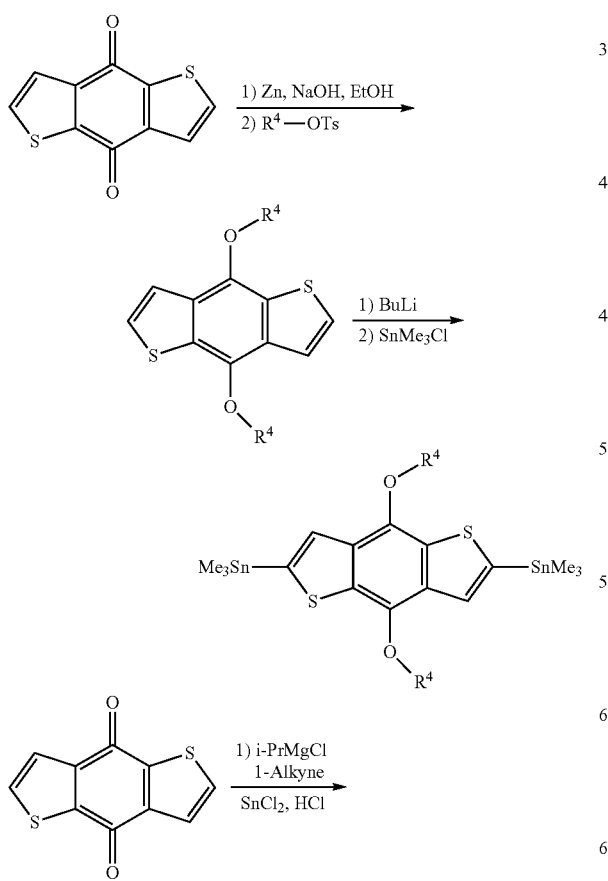

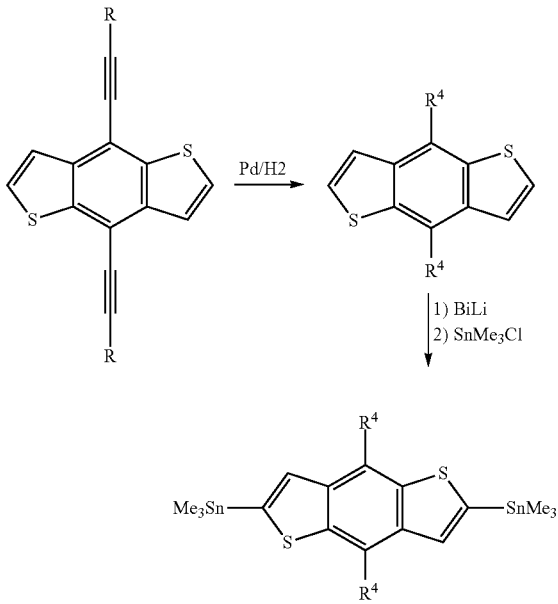

4,8-dialkylbenzo[1,2-b:4,5-b']dithiophene
See Liang et al *JACS* 131 7792-7799 2009

Synthesis of Polymerizable Thienothiophene Carboxylate Esters

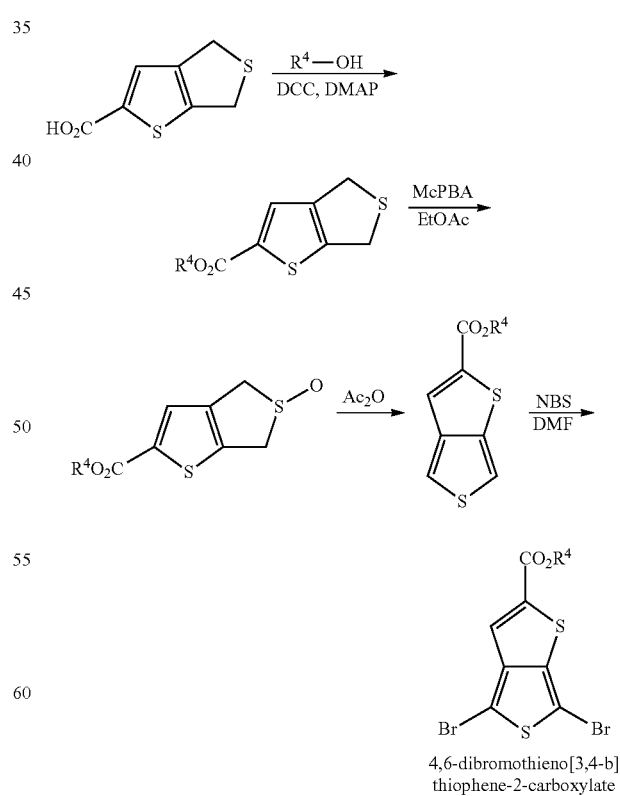

4,6-dibromothieno[3,4-b]thiophene-2-carboxylate ester

See Liang et al, *JACS* 131 7792-7799 2009

Synthesis of Polymerizable 9-Substituted Carbazoles
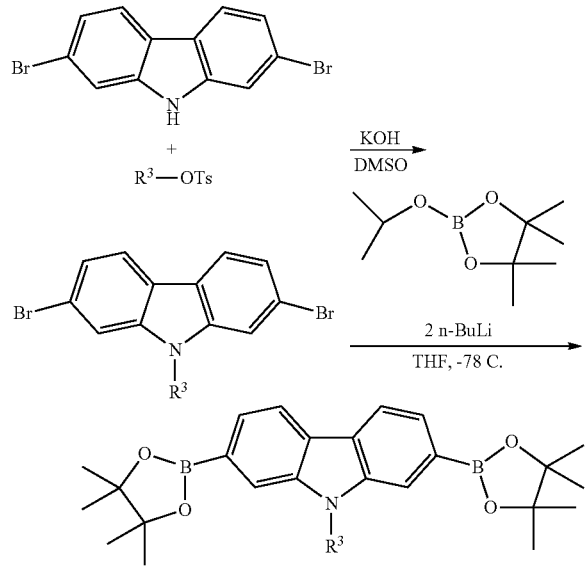
See Blouin et al, *Adv. Mater.* 19, 2295-2300 2007
Synthesis of Polymerizable Silylene-bithiophenes
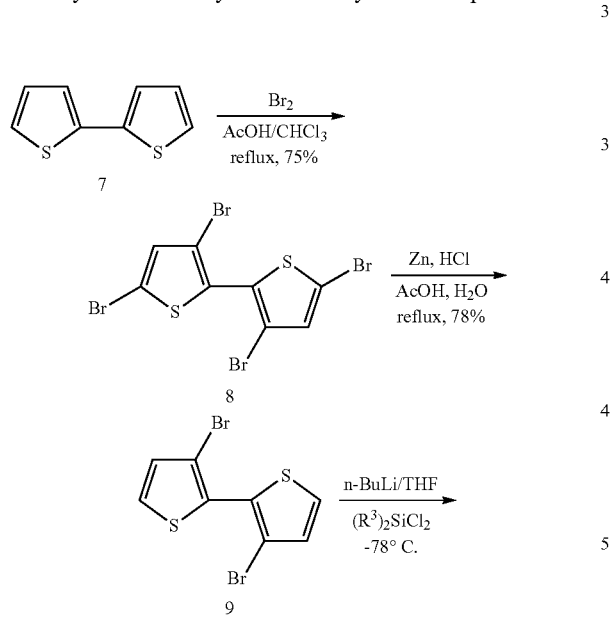
Synthesis of Polymerizable Dithienopyrroles
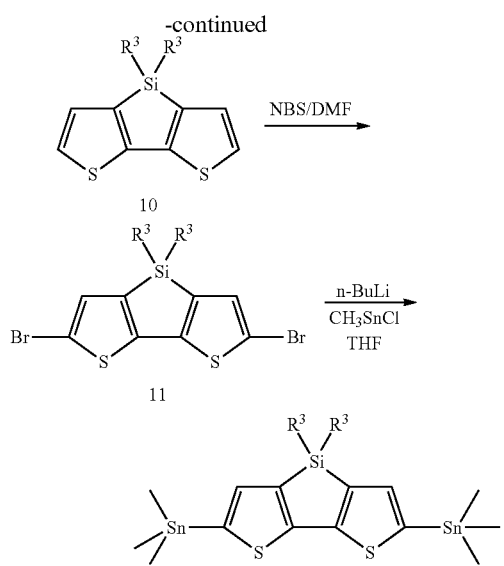
See Lu et al, *JACS* 130 7670-7685 2008
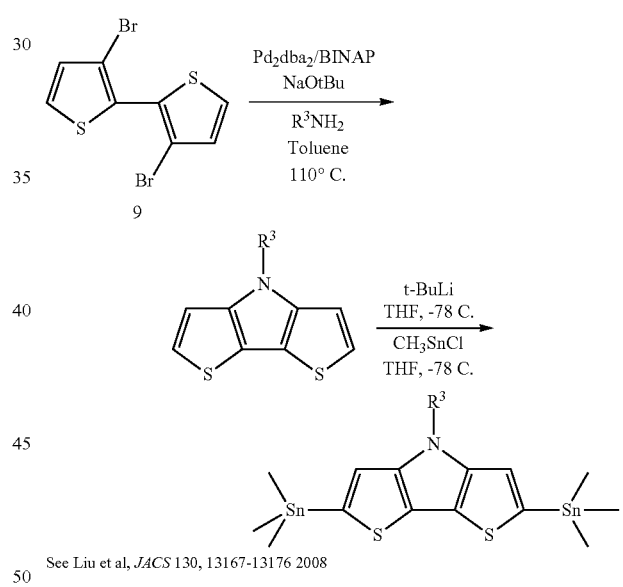
See Liu et al, *JACS* 130, 13167-13176 2008
Synthesis of Polymerizable DibenzoSiloles
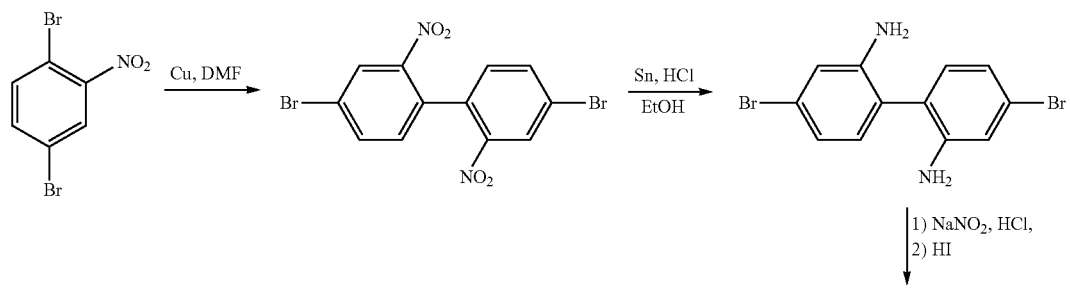
1) NaNO₂, HCl,
2) HI

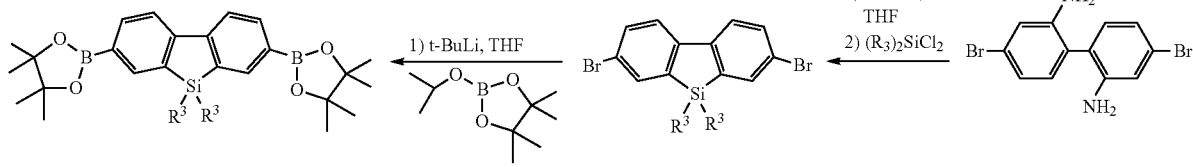

See Lu et al, *JACS* 130, 7670-7685 2008

Synthesis of Polymerizable 9-Substituted Carbazoles

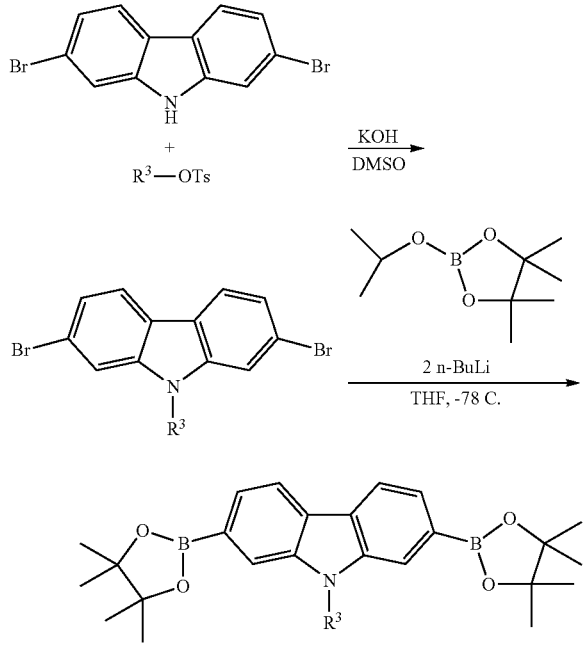

See Blouin et al, *Adv. Mater.* 19, 2295-2300 2007

Synthesis of Polymerizable Thienothiophene Monomers

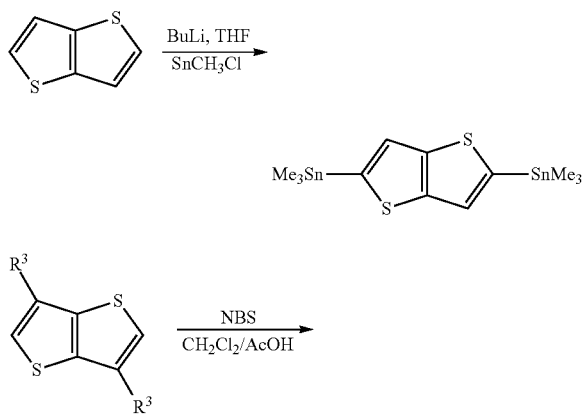

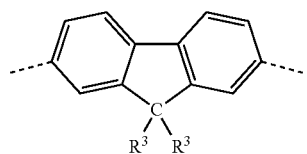

See Lee et al, *J. Mater. Chem.* 4938-4945 2005

The references cited above in connection with the synthetic schemes are hereby incorporated by reference herein for their disclosures relating to methods of synthesis of the monomers referenced above.

Polymerizable fluorene-boronic ester comonomers having the structures shown below are commercially available from Sigma Aldrich of Milwaukee Wis.

Synthesis of Donor/Acceptor Copolymers

The generic reaction schemes shown below illustrate various methods for copolymerizing the co-oligomers and/or comonomers whose synthesis was generically described above. Specific examples of such methods are provided in the Examples section of the disclosure below.

Copolymerization Methods to Produce Thiazolothizole/Bisthiophene-Based Copolymers

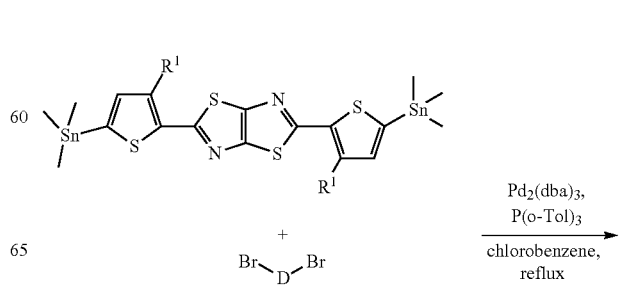

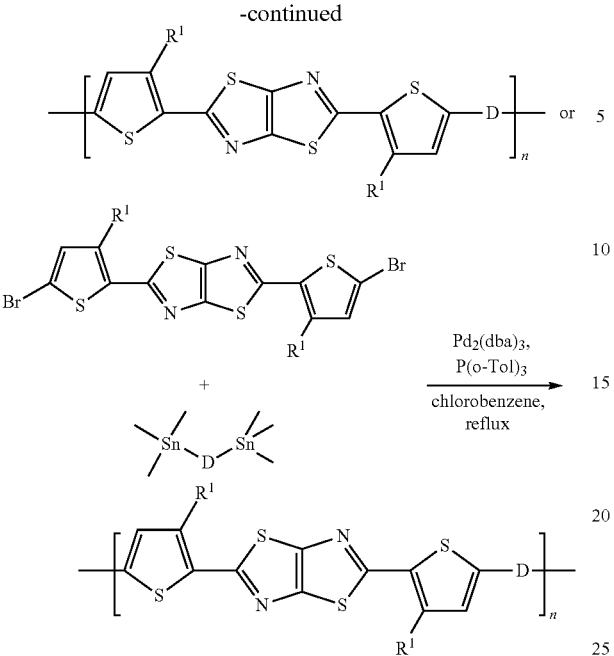
Copolymerization Methods to Produce Thiazolothiazole/Silylene-bithiophene Based Copolymers
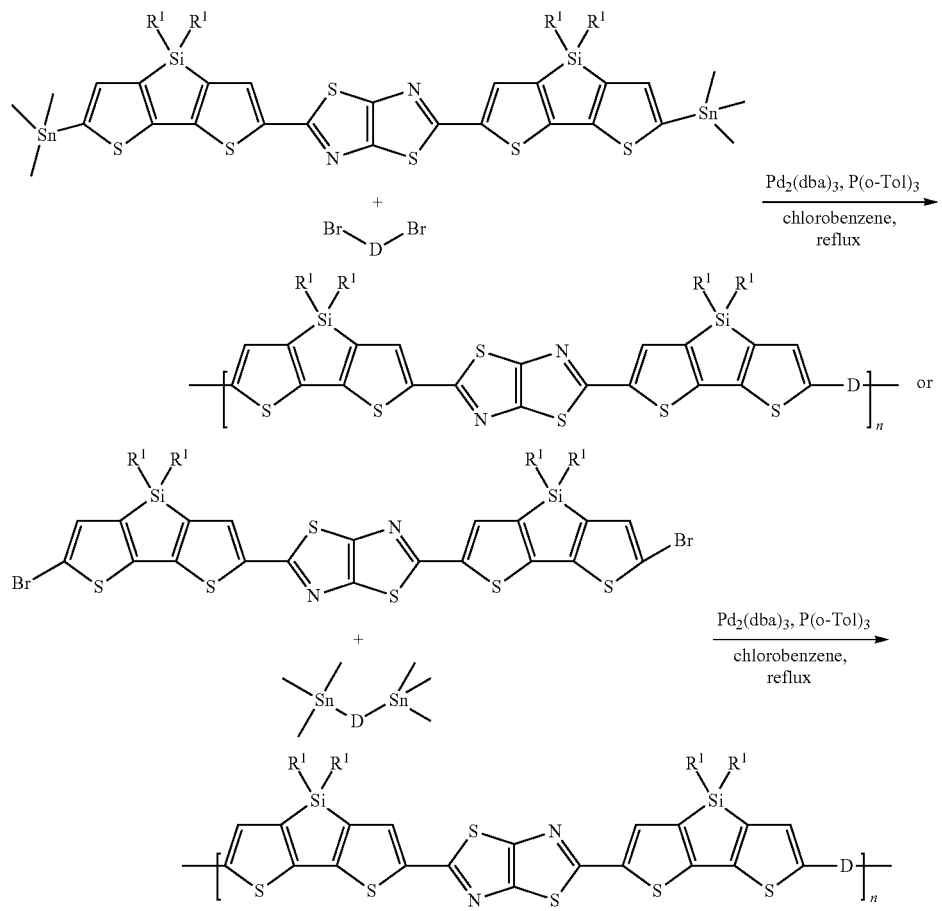

Copolymerization Methods to Produce
Benzobisthiazole/Silylene-Bithiophene-Based
Copolymers
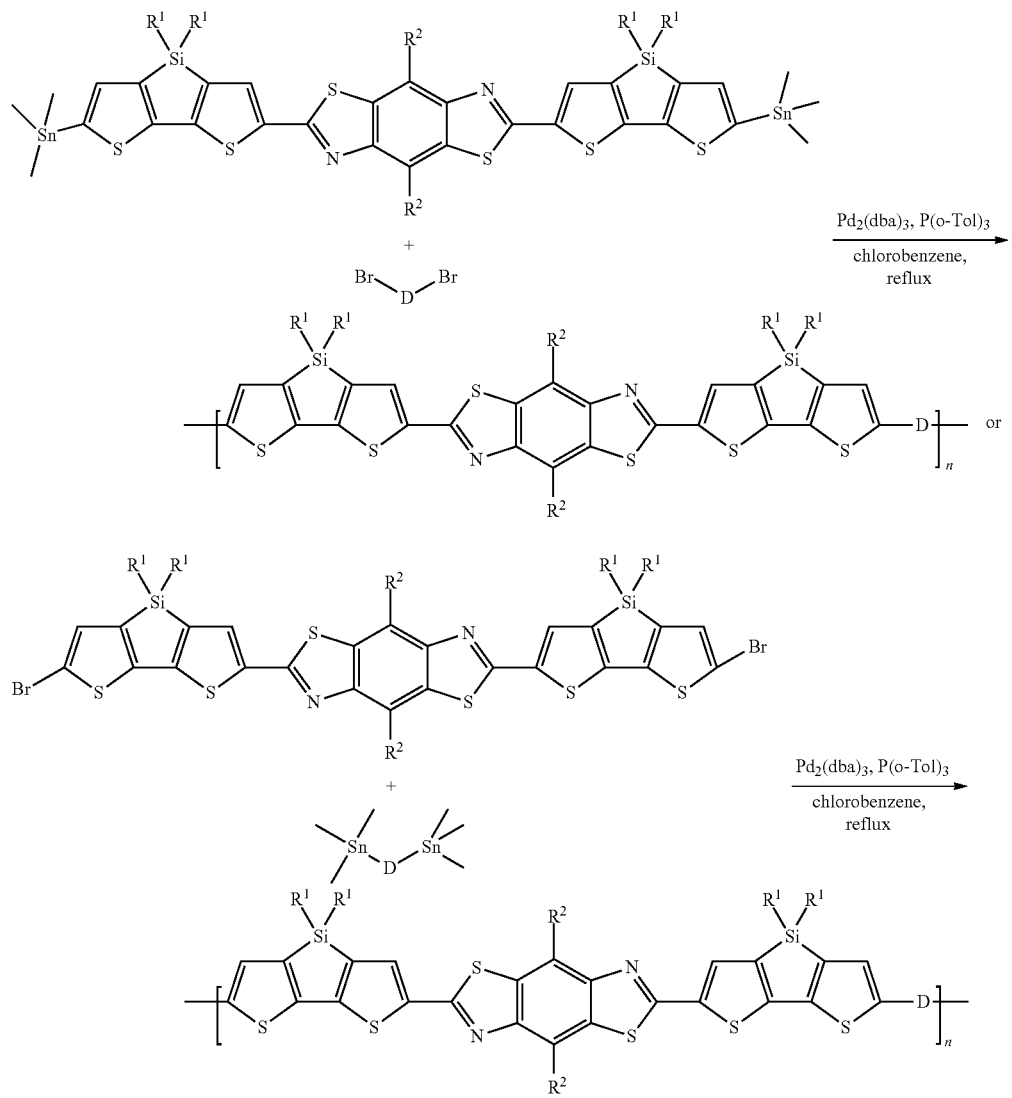
Copolymerization Methods to Produce
Benzobisoxaazole/Silylene-Bithiophene-Based
Copolymers
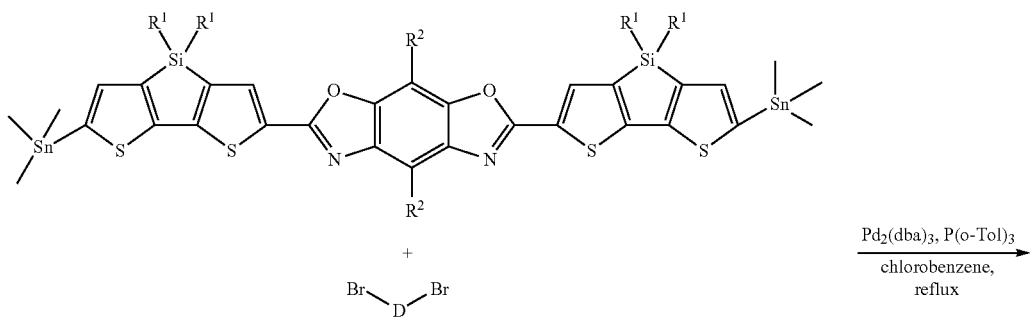

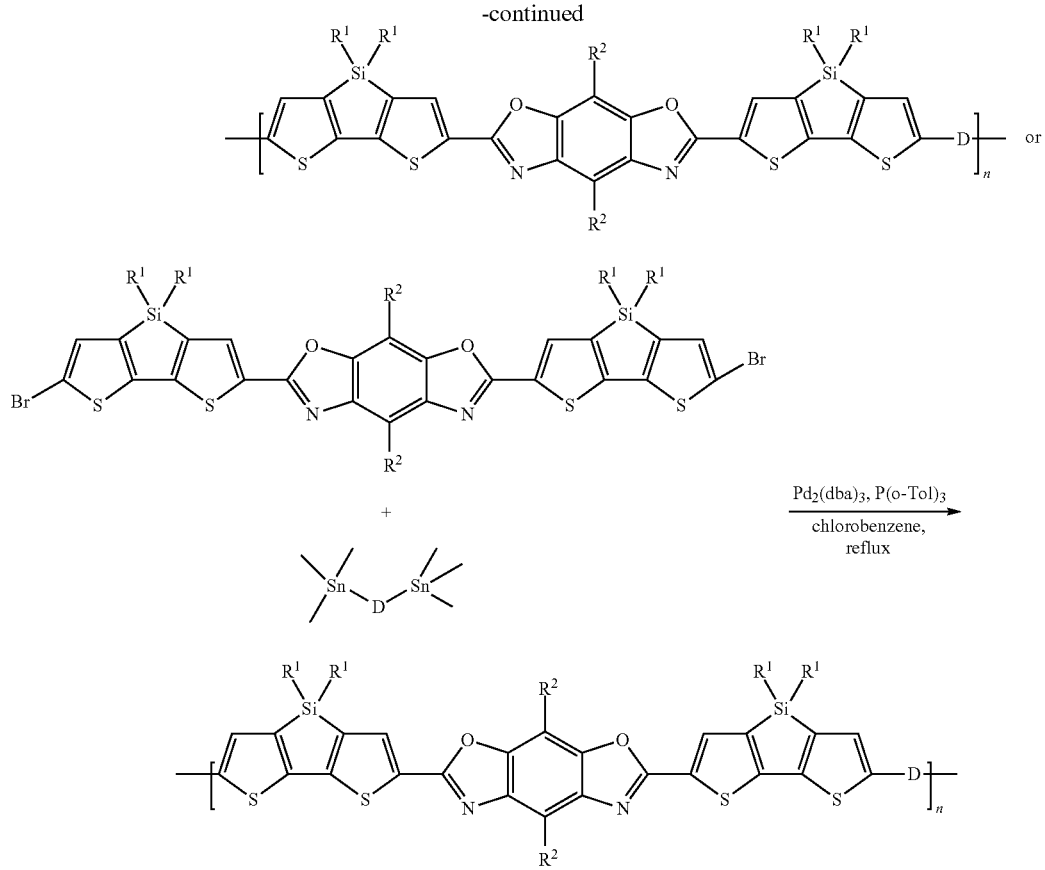
Generic Copolymerizations to Produce Benzobisoxazole-Based Copolymers
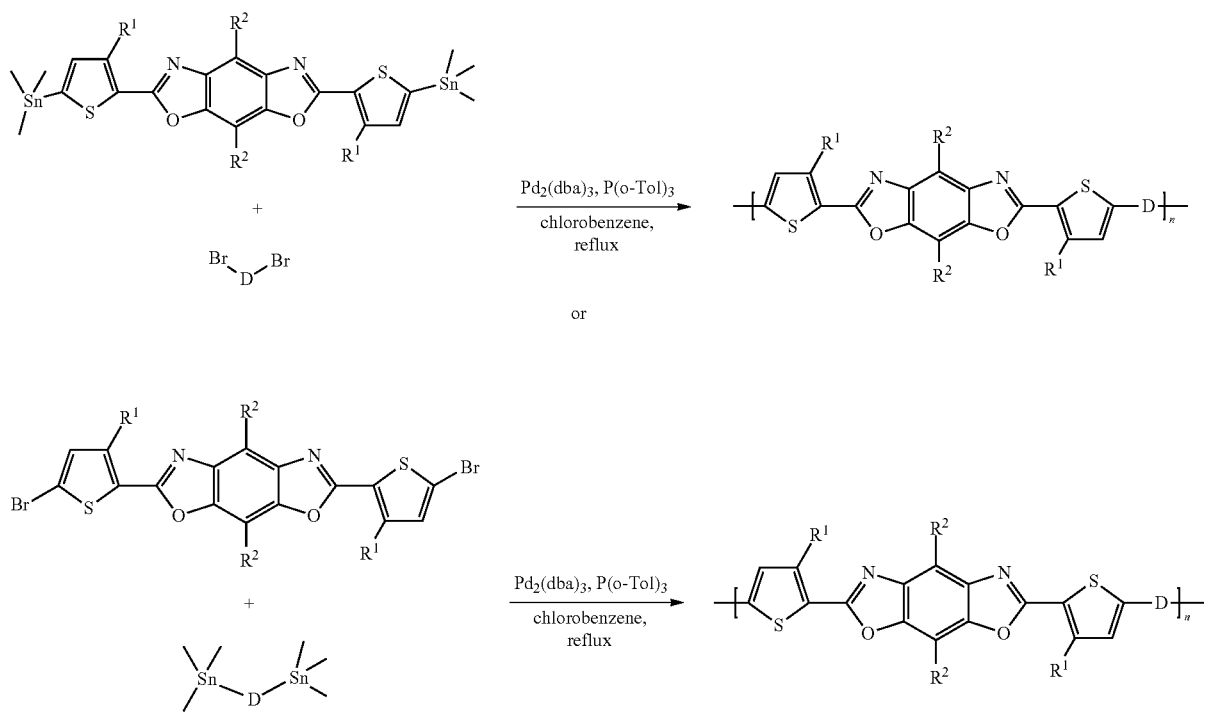

-continued

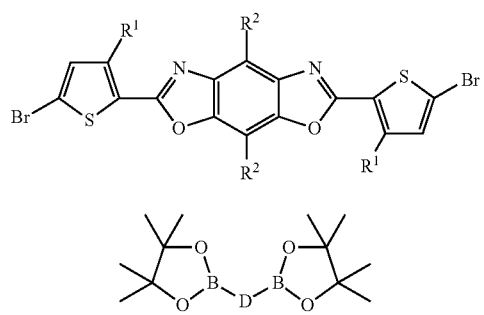

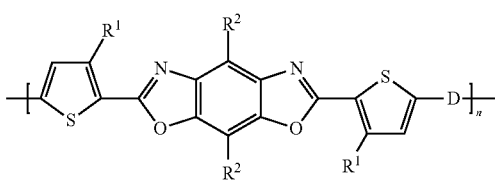

Organic Electronic Devices Comprising the Copolymers

Some aspects of the present inventions relate to novel organic electronic devices comprising the copolymers described herein, including organic light emitting diodes (OLEDs), transistors, and solar cells. Each of those end use applications typically require the formation of a film of the copolymers of the invention on a substrate. Organic films of the polymer of the present invention can be prepared by known methods such as spin coating methods, casting methods, dip coating methods, inkjet methods, doctor blade coating methods, screen printing methods, and spray coating methods. By using such methods, it become possible to prepare organic films having good properties such as mechanical strength, toughness, and durability without forming cracks in the films. Therefore, the organic films can be preferably used for organic electronic devices such as photovoltaic cells, FET elements, and light emitting elements.

Films of the copolymer of the present inventions are typically prepared by coating a coating liquid, which is prepared by dissolving the copolymer in a solvent such as dichloromethane, tetrahydrofuran, chloroform, toluene, chlorobenzene, dichlorobenzene, or xylene, on a substrate. Specific examples of the coating methods include spray coating methods, spin coating methods, blade coating methods, dip coating methods, cast coating methods, roll coating methods, bar coating methods, die coating methods, ink jet methods, dispense methods, etc. In this regard, a proper method and a proper solvent are selected in consideration of the properties of the polymer used. Suitable materials for use as the substrate on which a film of the polymer of the present invention is formed include inorganic substrates such as glass plates, silicon plates, ITO plates, and FTO plates, and organic substrates such as plastic plates (e.g., PET films, polyimide films, and polystyrene films), which can be optionally subjected to a surface treatment. It is preferable that the substrate has a smooth surface.

The thickness of the organic film and the organic semiconductor layer of the organic thin film transistor of the present invention are not particularly limited. However, the thickness is determined such that the resultant film or layer is a uniform thin layer (i.e., the film or layer does not include gaps or holes adversely affecting the carrier transport property thereof). The thickness of the organic semiconductor layer is generally not greater than 1 micron, and preferably from 5 to 200 nm.

Making Transistors Comprising the Copolymers of the Invention.

The organic thin film transistors of the present invention typically have a configuration such that an organic semiconductor layer including the copolymer of the present invention is formed therein while also contacting the source electrode, drain electrode and insulating layer of the transistor.

The organic thin film transistor prepared above is typically thermally annealed Annealing is performed while the film is set on a substrate, and is believed (without wishing to be bound by theory) to allow for at least partial self-ordering and/or π-stacking of the copolymers to occur in the solid state. The annealing temperature is determined depending on the property of the polymer, but is preferably from room temperature to 300° C., and more preferably from 50 to 300° C. In many embodiments, thermal annealing is carried out at least 150° C., or preferably above 170° C., or above 200° C. When the annealing temperature is too low, the organic solvent remaining in the organic film cannot be well removed therefrom. In contrast, when the annealing temperature is too high, the organic film can be thermally decomposed. Annealing is preferably performed in a vacuum, or under nitrogen, argon or air atmosphere. In some embodiments annealing is performed in an atmosphere including a vapor of an organic solvent capable of dissolving the polymer so that the molecular motion of the polymer is accelerated, and thereby a good organic thin film can be prepared. The annealing time is properly determined depending on the aggregation speed of the polymer.

An insulating (dielectric) layer is used in the organic thin film transistors comprising the copolymers of the present invention, situated between the gate electrode and the organic thin film comprising the polymers. Various insulating materials can be used for the insulating layer. Specific examples of the insulating materials include inorganic insulating materials such as silicon oxide, silicon nitride, aluminum oxide, aluminum nitride, titanium oxide, tantalum oxide, tin oxide, vanadium oxide, barium strontium titanate, barium zirconate titanate, lead zirconium titanate, lead lanthanum titanate, strontium titanate, barium titanate, barium magnesium fluoride, bismuth tantalate niobate, hafnium oxide, and trioxide yttrium; organic insulating materials such as polymer materials, e.g., polyimide, polyvinyl alcohol, polyvinyl phenol, polystyrene, polyester, polyethylene, polyphenylene sulfide, unsubstituted or halogen-atom substituted polyparaxylylene, polyacrylonitrile, and cyanoethylpullulan; etc. These materials can be used alone or in combination. Among these materials, materials having a high dielectric constant and a low conductivity are preferably used.

Suitable methods for forming such an insulating layer include dry processes such as CVD methods, plasma CVD methods, plasma polymerization methods, and vapor deposition methods; wet processes such as spray coating methods, spin coating methods, dipcoating methods, inkjet coating methods, castcoating methods, blade coating methods, and bar coating methods; etc.

In order to improve the adhesion between the insulating layer and organic semiconductor layer, to promote charge transport, and to reduce the gate voltage and leak current, an organic thin film (intermediate layer) can be employed between the insulating layer and organic semiconductor layer. The materials for use in the intermediate layer are not particularly limited as long as the materials do not chemically affect the properties of the organic semiconductor layer, and for example, molecular films of organic materials, and thin films of polymers can be used therefor. Specific examples of the materials for use in preparing the molecular films include coupling agents such as octadecyltrichlorosilane, octyltrichlorosilane, octyltrimethoxysilane, hexamethyldisilazane (HMDS)), and octadecylphosphonic acid. Specific examples of the polymers for use in preparing the polymer films include the polymers mentioned above for use in the insulating layer. Such polymer films can serve as the insulating layer as well as the intermediate layer.

The materials of the electrodes (such as gate electrodes, source electrodes and drain electrodes) of the organic thin film transistor of the present invention are not particularly limited as long as the materials are electrically conductive. Specific examples of the materials include metals such as platinum, gold, silver, nickel, chromium, copper, iron, tin, antimony, lead, tantalum, indium, aluminum, zinc, tungsten, titanium, calcium, and magnesium; alloys of these metals; electrically conductive metal oxides such as indium tin oxide (ITO); inorganic or organic semiconductors, whose electroconductivity is improved by doping or the like, such as silicon single crystal, polysilicon, amorphous silicon, germanium, graphite, carbon nanotube, polyacetylene, polyparaphenylene, polythiophene, polypyrrole, polyaniline, polythienylenevinylene, polyparaphenylenevinylene, and complexes of polyethylenedioxythiophene (PEDOT) and polystyrene sulfonic acid.

Making Solar Cells Comprising the Copolymers of the Invention.

Solar cells were fabricated by first spin-coating a PEDOT buffer layer on top of ITO-coated glass substrates (10 Ω/sq, Shanghai B. Tree Tech. Consult Co., Ltd, Shanghai, China) at 1500 rpm for 60 s and dried at 150° C. for 10 min under vacuum. The thickness of PEDOT was around 40 nm.

The active layer of the solar cells comprising the polymers of the invention normally comprise a mixed "heterojunction" active layer that is a phase separated blend of the polymers or copolymers described above and an electron acceptor material. The electron acceptor material can comprise a variety of organic materials (small molecules, oligomers, polymers, or copolymers) that have a LUMO energy level that is at least about 0.2 to 0.6 eV more negative than the LUMO energy level of the copolymers described herein, and a HOMO energy level that is more negative than the HOMO energy level of the copolymers described herein. In many embodiments, the electron acceptor material can be a fullerene or a modified fullerene (e.g., $C_{61}$-phenyl-butyric acid methyl ester, $PC_{61}BM$, or $C_{71}$-phenyl-butyric acid methyl ester, $PC_{71}BM$). In other embodiments, the electron acceptor material can be an electron accepting semiconducting organic small molecule, oligomer, or polymer having appropriate LUMO and HOMO energies (at least about 0.2-0.6 eV more negative than the LUMO energy level and a more negative HOMO energy level than the HOMO energy level of the copolymers described herein). Examples of such electron acceptor materials can include small molecules, oligomers, polymers, or copolymers having highly electron deficient functional groups, such as for example napthalene diimide, perylene diimide, rylene, phalimide, and related derivatives comprising electron accepting groups.

In many embodiments of the solar cells of Applicants' inventions, a composition comprising a solution or dispersion of one or more of Applicants' polymers or copolymers and one or more acceptor materials (for example fullerene derivatives) is spin-coated on top of the PEDOT layer, for example at a speed of 1000 rpm for 30 seconds, to form a layer comprising the one or more copolymers and one or more electron accepting materials. In some embodiments, the solution or dispersion is applied using a hot solvent, and dried under vacuum immediately after the deposition the copolymers.

The coated device precursor can then be annealed, for example on a hot plate at 130±10° C. for 10 min in a glove box, to form the active layer. The active layer can also be spin-coated in air and dried in a vacuum oven without thermal annealing. The solvents used for dissolving the mixture of copolymers of the invention and the electron acceptors can be chloroform, chlorobenzene, 1,2-dichlorbenzene, etc. The solvents for copolymer/fullerene blend can be a single solvent such as chloroform, chlorobenzene, 1,2-dichlorbenzene or a mixture of two or three different solvents, the second (third) solvent can be 1,8-diiodooctane, 1,8-dibromoctane, 1,8-octanedithiol, etc. Optionally, the solvents can be heated so as to increase the solubility of the polymer and/or electron acceptor, as an aid to film formation.

Thermal annealing is believed to induce at least partial phase separation between the polymers of the invention and the electron acceptors, forming the "heterojunctions" on the nanometer scale that are believed to be the site of light-induced charge separation.

After cooling down, the solar cell precursors comprising the polymer-coated substrates were taken out of the glove box and loaded in a thermal evaporator (BOC Edwards, 306) for the deposition of the cathode. The cathode consisting of 1.0 nm LiF and 80 nm aluminum layers was sequentially deposited through a shadow mask on top of the active layers in a vacuum of $8 \times 10^{-7}$ torr. Each substrate contained 5 solar cells with an active area of 4 $mm^2$.

EXAMPLES

The various inventions described above are further illustrated by the following specific examples, which are not intended to be construed in any way as imposing limitations upon the scope of the invention disclosures or claims attached herewith. On the contrary, it is to be clearly understood that resort may be had to various other embodiments, modifications, and equivalents thereof which, after reading the description herein, may suggest themselves to one of ordinary skill in the art without departing from the spirit of the present invention or the scope of the appended claims.

Materials.

All commercially available reagents were purchased from Sigma-Aldrich, Across, Alfa-Aesar and TCI America Laboratory of chemicals.

FT-IR spectra were obtained from Perkin Elmer 1720 FT-IR spectrophotometer with KBr pellets. Mass spectra were recorded on a Bruker Esquire LC/Ion Trap Mass spectrometer. $^1$H-NMR spectra were recorded on a Bruker AV300/AV500 at 300 MHz/500 MHz respectively using $CDCl_3$ or $C_6D_4Cl_2$ or $CF_3COOD$ as the solvents. Gel Permeation Chromatography (GPC) analysis was performed using Polymer Lab Model 120 Gel Permeation Chromatograph (DRI/High Sensitivity Refractive Index Detector and PL-BV400HT Viscometer) against polystyrene standards in chlorobenzene at 60° C. Thermogravimetric analysis (TGA) analysis was conducted with a TA Instruments Q50 TGA at a heating rate of 10° C./min under a nitrogen gas flow. Cyclic voltammetry was done on an EG&G Princeton Applied Research Potentiostat/Galvanostat 273A. A three-electrode cell was used, using platinum wire electrodes as both counter and working electrode. Silver/silver ion (Ag in 0.1 M AgNO3 solution, Bioanalytical System, Inc.) was used as a reference electrode. Ferrocene/ferrocenium (Fc/Fc+) was used as an internal standard. The potential values obtained in reference to Ag/Ag+ were converted to the saturated calomel electrode (SCE) scale. Thin film cyclic voltammetry was performed in acetonitrile containing 0.1M TBAPF$_6$. UV-vis absorption spectra were recorded on a Perkin-Elmer model Lambda 900 UV/vis/near-IR spectrophotometer. The photoluminescence (PL) emission spectra were obtained with a Photon Technology International (PTI) Inc. model QM2001-4 spectrofluorimeter. Thin film of polymer was drop-cast on a freshly cleaned glass substrate for X-ray diffraction (XRD). XRD patterns were obtained on a Bruker AXS D8 Focus diffractometer with Cu Kα beam (40 kV, 40 mA; λ=0.15418 nm).

Example 1

Synthesis of Poly[(4,4'-bis(2-octyl)dithieno[3,2-b:", 3'-d]silole)-2,6-diyl-alt-(2,5-bis(3-octylthiophen-2-yl)thiazolo[5,4-d]thiazole) (PSOTT)

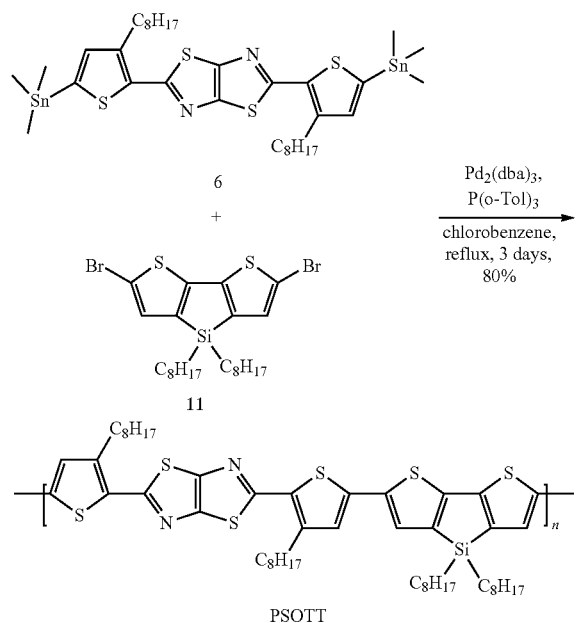

(1) 2,5-Bis(3-octyl-5-(trimethylstannyl)thiophen-2-yl)thiazolo[5,4-d]thiazole (6)

The compound 6 and it's dibromide precursor were prepared as reported in the literature, see (a) Osaka, I.; Sauve', G.; Zhang, R.; Kowalewski, T.; McCullough, R. D. *Adv. Mater.* 2007, 19, 4160. (b) Osaka, I.; Zhang, R.; Sauve', G.; Smilgies, D-M.; Kowalewski, T.; McCullough, R. D. *J. Am. Chem. Soc.* 2009, 131, 2521-2529 all hereby incorporated herein by reference for their disclosures of teachings related synthetic methods.

Brown solid, (yield; 89%). $^1$H NMR (300 MHz, CDCl$_3$) δ 7.06 (s, 2H), 3.00 (t, 4H, J=7.8 Hz), 1.72-1.77 (m, 4H), 1.31-1.48 (m, 20H), 0.89-0.91 (m, 6H), 0.53 (s, 18H). EI: M/e 856.5.

5,5'-diromo-di-n-octylsilylene-2,2'-bithiophene (11)

The dibromide 11 and its corresponding distannane monomer were prepared as reported in the literature, see Lu, G.; Usta, H.; Risko, C.; Wang, L.; Facchetti, A.; Ratner, M. A.; and Marks, T. J. *J. Am. Chem. Soc.* 2008, 130, 7670-7685, hereby incorporated herein by reference for their disclosures of teachings related synthetic methods.

Yellow liquid, (yield 80%) $^1$H NMR (300 MHz, CDCl$_3$) δ=6.99 (s, 2H), 1.22-1.33 (m, 28H), 0.84-0.89 (m, 6H). EI: M/e 576.04.

Poly[(4,4'-bis(2-octyl)dithieno[3,2-b:",3'-d]silole)-2, 6-diyl-alt-(2,5-bis(3-octylthiophen-2-yl)thiazolo[5,4-d]thiazole) (PSOTT)

The starting materials 11 (160 mg, 0.27 mmol) and 6 (238 mg, 0.27 mmol), and catalyst tris(dibenzylideneacetone)dipalladium (0) (5 mg, 0.006 mmol) and tri-o-tolylphosphine (7 mg, 0.022 mmol) in anhydrous chlorobenzene (10 mL) were heated at reflux for 3 days. Then the heating was reduced to 50° C.; the reaction mixture was poured into 200 mL of methanol containing 5 mL of hydrochloric acid and stirred for 5 h. The black precipitate was collected via filtration, and was further purified by Soxhlet extraction with methanol and hexane. Then the residue was extracted with chloroform, evaporated and dried to yield a dark brown solid with a metallic appearance (200 mg, 80%). $^1$H NMR (CDCl$_3$): 6.91 (s, br, 4H), 2.91 (s, br, 4H), 0.88-2.15 (m, 64H).

Gel permeation chromatography (GPC) studies of polymer PSOTT showed a number-averaged molecular weight of 15.46 kg/mol with a polydispersity of 2.26.

Figure 1B:
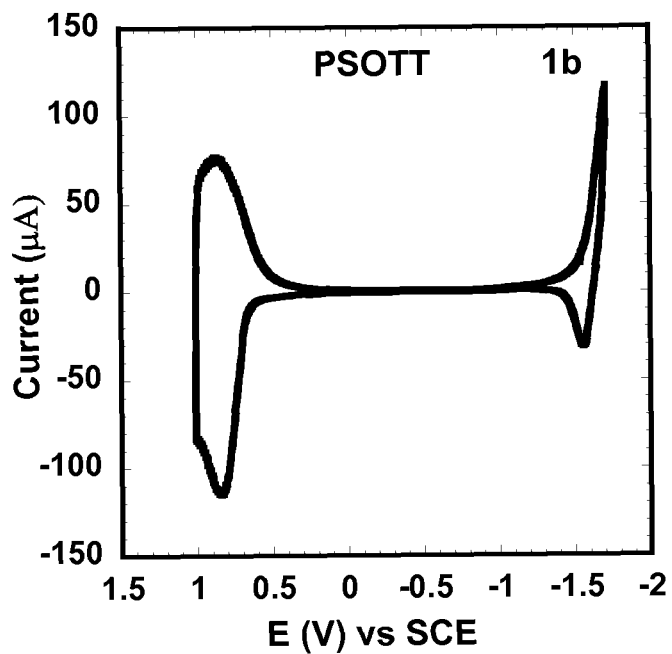

The HOMO and LUMO levels of PSOTT were electrochemically estimated by cyclic voltammetry (CV) and from ultraviolet-visible absorption spectroscopy, as shown in attached FIGS. 1a and 1b. The onsets of the reduction and oxidation in FIG. 1b are 0.69 and −1.55 V (versus SCE), from which the HOMO and LUMO levels of the polymer are calculated to be 5.09 and 2.85 eV, respectively. FIG. 1a shows the absorption spectra of PSOTT in dilute chloroform solution and thin film. The absorption maximum in solution was found to be 584 nm. Absorption spectra of thin films similarly showed absorption maxima at 585 and 636 nm. The optical band gap determined from the absorption edge is 1.79 eV.

Example 2

Synthesis of Poly[(4,4'-bis(2-octyl)dithieno[3,2-b:", 3'-d]silole)-2,6-diyl-alt-(2,5-bis(3-octyloxythiophen-2-yl)thiazolo[5,4-d]thiazole)] (PSOxTT)

The synthetic pathway leading to the synthesis of PSOxTT polymer is outlined below.

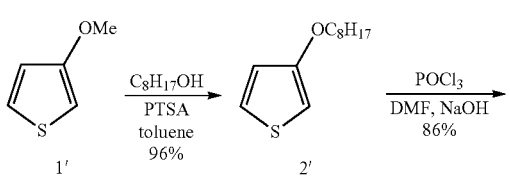

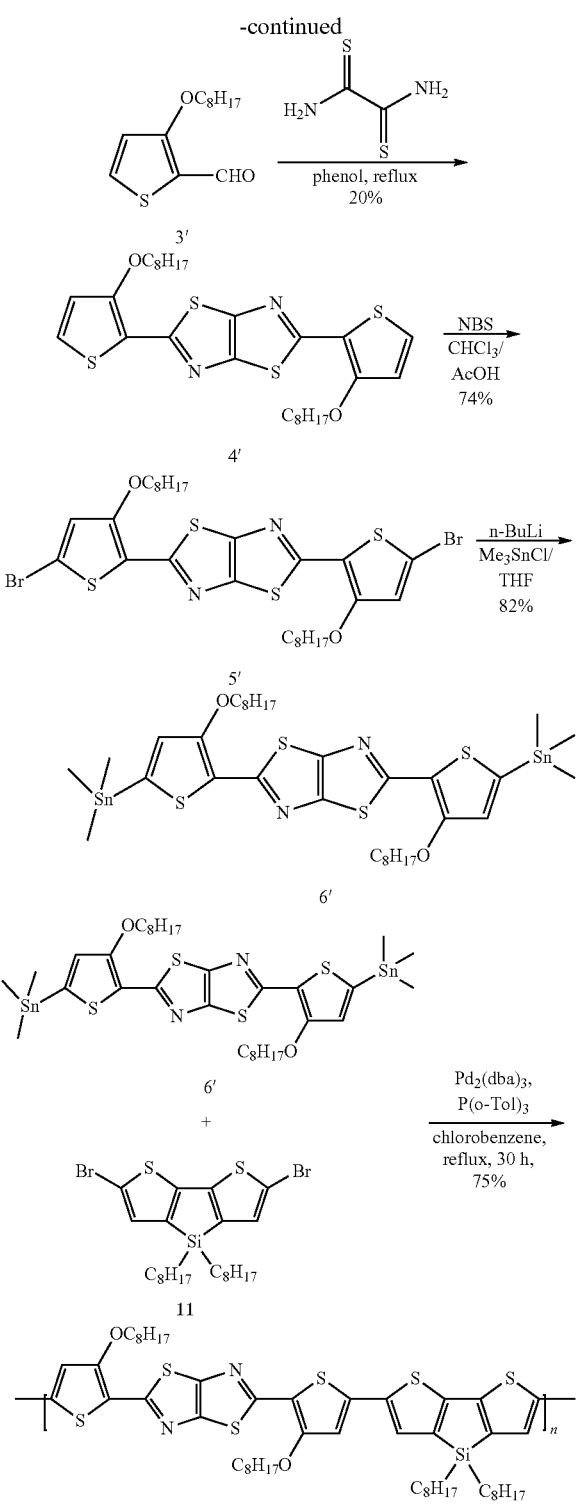

3-octoxythiophene (2')

A mixture of 3-methoxythiophene (7.28 g, 63.76 mmol), 1-octanol (20.09 mL, 127.53 mmol), p-toluenesulfonic acid monohydrate (1.21 g, 6.38 mmol) and 60 mL toluene was heated in a 130° C. bath for 15 hours under argon. After dichloromethane/water extraction, the organic layer was dried over anhydrous $Na_2SO_4$. After solvent evaporation, the residue was purified by column chromatography (silica gel 3:1 hexane:dichloromethane) to give 2' as a colorless solid (13.00 g, 96%). $^1$H NMR ($CDCl_3$, 300 MHz, ppm): δ 7.18-7.21 (m, 1H), 6.78-6.80 (m, 1H), 6.25-6.26 (m, 1H), 3.97 (t, 2H, 6.6 Hz), 1.76-1.85 (m, 2H), 1.33-1.48 (m, 10H), 0.91-0.95 (m, 3H).

2-Formyl-3-octoxythiophene (3')

To the stirred solution of anhydrous DMF (10 mL) at 0° C. in 100 mL three neck flask under Nitrogen atmosphere, $POCl_3$ (0.53 mL, 5.76 mmol) was added dropwise for 5 minutes. After addition, the reaction mixture was stirred at room temperature for 1 hour. Then 3-octyloxythiophene (1.02 g, 4.80 mmol) in 2 mL DMF was added dropwise at 0° C. for 5 minutes. This solution was stirred at 70° C. for 90 minutes and poured it into ice water and then slowly neutralized with 10% NaOH solution (20 mL). The resultant mixture was heated in a steam-bath for 20 min. The aqueous layer was extracted with $CHCl_3$ (3×50 mL), followed by drying over anhydrous $Na_2SO_4$. After the removal of solvents, the crude mixture was chromatographed on silica gel (10% ethyl acetate in hexane) to give 3' as a colourless oil. (1.0 g, 86%). $^1$H NMR ($CDCl_3$, 300 MHz, ppm): δ 10.01 (s, 1H), 7.62 (d, 1H, 5.4 Hz), 6.84 (d, 1H, 5.4 Hz), 4.15 (t, 2H, 6.6 Hz), 1.76-1.86 (m, 2H), 1.29-1.46 (m, 10H), 0.89 (t, 3H, 6.6 Hz). M/e 240.12.

2,5-Bis(3-octyloxythiophen-2-yl)-thiazolo[5,4-d]thiazole (4')

Dithiooxamide (0.21 g, 1.77 mmol), 0.7 g of phenol, and 3' (0.85 g, 3.54 mmol) were combined in a round-bottom flask and were heated in an oil bath at refluxing temperature for 45 min. The crude product was purified by column chromatography on silica gel (50% $CHCl_3$ in hexane) to give 4' as a brownish yellow solid. (0.2 g, 20%). $^1$H NMR ($CDCl_3$, 300 MHz, ppm): δ 7.31 (d, 2H, 5.7 Hz), 6.88 (d, 2H, 5.7 Hz), 4.23 (t, 4H, 6.3 Hz), 1.86-1.95 (m, 4H), 1.57 (m, 4H), 1.31-1.35 (m, 16H), 0.88-0.90 (m, 6H). m/e=562.18.

2,5-bis(5-bromo-3-octyloxy-thiophen-2-yl)-thiazolo[5,4-d]thiazole (5')

To a solution of 4' (0.17 g, 30.06 mmol) in $CHCl_3$/AcOH (8/4 mL), NBS (0.12 g, 67.5 mmol) solution dissolved in $CHCl_3$/AcOH (8/4 mL) was added dropwise and stirred at 0° C. for 2 hours. Then the reaction solution was stirred at room temperature for one day. The reaction solution was washed with water, and then treated with anhydrous $Na_2SO_4$. The crude product was purified by column chromatography on silica gel (40% $CHCl_3$ in hexane) to give 5' as a yellow solid. (0.18 g, 82%). $^1$H NMR ($CDCl_3$, 300 MHz, ppm): δ 6.90 (s, 2H), 4.19 (t, 4H, 6.3 Hz), 1.88-1.93 (m, 4H), 1.33-1.58 (m, 20H), 0.90-0.92 (m, 6H). m/e=720.00

2,5-bis(3-octyloxy-5-(trimethylstannyl)thiophen-2-yl)-thiazolo[5,4-d]thiazole (6')

To a solution of 5' (0.59 g, 0.82 mmol) in 60 mL THF, 2.5 M solution of n-BuLi in hexane (0.82 mL, 2.05 mmol) was added dropwise at −78° C. The solution was stirred at −78° C. for 2 h and 1.0 M solution of trimethyltin chloride (2.46 mL, 2.46 mmol) in THF was added in one portion. The solution was warmed to room temperature and 50 mL of water and 50 mL of ethyl acetate were added. The organic layer was washed twice with 50 mL of water and dried over anhydrous Na$_2$SO$_4$. The organic layer was evaporated and dried over vacuum to afford yellow solid. (0.6 g, 82% yield). $^1$H NMR (CDCl$_3$, 300 MHz, ppm): δ 6.91 (s, 2H), 4.24 (t, 4H, 6.3 Hz), 1.90 (m, 4H), 1.58 (m, 4H), 1.31 (m, 16H), 0.89 (m, 6H), 0.41 (s, 18H). m/e=888.3.

Poly[(4,4'-bis(2-octyl)dithieno[3,2-b:",3'-d]silole)-2, 6-diyl-alt-(2,5-bis(3-octyloxythiophen-2-yl)thiazolo [5,4-d]thiazole)], PSOxTT The reagent 6', (473 mg, 0.27 mmol) and 11 (307 mg, 0.27 mmol), and catalyst tris(dibenzylideneacetone)dipalladium (0) (10 mg, 0.01 mmol) and tri-o-tolylphosphine (13 mg, 0.043 mmol) in anhydrous chlorobenzene (20 mL) were heated at reflux for 30 h. Then the heating was reduced to 50° C.; the reaction mixture was poured into 200 mL of methanol containing 5 mL of hydrochloric acid and stirred for 5 h. The black precipitate was collected via filtration, and was further purified by Soxhlet extraction with methanol and hexane. Then the residue was extracted with chloroform, evaporated and dried to yield a dark brown metallic solid (390 mg, 75%). $^1$H NMR (CDCl$_3$, δ ppm): 6.91 (m, 4H), 4.23 (s, 4H), 1.96 (m, 4H), 1.25-1.38 (m, 48H), 0.91 (m, 12H).

Gel permeation chromatography (GPC) of PSOxTT showed a number-averaged molecular weight of 24.26 kg/mol with a polydispersity of 2.01.

Figure 2A:
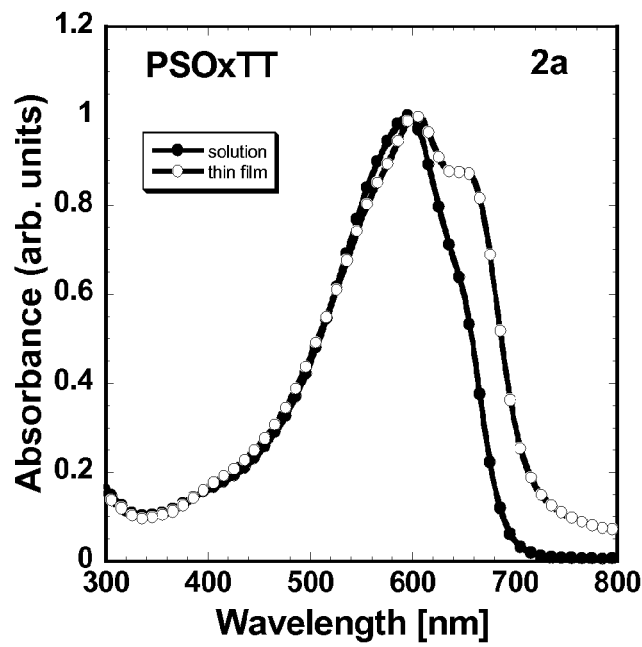
FIG. 2 (a) Absorption spectra of PSOxTT in $CHCl_3$ and as a thin film. (b) Cyclic Voltammogram of PSOxTT film on a platinum electrode in 0.1 mole/L $Bu_4NPF_6$, $CH_3CN$ solution. See Example 2.
Figure 2B:
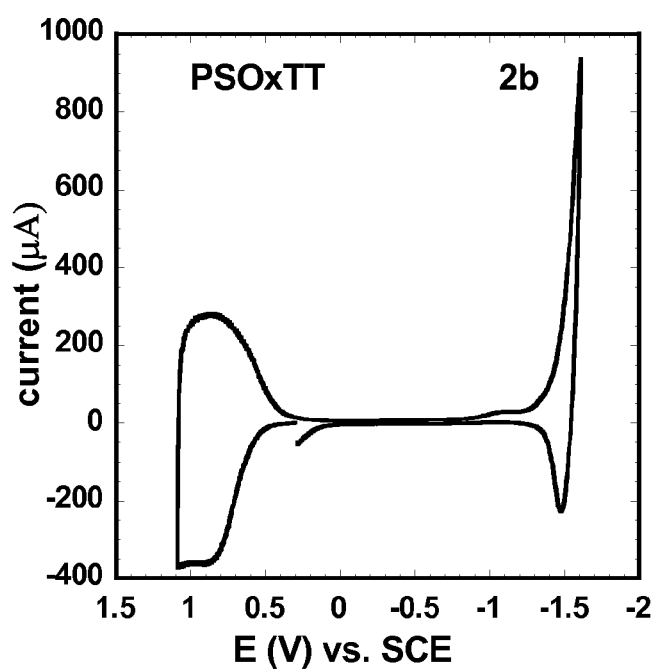

FIG. 2(a) shows the absorption spectra of PSOxTT in dilute chloroform solution and as a thin film. The absorption maximum in solution was found to be 596 nm. Absorption spectra of thin films similarly showed absorption maxima at 604 and 649 nm. The optical band gap determined from the absorption edge of the thin film is 1.73 eV. The HOMO and LUMO levels of PSOxTT were estimated from cyclic voltammetry (CV) results (FIG. 2b). The onsets of the reduction and oxidation were 0.60 and −1.41V (versus SCE), from which the HOMO and LUMO levels of the polymer are calculated to be 5.0 and 2.99 eV, respectively.

Example 3

Comparative Examples of Polymers not Having a Second Electron Donor Subunit: Poly(2,5-bis(3-octyl-5-(3-octylthiophen-2-yl)thiophen-2-yl)thiazolo [5,4-d]thiazole) (PBTOTT)

Copolymers comprising thiazolothiazole and alkyl-substituted thiophene subunits similar to those of PSOTT and PSOxTT, but lacking a second type of electron donor subunit, such as the dithienosilole subunits of PSOTT and PSOxTT, were reported in WO 2007/145482. Those polymers were demonstrated to be useful for making transistors, but no solar cells comprising those polymers were reported. Representative examples of the polymers of WO 2007/145482 (i.e. PBTOTT and PBTOxTT as described below) are provided below for purposes of comparison with PSOTT and PSOxTT, and their uses for making solar cells are provided.

Preparation of Poly(2,5-bis(3-octyl-5-(3-octylthiophen-2-yl)thiophen-2-yl)thiazolo[5,4-d]thiazole) (PBTOTT), was carried out through a Stille coupling reaction of distannane monomer 6 and dibromo compound 7'$^1$ with Pd$_2$(dba)$_3$ and P(o-Tol)$_3$ as the catalyst and the ligand, as shown below.

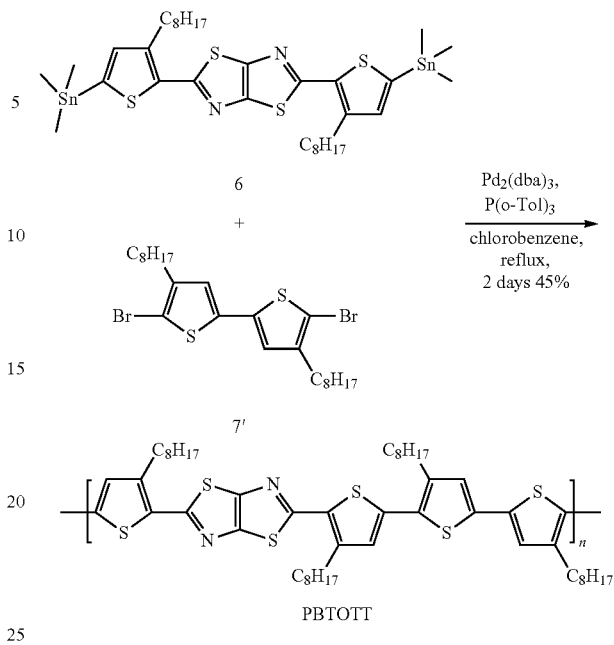

Poly(2,5-bis(3-octyl-5-(3-octylthiophen-2-yl) thiophen-2-yl)thiazolo[5,4-d]thiazole) PBTOTT The reagent 7' (443 mg, 0.47 mmol) and 6 (691 mg, 0.47 mmol), and catalyst tris(dibenzylideneacetone)dipalladium (0) (15 mg, 0.02 mmol) and tri-o-tolylphosphine (20 mg, 0.06 mmol) in anhydrous chlorobenzene (20 mL) were heated at reflux for 2 days. Then the heating was reduced to 50° C.; the reaction mixture was poured into 200 mL of methanol containing 5 mL of hydrochloric acid and stirred for 5 h. The black precipitate was collected via filtration, and was further purified by Soxhlet extraction with methanol and hexane. Then the residue was extracted with chloroform, evaporated and dried to yield a dark brown metallic solid in 45% yield. $^1$H NMR (CDCl$_3$, δ ppm): 7.03 (s, 4H), 2.96 (m, 4H), 2.83 (m, 4H), 1.25-1.71 (m, 48H), 0.90 (m, 12H).

Figure 3A:
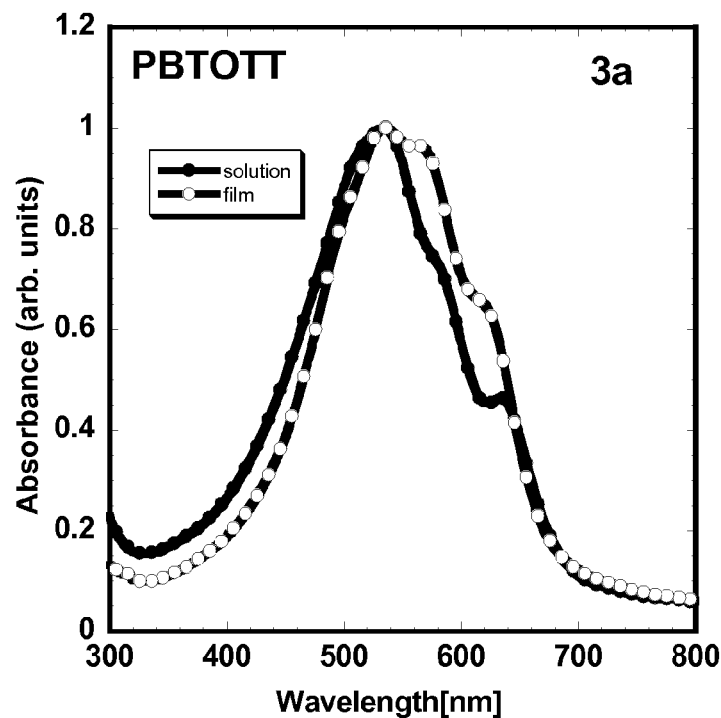
FIG. 3 discloses (a) Absorption spectra of PBTOTT in $CHCl_3$ and as a thin film. (b) Cyclic Voltammogram of PBTOTT films on a platinum electrode in 0.1 mole/L $Bu_4NPF_6$, $CH_3CN$ solution. See Example 3.

Gel permeation chromatography (GPC) of PBTOTT showed a number-averaged molecular weight of 103.18 kg/mol with a polydispersity of 2.76. FIG. 3a shows the absorption spectra of PBTOTT in dilute chloroform solution and thin film. The absorption maxima in solution were found to be 534 and 624 nm. Absorption spectra of thin films similarly showed absorption maxima at 534 and 564 nm. The optical band gap determined from the absorption edge of the thin film is 1.82 eV.

Figure 3B:
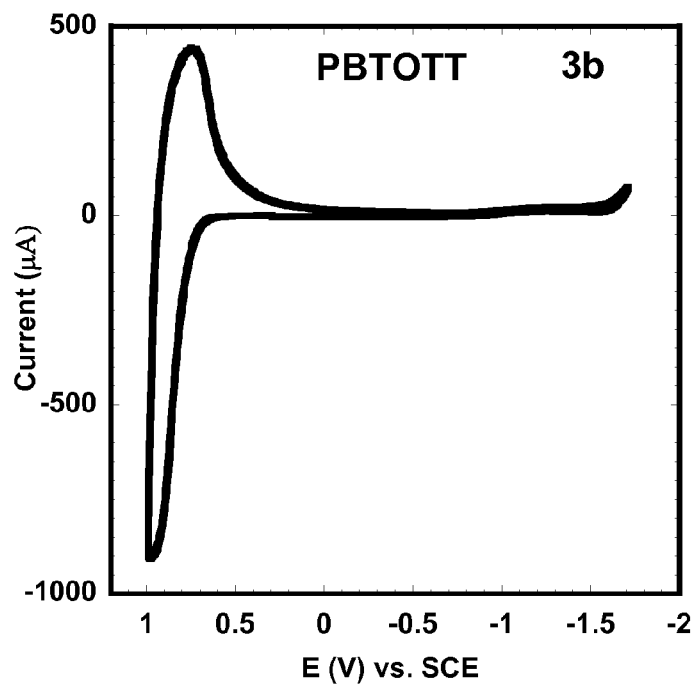

The HOMO and LUMO levels of PBTOTT were estimated from cyclic voltammetry (CV) results (FIG. 3b). The oxidation waves of PBTOTT are reversible and the onset of the oxidation is 0.76 V (versus SCE), from which the HOMO level of the polymer are calculated to be 5.16 eV and the LUMO level are 3.36 eV obtained from optical band gap value.

Example 4

Poly(2,5-bis(3-octyloxy-5-(3-octylthiophen-2-yl) thiophen-2-yl)thiazolo[5,4-d]thiazole (PBTOxTT)

Another comparative copolymer comprising thiazolothiazole and alkoxy-substituted thiophene subunits similar to those of PBTOTT, but also lacking a second type of electron donor subunit, such as the dithienosilole subunits of PSOTT and PSOxTT is described here, for purposes of comparison with PSOTT and PSOxTT, and for their previously undisclosed uses for making solar cells.

PBTOxTT was synthesized via Stille-type polycondensation between a distannane monomer 6' and a dibromo compound 7' in anhydrous chlorobenzene using $Pd_2dba_3$, $P(o-Tol)_3$ as the catalyst under reflux for 2 days as shown below.

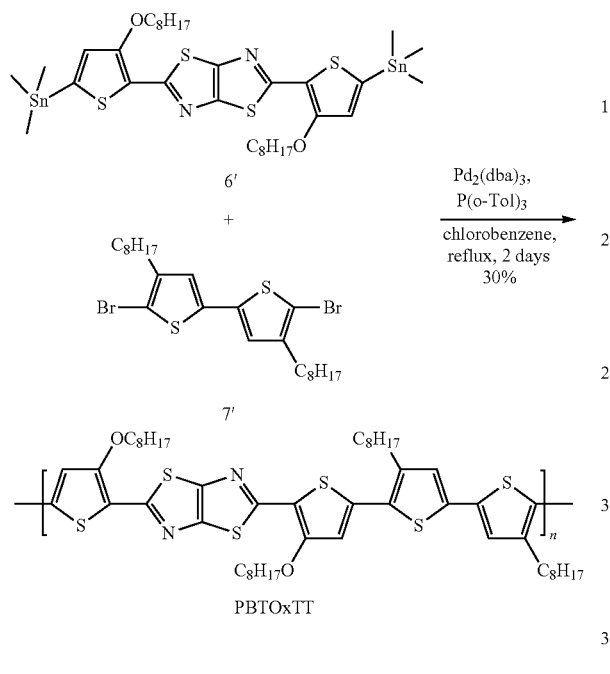

Poly(2,5-bis(3-octyloxy-5-(3-octylthiophen-2-yl)thiophen-2-yl)thiazolo[5,4-d]thiazole) PBTOxTT A solution of 6' (257 mg, 0.47 mmol), 7' (416 mg, 0.47 mmol), tri-o-tolylphosphine (11 mg, 0.03 mmol), tris(dibenzylideneacetone)dipalladium (0)(9 mg, 0.01 mmol) in 10 mL of anhydrous chlorobenzene was refluxed for 2 days. After cooling to 50° C., the reaction mixture was poured into 180 mL of methanol containing 5 mL of HCl and stirred for 4 h. Then the precipitated dark purple solid was subjected to soxhlet extraction with methanol and then with hexane. The residue was extracted with chloroform to give dark purple/brown metallic solid in 30% yield. $^1$H NMR ($CDCl_3$, δ ppm): 6.78-6.91 (m, 4H), 4.21-4.23 (m, 4H), 2.79 (m, 4H), 1.93 (m, 4H), 1.26-1.33 (m, 44H), 0.91 (m, 12H).

Figure 4A:
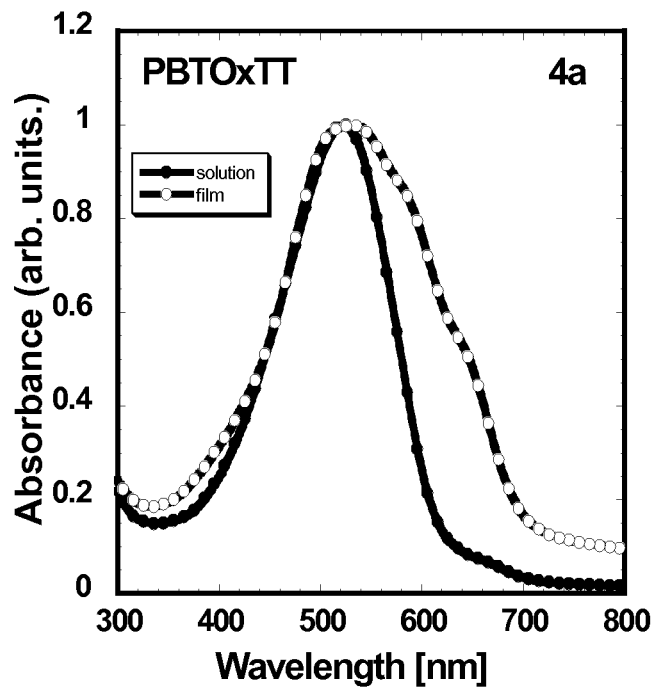
FIG. 4 discloses (a) Optical absorption spectra of PBTOxTT in $CHCl_3$ and thin film, and (b) Cyclic Voltammogram of PBTOxTT films on a platinum electrode in 0.1 mole/L $Bu_4NPF_6$, $CH_3CN$ solution. See Example 4.

Gel permeation chromatography (GPC) of PBTOxTT showed a number-averaged molecular weight of 56.57 kg/mol with a polydispersity of 2.66. FIG. 4a shows the absorption spectra of PBTOxTT in dilute chloroform solution and thin film. The absorption maximum in solution was found to be 524 nm. Absorption spectra of thin film similarly showed absorption maximum at 533 nm. The optical band gap determined from the absorption edge of the thin film is 1.80 eV.

Figure 4B:
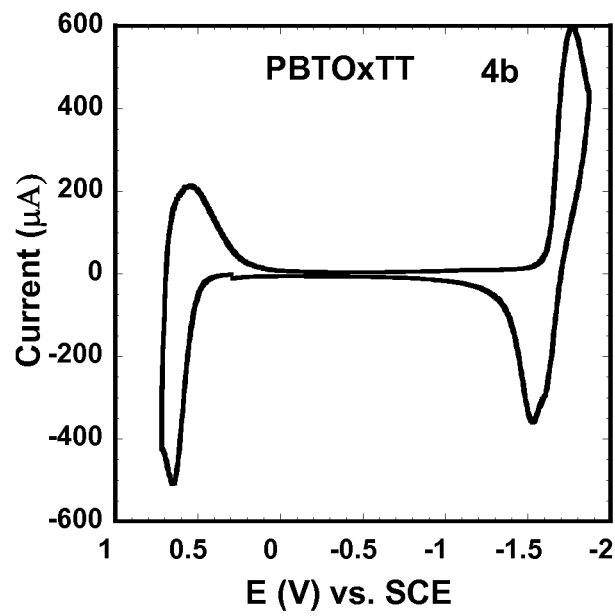

The HOMO and LUMO levels of PBTOxTT were estimated from cyclic voltammetry (CV) results (FIG. 4b). Both the reduction and oxidation waves of PBTOxTT are reversible. The onsets of the reduction and oxidation were 0.51 and −1.63 V (versus SCE), from which the HOMO and LUMO levels of the polymer are calculated to be 4.91 and 2.77 eV, respectively.

Example 5

Poly(2,6-bis(3-octyl-5-(3-Octylthiophen-2-yl)thiophen-2-yl)-benzo[1,2-d; 4,5-d']bisthiazole) (PB-TOT-1)

European patent publication EP 2085401 disclosed a class of copolymers comprising benzobisthiazole and thiophene repeat units, and their utility for making organic transistors, but did not teach or suggest the use of those polymers for making solar cells. For purposes of comparison with the copolymers of the current invention, and for testing their utility for making solar cells, a synthesis of a polymer comprising only benzobisthiazole and thiophene repeat units was synthesized as shown below.

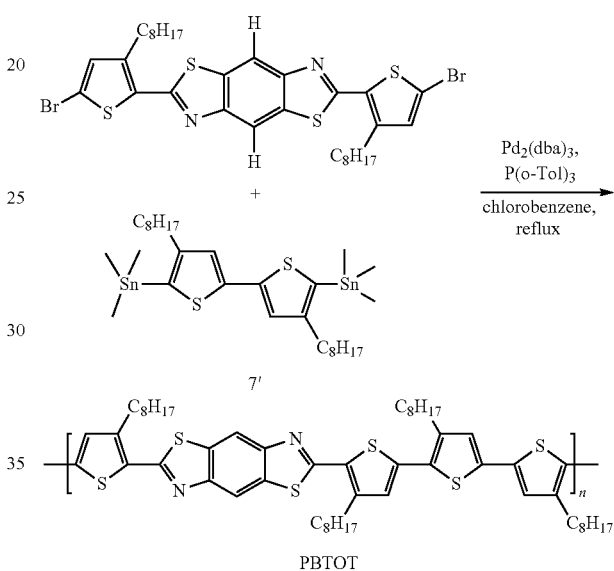

Poly(2,6-bis(3-octyl-5-(3-Octylthiophen-2-yl)thiophen-2-yl)-benzo[1,2-d; 4,5-d']bisthiazole) (PB-TOT-1)

A mixture of 2,6-Bis(5-bromo-3-Octylthiophen-2-yl)-benzo[1,2-d; 4,5-d']bisthiazole (0.300 mg, 0.406 mmol), 4,4'-dioctyl-5,5'-trimethylstannyl-2,2'-bithiophene (0.291 mg, 0.406 mmol), tris(dibenzylideneacetone)dipalladium (0) (7.4 mg, 0.00812 mmol), tris-o-tolyphosphine (9.89 mg, 0.0325 mmol) in 12 mL of chlorobenzene was refluxed for 84 hours. The reaction solution was poured into 200 mL of 5% hydrochloric acid/methanol solution and stirred for 5 hours. The filtered solid was subjected to Soxhlet extraction with methanol and hexane for 24 hours each. PBTOT-1 was extracted with chlorofrom to give a shiny green solid (100 mg). $^1$H-NMR ($CDCl_3$): δ 8.44 (s, 2H), δ 6.92 (s, br, 4H), δ 3.01-2.53 (m, 8H), 1.68 (m, 8H), δ 1.31 (m, 40H), δ 0.91 (t, 12H). FT-IR (film, $cm^{-1}$): 2918, 2845, 1636, 1616, 1465, 1409, 1384, 1303, 1107, 680.

Poly(2,6-bis(3-octyl-5-(3-Octylthiophen-2-yl)thiophen-2-yl)-benzo[1,2-d; 4,5-d']bisthiazole) (PB-TOT-2)

PBTOT-2 was synthesized by a chemical reaction similar to that used to prepare PBTOT-1. PBTOT-2 (140 mg) is a fraction insoluble in chloroform which is dissolved in ortho-dichlorobenzene and precipitated from methanol to give a shiny green solid (140 mg).

The crude polymer was purified by Soxhlet extraction with methanol and hexane. Two fractions of PBTOT were isolated based on their solubility and/or molecular weight as shown in Table 1. PBTOT-1 was extracted with chloroform and produced a shiny green solid, and PBTOT-2 was extracted using ortho dichlorobenzene, and also produced a shiny green solid. The molecular weights were determined by gel-permeation chromatography (GPC) in chlorobenzene solution relative to polystyrene standards. PBTOT-1 has a weight-average molecular weight ($M_w$) of 15,400 and a polydispersity index (PDI) of 1.91. It is soluble in organic solvents such as chloroform, chlorobenzene, and dichlorobenzene. The second sample, PBTOT-2, has a high weight-average molecular weight ($M_w$=722,000, PDI=1.97) and is soluble in hot ortho-dichlorobenzene and 1,2,4-trichlorobenzene.

TABLE 1

Molecular Weight, Thermal, Optical and Electrochemical Properties of PBTOT.

| Polymer | $M_w$ | PDI | $T_m/T_c$ (° C.) | $\lambda_{max}$ (film, nm) | $E_g^{opt}$ (eV) | IP (eV) | EA (eV) | $E_g^{el}$ (eV) |
|---|---|---|---|---|---|---|---|---|
| PBTOT-1 | 15 400 | 1.91 | 290/265 | 540 | 1.97 | 5.2 | 3.3 | 1.91 |
| PBTOT-2 | 722 000 | 1.97 | 367/356 | 551 | 1.94 | — | — | — |

Figure 5:
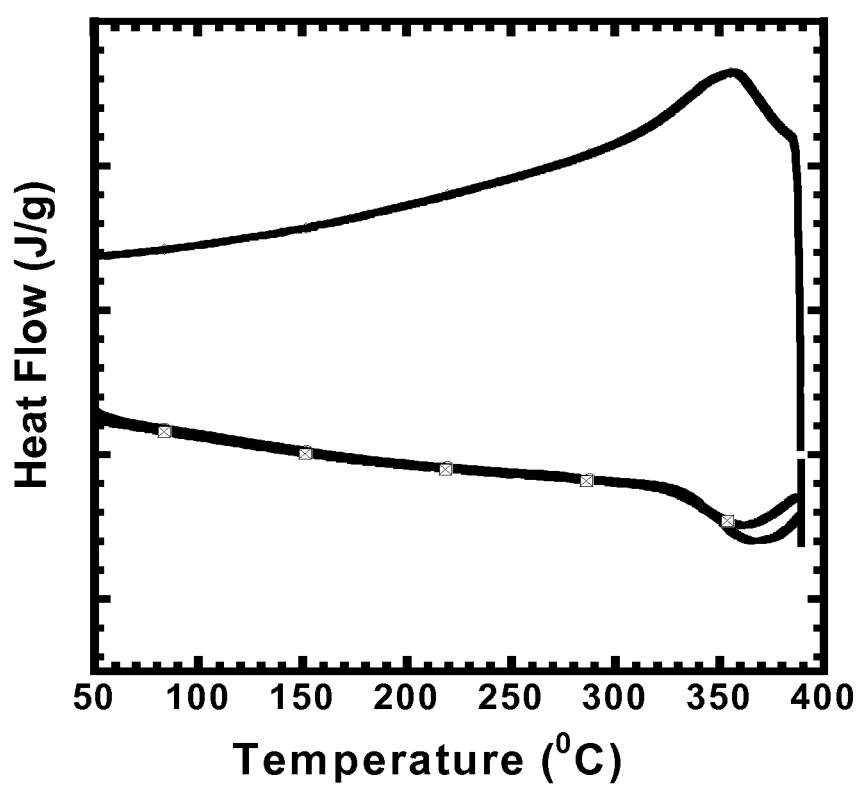
FIG. 5 discloses first and second DSC heating scans of PBTOT-2 at a heating rate of 10° C./min and first cooling scan at cooling rate of 5° C./min under $N_2$. See Example 5.

The rather high molecular weight of PBTOT-2 limits its solubility in most organic solvents. Differential scanning calorimetry (DSC) showed a melting peak ($T_m$) at 367° C. and recrystallization ($T_a$) at 356° C. for PBTOT-2 and slightly lower melting transition for PBTOT-1 ($T_m$ of 290° C. and $T_c$ of 265° C.), see FIG. 5. A glass transition temperature was not observed in the DSC scans of PBTOT. The $T_m$ of PBTOT is dramatically enhanced compared to the 200-205° C. melting transition temperature in P3OT (see Chen, T.-A.; Wu, X.; Rieke, R. D.; *J. Am. Chem. Soc.* 1995, 117, 233).

Figure 6:
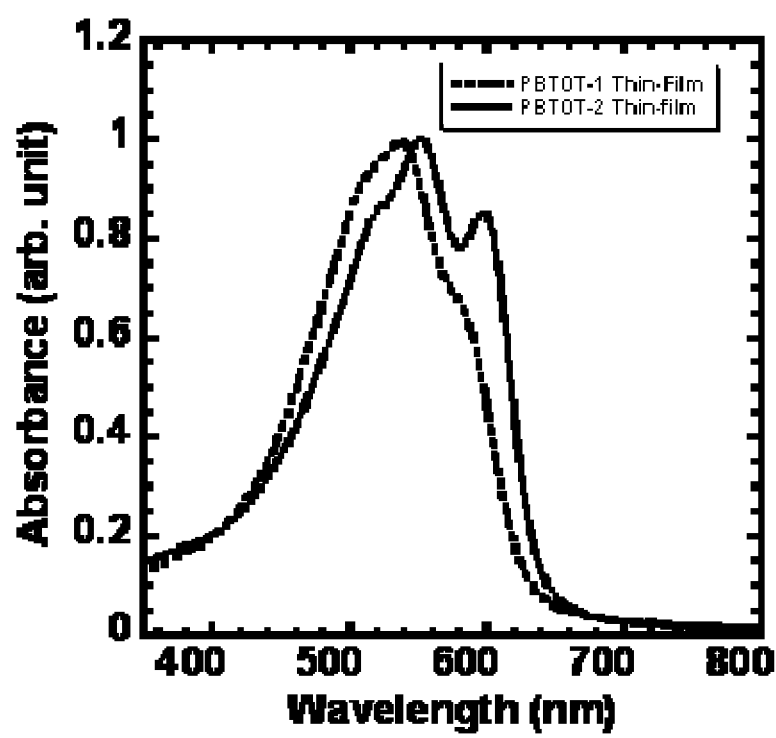
FIG. 6 discloses normalized optical absorption spectra of thin films of PBTOT-1 and PBTOT-2. See Example 5.
Figure 7:
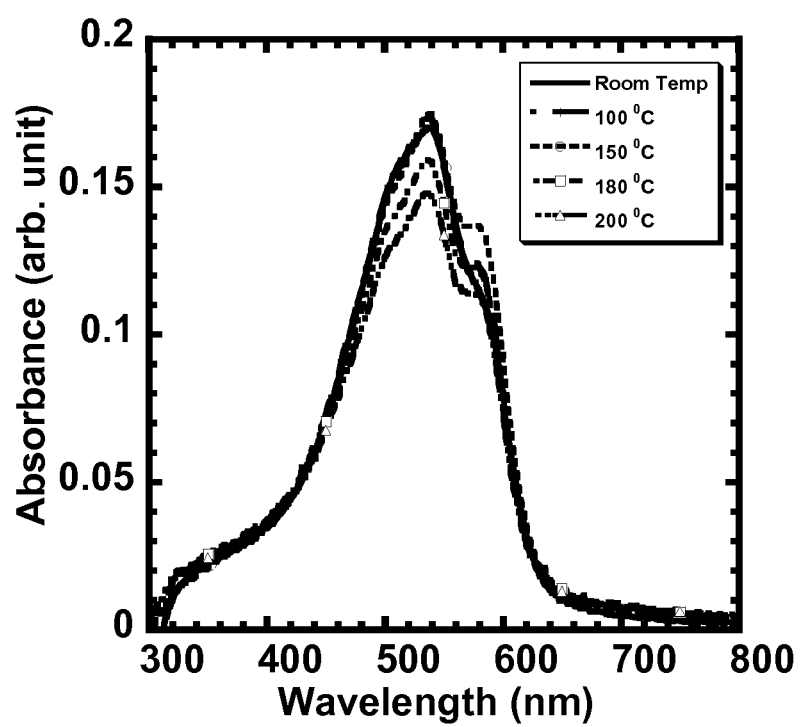
FIG. 7 discloses optical absorption spectra of annealed thin films of PBTOT-1. See Example 5.

The normalized optical absorption spectra of thin films of PBTOT are shown in FIG. 6. PBTOT-1 has an absorption maximum ($\lambda_{max}$) at 540 nm, whereas PBTOT-2 has a well-defined vibronic structure with an absorption maximum at 551 nm and a red-shifted shoulder at 600 nm, an indication of strong interchain interactions in the solid state. When a thin film of PBTOT-1 was annealed at 150° C. a lower energy shoulder appeared at 580 nm, indicating improved interchain interactions (FIG. 7).

Figures 8A, 8B:
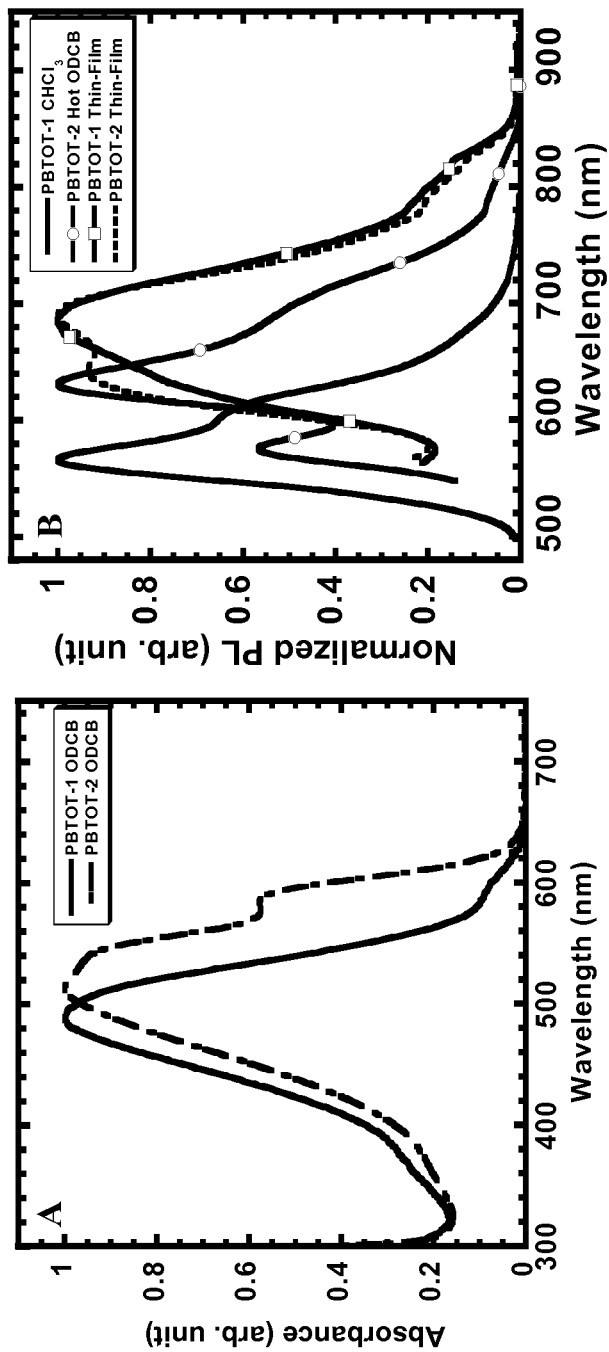
FIG. 8 discloses (a) Optical absorption spectra of PBTOT-1 and PBTOT-2 in solution. (b) Photoluminescence (PL) spectra of PBTOT-1 and PBTOT-2 in 1,2-dichlorobenzene and as thin films. See Example 5.

In the case of PBTOT-1, the absorption maximum in dilute ortho-dichlorobenzene solution was at 490 nm, which is ~50 nm blue shifted compared to the thin-film absorption, indicating increased planarization and improved π-stacking in the solid state (FIG. 8*a*). PBTOT-2 showed an absorption maximum of 537 nm in dilute hot 1,2-dichlorobenzene. The optical band gap from the PBTOT absorption edge of the thin films was 1.94-1.97 eV. These values are slightly higher than P3OT (1.9 eV) band gap. The photoluminescence (PL) emission spectrum of PBTOT-1 in dilute 1,2-dichlorobenzene solution has a vibronic structure with a maximum at 573 nm, whereas PBTOT-2 in solution has a maximum at 630 nm (FIG. 8*b*). In the solid state, both PBTOT-1 and PBTOT-2 had red emission with a PL maximum at 687-690 nm (FIG. 4B).

Figure 9:
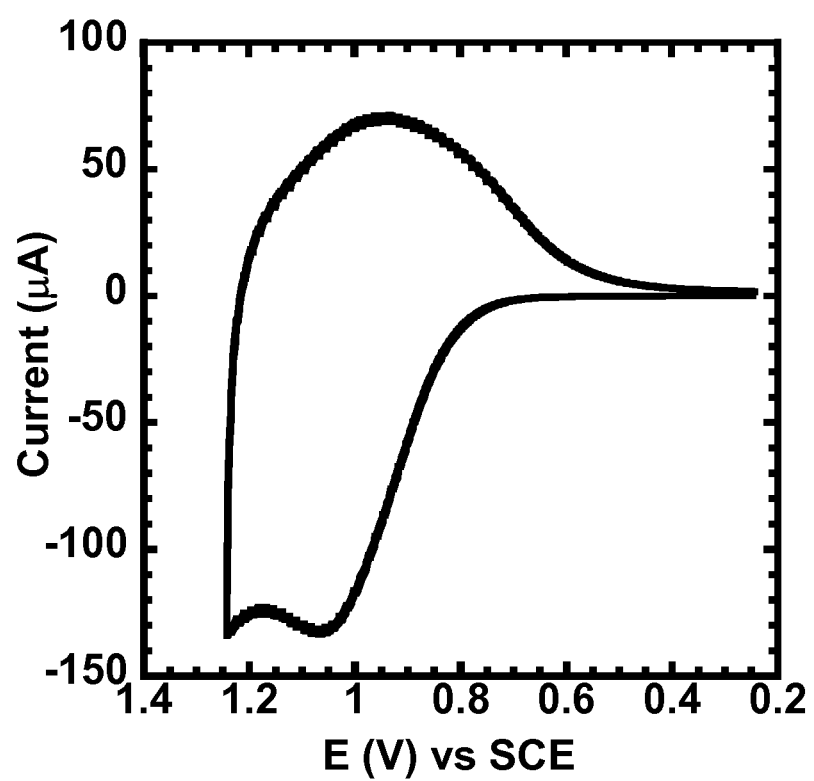
FIG. 9 discloses a Cyclic voltammogram of PBTOT-1 thin film in 0.1M $TBAPF_6$ in acetonitrile using $Ag/NO_3$ as the reference electrode at a scan rate of 50 mV/s. See Example 5.

Cyclic voltammetry of PBTOT-1 thin-films showed quasi-reversible oxidation whereas a reduction wave was not observed, FIG. 9. The onset oxidation potential was 0.80 V (vs. SCE) corresponding to a highest occupied molecular orbital (HOMO) of 5.2 eV. The lowest unoccupied molecular orbital (LUMO) was roughly estimated to be 3.3 eV by using the optical band and the relation LUMO=HOMO−$E_g^{opt}$ (Table 1). The HOMO level of PBTOT is 0.3 eV lower than P3OT (4.9 eV). This is clearly a result of incorporating the electron-deficient benzobisthiazole moiety into P3OT backbone. The HOMO/LUMO energy levels of PBTOT suggest that it should be stable hole transporting material. PBTOT is oxidatively more stable than either P3OT or P3HT. Although the benzobisthiazole unit seems to have only a small effect on the optical band gap, it has clearly shifted the HOMO and LUMO levels by 0.3 eV.

Morphology and Molecular Packing.

To investigate the solid-state morphology and molecular organization of PBTOT, we performed X-ray diffraction (XRD) analysis on thin films drop-casted from a 1,2-dichlorobenzene solution onto glass substrates and dried overnight in a vacuum oven (60° C.). The XRD spectrum of PBTOT-2 film is shown in FIG. 10*a*. Diffraction peaks are observed at 2θ=5.66° (100), 11.1° (200), and 16.4° (300), indicating a high degree of crystallinity in the PBTOT-2 films.

Figure 10C:
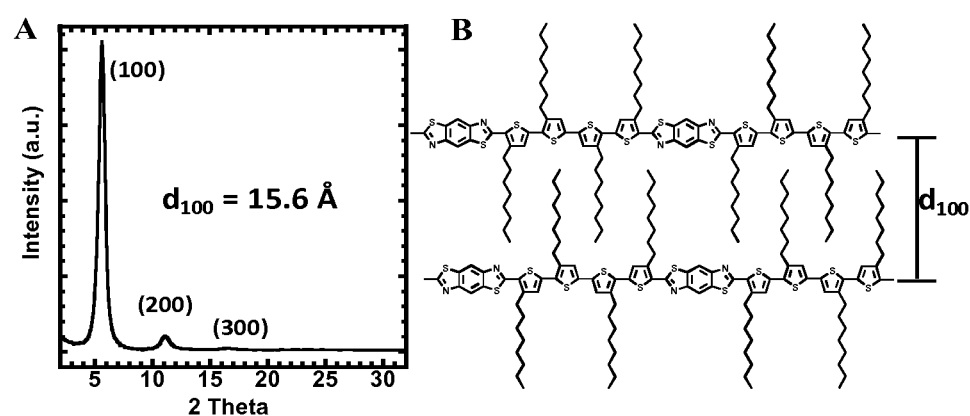
FIG. 10 discloses an XRD spectrum of PBTOT-2 thin film (A) and proposed packing structure (B), and (C) an XRD spectrum of PBTOT-1 thin film. See Example 5.
Figure 10C:
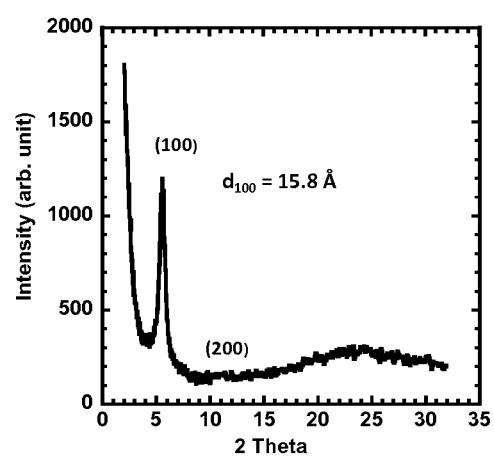

The XRD spectrum of PBTOT-1 film also showed similar reflections, with peaks at 2θ=5.58° (100), and 11.1° (200) (FIG. 10*c*). The diffraction peak at 5.66° corresponds to an interlayer lamellar $d_{100}$-spacing of 15.6 Å, which is much smaller than that of P3OT (20.1 Å) [see Chen, T.-A.; Wu, X.; Rieke, R. D.; *J. Am. Chem. Soc.* 1995, 117, 233]. In addition, the interchain lamellar $d_{100}$-spacing of PBTOT is even smaller than that of P3HT (16.3 Å). It is known that there are two common packing modes of alkyl-chain-substituted polymers, interdigitation and end-to-end packing. While not wishing to be bound by theory, the observed interlayer distance suggests that the alkyl chains of PBTOT interdigitate as illustrated in FIG. 10*b*.

Figure 11:
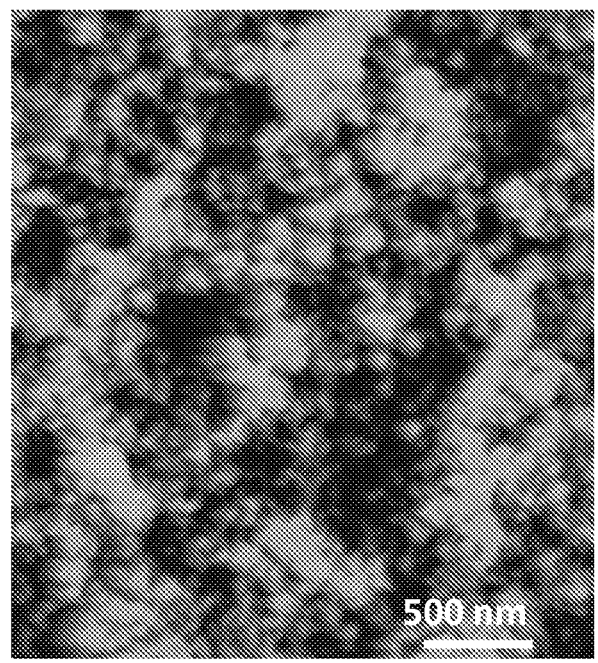
FIG. 11 discloses an AFM image of spin coated PBTOT-2 thin film on glass substrate. The polymer thin film was prepared from 1,2-dichlorobenzene and dried in vacuum oven (60° C. for 3 hours). See Example 5.

The film morphology of PBTOT was also examined by atomic force microscopy (AFM) on thin films spin-coated onto glass substrates without annealing. Nodule-like structures were observed in the surface morphology revealed by AFM images (FIG. 11).

Example 6

Transistors Employing the Copolymers

Preparation of the Transistors—

Thin film transistors comprising the copolymers of Examples 1-5 were fabricated and tested to evaluate charge carrier mobility and other electrical parameters. Thin film transistors were fabricated in conventional bottom-contact, bottom-gate geometry. Gold electrodes with a thin chromium adhesive layer were patterned on top of heavily-doped silicon with silicon dioxide ($t_{ox}$=200 or 300 nm) substrates. The channel widths of the devices were 400 or 800 µm and lengths were 20 or 40 µm. The surface of the silicon dioxide was cleaned and treated with octyltrichlorosilane (OTS8). Polymers were spun onto hydrophobically modified oxide from solutions in 1,2-dichlorobenzene (ODCB). Thin films were then annealed at 200° C. for 10 min under inert atmosphere. Devices were initially tested in nitrogen-filled dry box. For stability test, devices were stored and tested in air. Electrical parameters were calculated by using the standard equation for metal-oxide-semiconductor field-effect transistors in saturation region: $I_{ds}=(\mu C_o W/2L)(V_g-V_t)^2$.

PSOTT, PSOxTT, PBTOTT, and PBTOxTT showed typical p-type characteristics, as shown by the graphical data in FIGS. 12-15. Results of the measurements are shown in numerical form in Table 2.

TABLE 2

Electrical parameters of the series of the new polymer semiconductors under inert conditions.

| | Avg. Mobility (cm$^2$/Vs)$^a$ | Max. Mobility (cm$^2$/Vs) | $I_{on/off}$ | Avg. $V_t$ (V)$^a$ |
|---|---|---|---|---|
| PSOTT | 9.9 × 10$^{-3}$ | 0.010 | >10$^6$ | −13.4 |
| PSOxTT | 0.081 | 0.087 | >10$^5$ | −16.0 |
| PBTOTT | 0.028 | 0.033 | >10$^5$ | 4.7 |
| PBTOxTT | 0.016 | 0.023 | >10$^5$ | −18.2 |

$^a$Average of 6-8 devices.

Figures 12A, 12B:
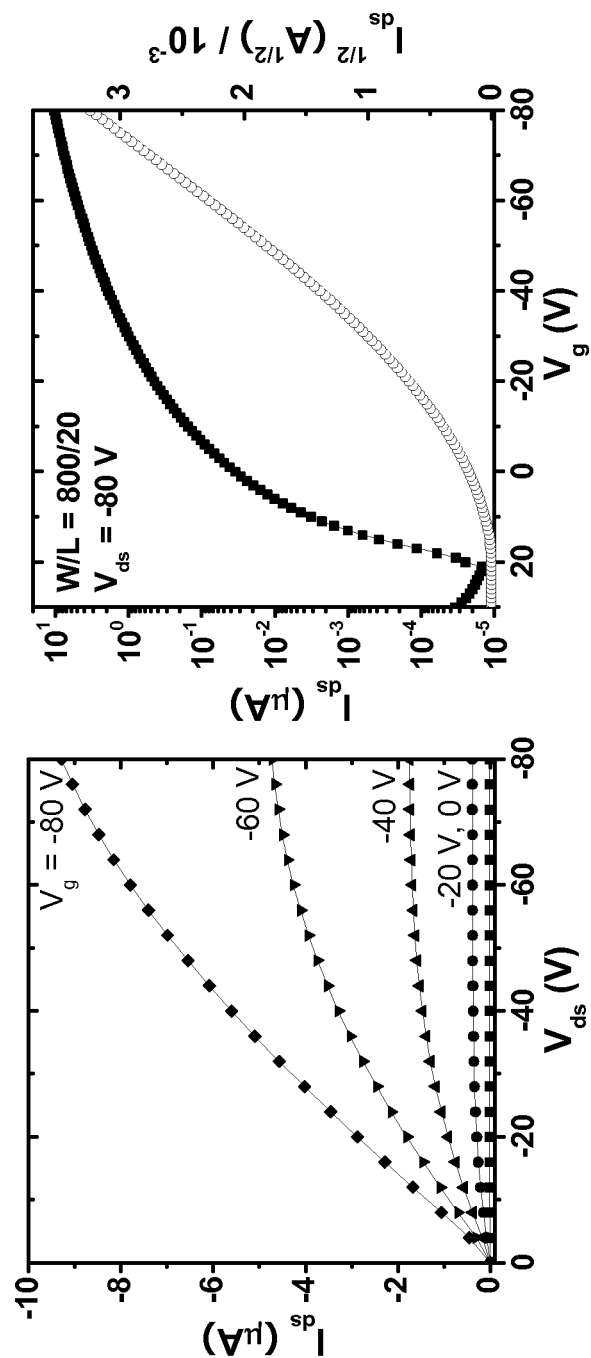
FIGS. 12a and 12b show the electrical characteristics of PSOTT thin film transistors. See Example 6.

The average hole mobility of PSOTT was increased 2-3 times, from 3.6×10$^{-3}$ to 9.9×10$^{-3}$ cm$^2$/Vs by increasing the annealing temperature from 150° C. to 200° C. The maximum mobility of PSOTT transistors was 0.01 cm$^2$/Vs (FIG. 12). Therefore, the annealing temperature was fixed 200° C. for the remaining study.

Figures 13A, 13B:
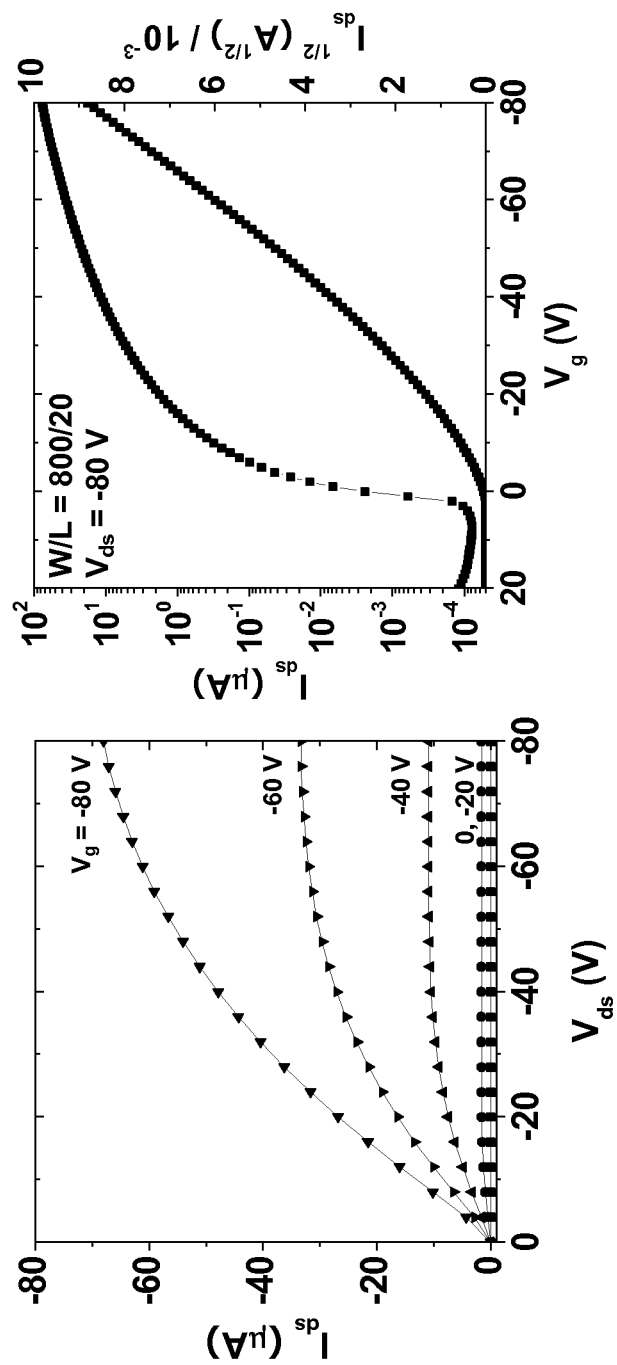
FIGS. 13a and 13b show the electrical characteristics of PSOxTT thin film transistors. See Example 6.
Figures 14A, 14B:
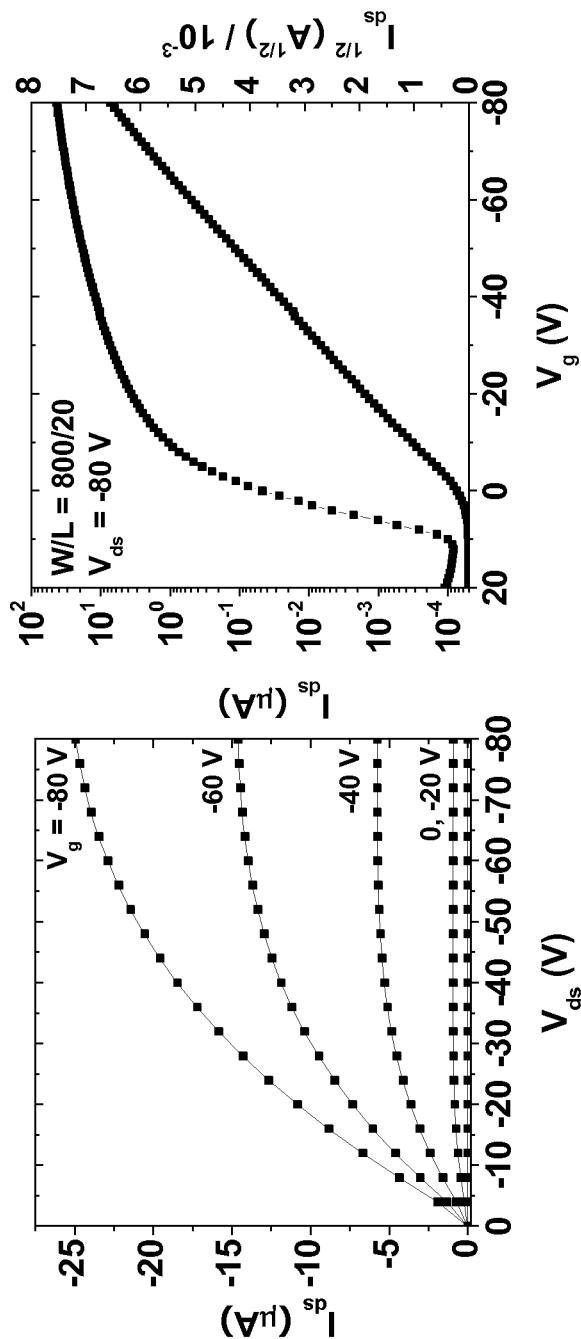
FIGS. 14a and 14b show the electrical characteristics of PBTOTT thin film transistors. See Example 6.
Figure 15B:
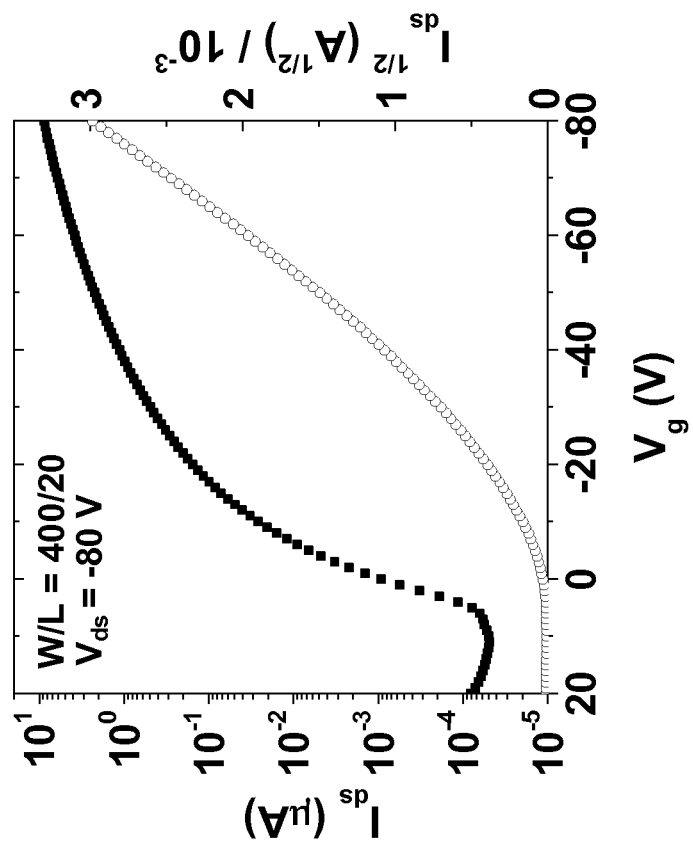
FIGS. 15a and 15b show the electrical characteristics of PBTOxTT thin film transistors. See Example 6.
Figure 15A:
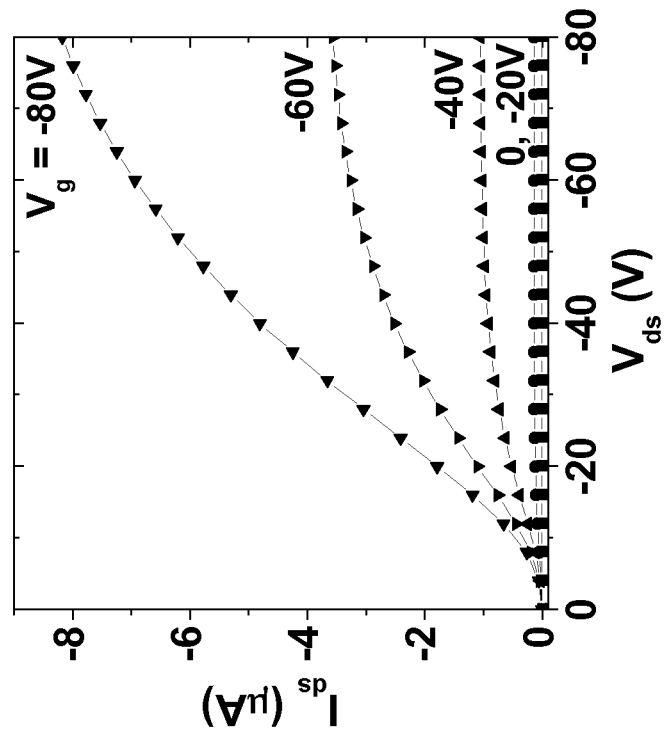

When PSOxTT (having alkoxythiophene units as compared to alkylthiophene units in the PSOTT thiazolothiazole-silylene-bithiophene copolymer), the hole mobility increased to 0.081 cm$^2$/Vs on average and 0.087 cm$^2$/Vs at maximum (FIG. 13). Thin film transistors comprising PBTOTT and PBTOxTT, which do not incorporate a second type of electron donating repeat unit, also showed p-type charge transport, but the hole mobilities were in the range of 0.016-0.033 cm2/Vs, approximately 25-30% of the mobility measured for PSOxTT.

The average threshold voltages ($V_t$) of PSOTT, PSOxTT, PBTOTT, and PBTOxTT were −13.4, −16.0, 4.7 and −18.2 V, respectively. The amount of current modulation was high for the four polymers. The on/off ratios were higher than 10$^5$ in the devices. Electrical parameters are summarized in Table 2. It should be noted that the PBTOTT was less soluble in dichlorobenzene than the other polymers. The limited solubility might cause non-uniformity of thin film and positive threshold voltages compared to the others.

Figures 16A, 16B:
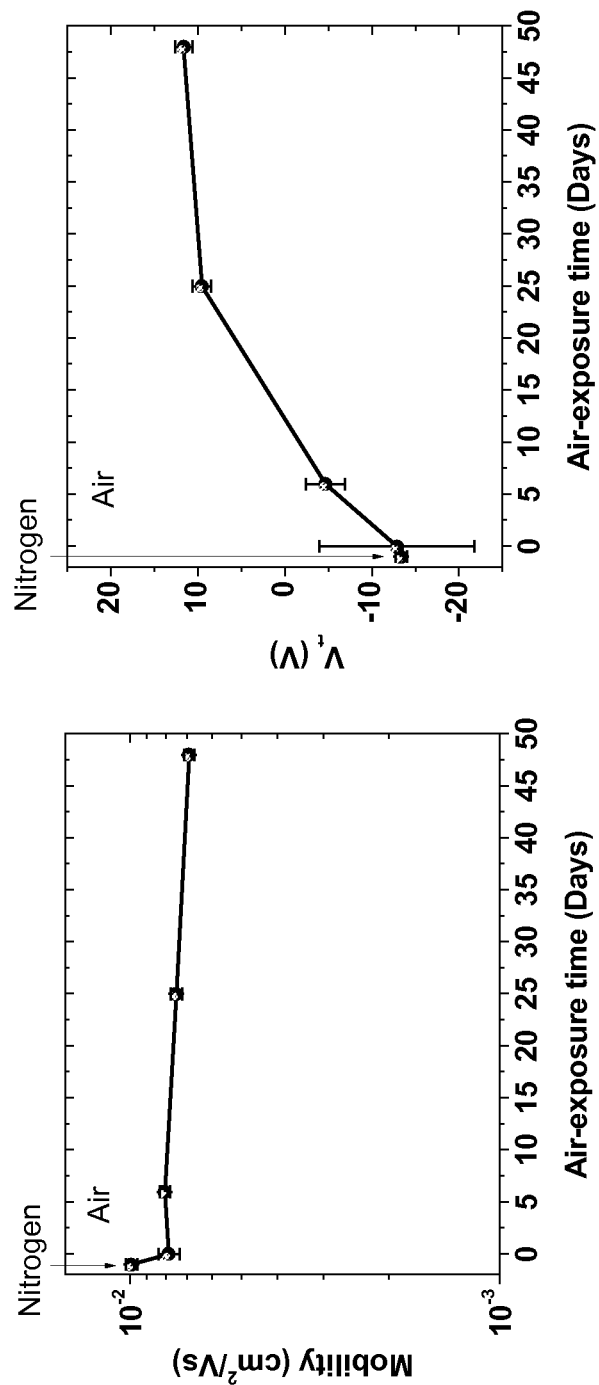
FIG. 16 discloses the stability of the (a) mobility and (b) threshold voltage of PSOTT thin film transistors stored in air. See Example 6.

The stability of mobility and $V_t$ of PSOTT thin film transistors in air was also tracked, and are plotted in FIG. 16. There was an initial ~20% drop of the mobility after exposing the devices to air. The mobility slightly decreased when the devices had been stored in air for 48 days. The change of mobility in air is less than 12% for the period of the investigation. The threshold voltage tends to be affected more drastically. Although the initial change of $V_t$ is negligible, the average threshold voltage was positively shifted from −13 to 11 V. The shift of $V_t$ decreased as the device is further exposed in air.

Transistors Comprising PBTOT—

Figures 17A, 17B:
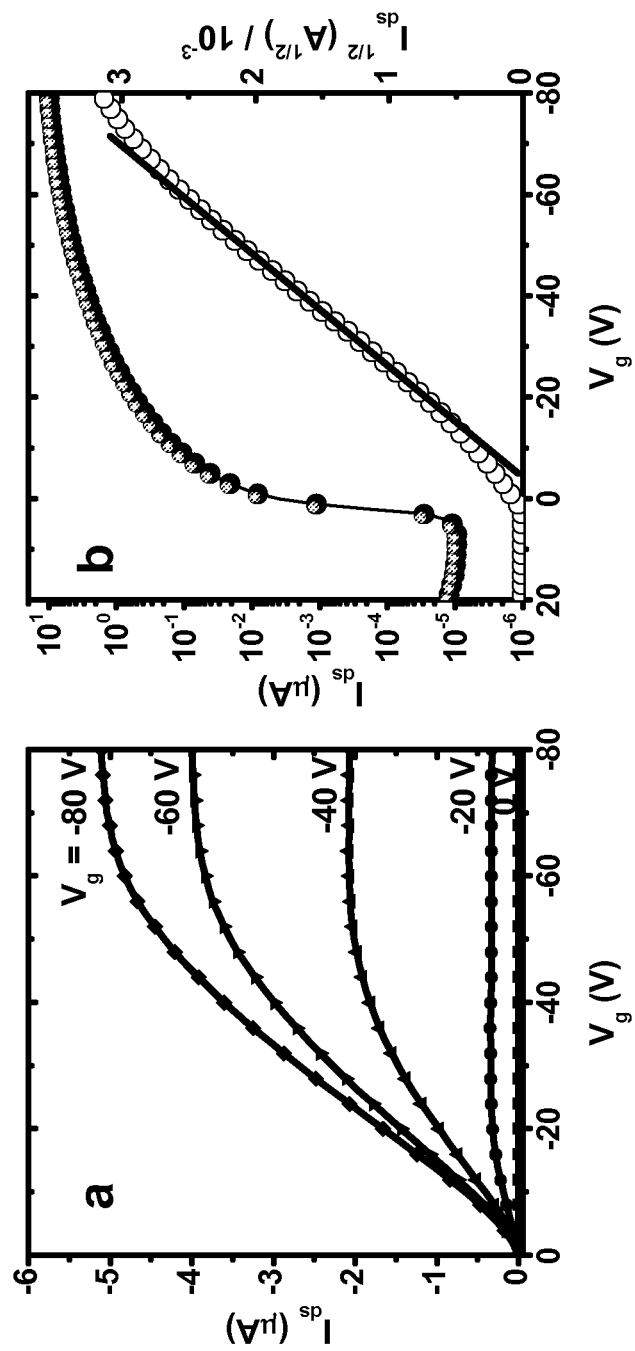
FIG. 17 discloses output (a) and transfer (b) characteristics of a PBTOT-2 OFET. See Example 6.

The charge transport properties of PBTOT were investigated by fabricating OFETs with conventional bottom-contact and bottom-gate geometry on top of silicon (gate) and silicon dioxide (dielectric) substrates and patterned gold source/drain electrodes. The typical output and transfer characteristics of PBTOT OFETs (as well as solar cells described further below) are shown in FIG. 17 and the results are summarized in Table 3.

TABLE 3

Electrical Parameters of PBTOT-Based OFETs and Solar Cells.

| Polymer | $\mu_h$ (cm$^2$/Vs) | $I_{on}/I_{off}$ | $V_t$ (V) | $J_{sc}$ (mA/cm$^2$) | $V_{oc}$ | FF | PCE (%) |
|---|---|---|---|---|---|---|---|
| PBTOT-1 | 0.002 | >10$^5$ | −19 | 7.08 | 0.66 | 0.45 | 2.1 |
| PBTOT-2 | 0.01 | >10$^6$ | −5.2 | — | — | — | — |

An average hole mobility GO of 0.009 cm$^2$/V·s and a maximum hole mobility of 0.01 cm$^2$/V·s were observed for transistors comprising the high molecular weight PBTOT-2. The $I_{on}/I_{off}$ ratios were higher than 10$^6$ and the threshold voltage ($V_t$) was −5.2 V (Table 3).

The highly crystalline nature of PBTOT, as revealed in the absorption spectra and XRD patterns facilitates good charge transport in the thin films. The lower molecular weight fraction (PBTOT-1) had a hole mobility of 0.002 cm$^2$/V·s, $I_{on}/I_{off}$ ratio of 10$^5$, and a threshold voltage of −19 V. Thus the hole mobility is increased by a factor of 5 when the molecular weight is increased from 8 to 366 kDa. The enhanced charge carrier mobility and overall better OFET performance in the higher molecular-weight polymer is likely due in part to reduction in defects arising from chain ends and enhancement in interchain interactions. Remarkably, the observed 0.01 cm$^2$/V·s mobility of holes in PBTOT-2 is much higher than the (2.0-13.0)×10$^{-4}$ cm$^2$/V·s reported for regioregular P3OT thin films (see Babel, A.; Jenekhe, S. A. Synth. Met. 2005, 148, 169. (b) Zen, A.; Saphiannikova, M.; Neher, D.; Asawapirom, U.; Scherf, U. Chem. Mater. 2005, 17, 781).

Figures 18A, 18B, 18C:
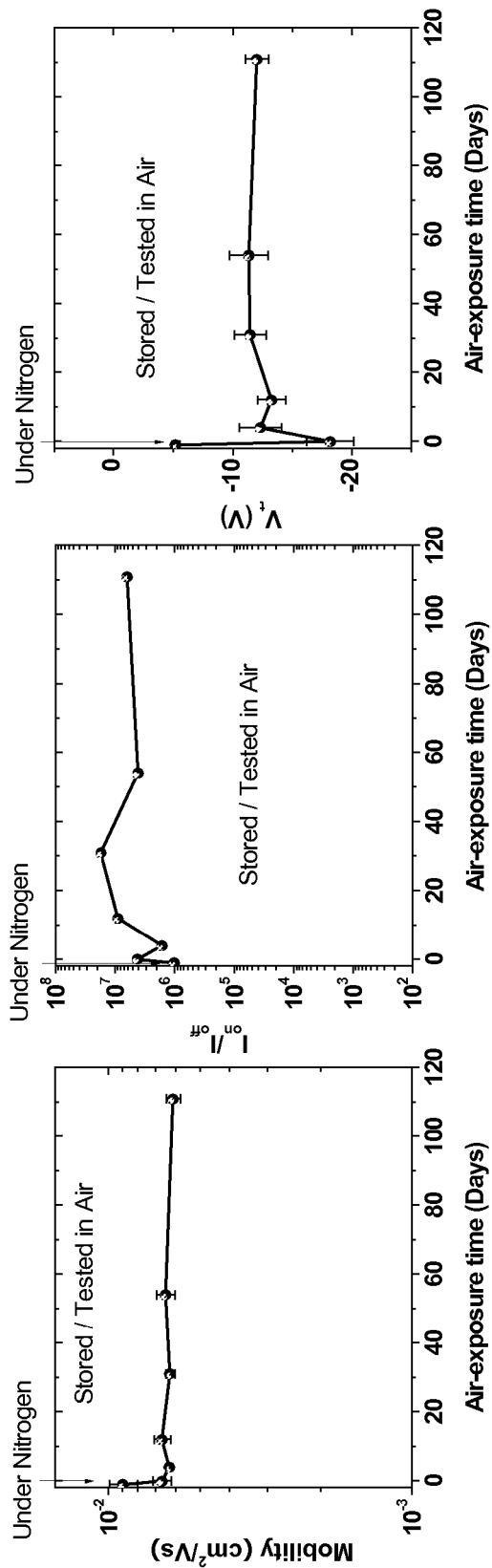
FIG. 18 discloses the air stability of (a) hole carrier mobility, (b) $I_{on}/I_{off}$, and (c) threshold voltage of PBTOT-2 thin film transistors stored in air. See Example 6.

PBTOT-2 devices under ambient conditions showed remarkable air stability, FIG. 18. The average hole mobility of PBTOT-2 OFETs in air was 0.007 cm$^2$/V·s, which remained unchanged for 111 days. The on/off ratio and threshold voltage similarly remained very good at 10$^6$, and −12 V, respectively.

Example 7

Solar Cells Comprising the Copolymers

Photovoltaic cells comprising the polymers described herein were prepared as outlined below: Solar cells were fabricated by first spin-coating a poly(3,4-ethylenedioxythiophene) (PEDOT) buffer layer on top of Indium-Tin Oxide (ITO) coated glass substrates (10Ω/□, Shanghai B. Tree Tech. Consult Co., Ltd, Shanghai, China) at 4500 rpm for 40 s, and annealed at 150° C. for 10 min under vacuum. The thickness of PEDOT was around 40 nm The spin-coating of the active layer was done in a glove box, using the polymers described herein mixed with [6,6]-phenyl-C$_{71}$-butyric acid methyl ester (PC$_{71}$BM), which was purchased from American Dye Source Inc. and used as received, in a solvent, in the proportions indicated in individual examples. The resulting "as spin-coated" film was either put in a covered petri dish for film aging and then annealed on a hot plate or directly put on the hotplate for thermal annealing or dried under vacuum at room temperature. The substrates comprising the spin coated films were then loaded in a thermal evaporator for the deposition of the cathode. The cathode, consisting of 1.0 nm LiF and 100 nm aluminum layers, was sequentially deposited through a shadow mask on top of the active layers in a vacuum of 8×10$^{-7}$ torr. Each substrate contained 5 pixels, each with an active area of 4.00 mm$^2$.

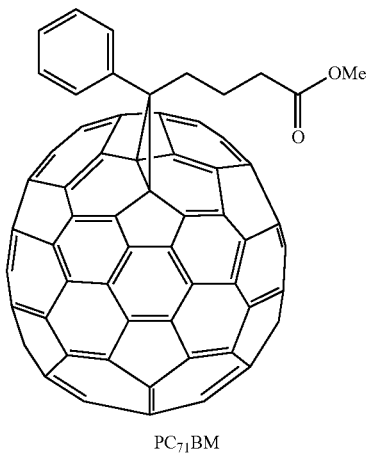 [SMILES: COC(=O)CCCC1(c2ccccc2)C23c4c5ccc6c7cc8c9c%10c(cc%11cc%12c%13c%14c(cc%15c%16ccc-5c2c%16c2c5c%16c%17c(c(c46)c7c9c%17c4c%10c%11c%13c4c%16c%14c%152)C513)C%12)C8]

PC$_{71}$BM

Film thickness was measured on an Alpha-Step 500 profilometer (KLA-Tencor, San Jose, Calif.). Current-voltage characteristics of solar cells devices were measured by using a HP4155A semiconductor parameter analyzer (Yokogawa Hewlett-Packard, Tokyo). The light intensity of 1.5 AM sunlight from a filtered Xe lamp was calibrated by a Si photodiode calibrated at the National Renewable Energy Laboratory (NREL). All the characterization steps were carried out under ambient laboratory air. UV-vis absorption spectra were recorded on a Perkin-Elmer model Lambda 900 UV/vis/near-IR spectrophotometer. The absorption spectra of polymer/fullerene films were directly measured from the solar cell devices.

Solar Cells Comprising PSOTT—

Figure 19A:
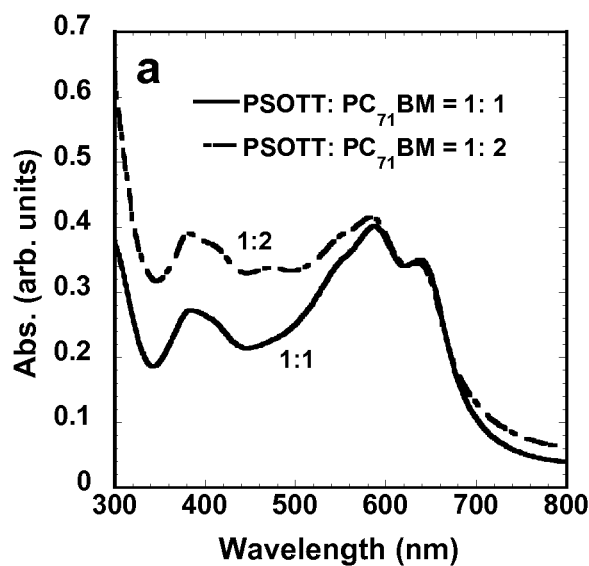
FIG. 19 discloses (a) The optical absorption spectrum of PSOTT:$PC_{71}BM$ blend films with the composition of 1:1 and 1:2, measured from solar cell devices, using ITO/PEDOT substrate as reference. (b) The current density—voltage characteristics of PSOTT:$PC_{71}BM$ solar cells with a structure of ITO/PEDOT/PSOTT:$PC_{71}BM$/LiF/Al under dark and 100 mW/cm2 1.5AM sun illumination. See Example 7.
Figure 19B:
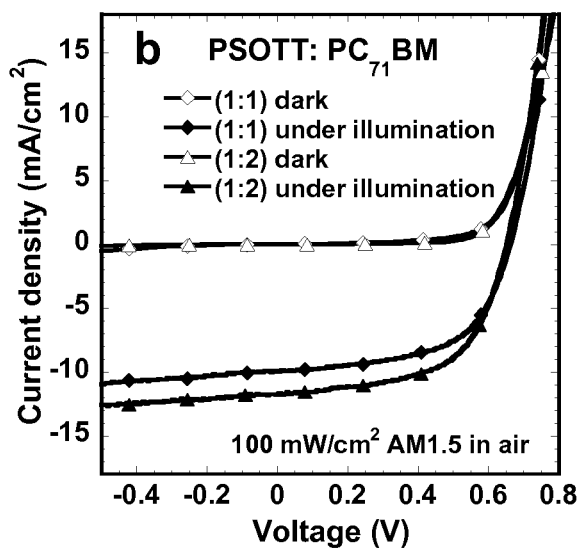

Photovoltaic cells with 4.0 mm$^2$ area were fabricated from PSOTT:PC$_{71}$BM blends, and tested in air under 100 mW/cm$^2$ AM1.5 illumination. The active layer of PSOTT:PC$_{71}$BM was spin-coated from 100° C. hot solution and film was dried in vacuum at room temperature immediately after spin-coating. A mixture of o-dichlorobenzene (ODCB) and 1,8-octanedithiol (ODT) (ODCB:ODT=100:2.5 v:v) was used as the solvent during spin coating. The absorption of the blend films and the current density-voltage characteristics of the solar cells are shown in FIG. 19. The polymer in the blend films show similar absorption characteristics to that of the pristine film (FIG. 1a) with the main peak at 585 nm and a vibronic shoulder at 636 nm, indicating similar structure of the polymer in the blend.

PSOTT:PC$_{71}$BM blend with 1:2 composition showed a better performance than that of 1:1. The short-circuit current density (J$_{sc}$), the open circuit voltage (V$_{oc}$), and the fill factor (FF) achieved from the 1:2 blend composition are 11.8 mA/cm2, 0.66 V, and 0.58, respectively, which result in a power conversion efficiency (PCE) of 4.5%. The PCE obtained from the 1:1 composition is 3.87% with J$_{sc}$=9.88 mA/cm$^2$, V$_{oc}$=0.66 V, and FF=0.59. The enhanced absorption in wavelength range of 380-560 nm (FIG. 19a) contributed by the PC$_{71}$BM component should account for the higher efficiency in the 1:2 blend film.

Solar Cells Comprising PSOxTT—Film Thickness Dependence.

Figure 20A:
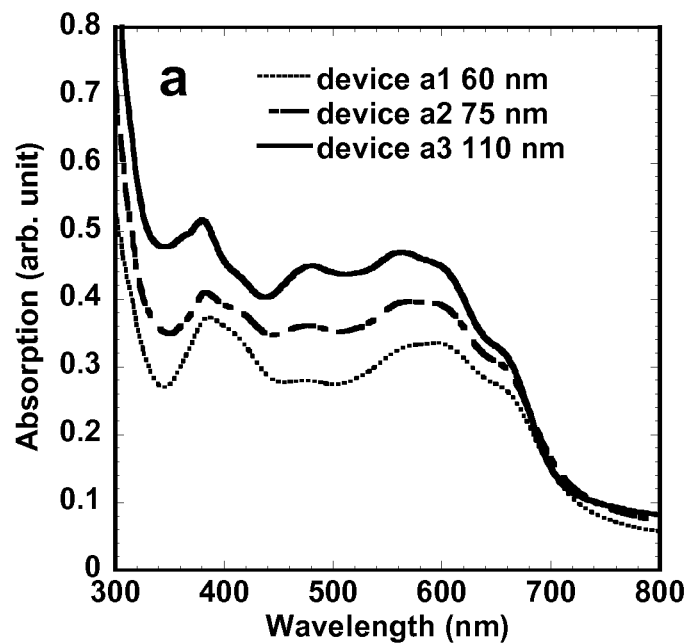
FIG. 20 discloses (a) The optical absorption spectra of PSOxTT:$PC_{71}BM$ (1:2) blend films with different thicknesses. The spectra were measured from solar cells using ITO/PEDOT substrate as reference. (b) The current density—voltage characteristics of PSOxTT:$PC_{71}BM$ (1:2) solar cells with different active layer thickness under 100 mW/cm$^2$ 1.5AM sun illumination. The solar cell has a structure of ITO/PEDOT/PSOTT:$PC_{71}BM$/LiF/Al. All the films were directly annealed on an 180° C. hotplate for 10 min after spin-coating. See Example 7.
Figure 20B:
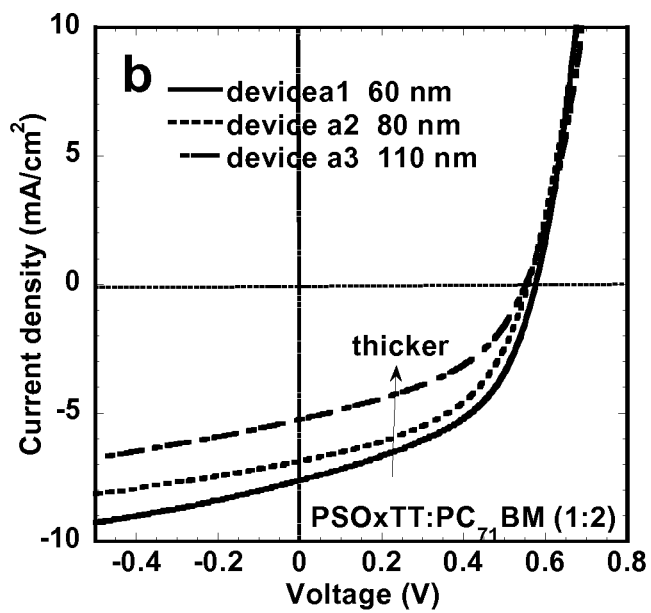

Using PSOxTT as the donor and PC$_{71}$BM as acceptor components (1:2 weight ratio), three devices (device a1-a3) with different active layer thickness were fabricated. The absorption spectra and the J-V curves of the three devices are given in FIGS. 20a and 20b. Device a1 with the lowest thickness shows the best performance with the J$_{sc}$, V$_{oc}$, FF, and PCE of 7.47 mA/cm$^2$, 0.58 V, 0.48, and 2.10%, respectively (Table 4).

TABLE 4

Photovoltaic cell performance of PSOxTT:PC$_{71}$BM Solar Cells.

| Device | PSOxTT: PC$_{71}$BM | Film Processing conditions | Thickness (nm) | Jsc (mA/cm$^2$) | Voc (V) | FF | PCE* (%) |
|---|---|---|---|---|---|---|---|
| Device a1 | 1:2 | No aging, 180° C. annealing | 60 | 7.47 | 0.58 | 0.48 | 2.06 (2.10) |
| Device a2 | 1:2 | No aging, 180° C. annealing | 75 | 6.51 | 0.56 | 0.46 | 1.68 (1.84) |
| Device a3 | 1:2 | No aging, 180° C. annealing | 110 | 5.94 | 0.56 | 0.46 | 1.50 (1.85) |
| Device a4 | 1:2 | 50 min aging, 180° C. annealing | 110 | 1.09 | 0.56 | 0.26 | 0.17 (0.35) |
| Device b1 | 1:1 | 40 min aging, no annealing | 60 | 6.14 | 0.61 | 0.49 | 1.86 (1.93) |
| Device b2 | 1:1 | 25 min aging, 120° C. annealing | 60 | 6.50 | 0.61 | 0.50 | 1.97 (2.09) |
| Device b3 | 1:1 | 15 min aging, 180° C. annealing | 60 | 6.72 | 0.57 | 0.46 | 1.78 (1.98) |
| Device b4 | 1:1 | No aging, 180° C. annealing | 60 | 7.20 | 0.57 | 0.55 | 2.28 (2.46) |

*The number in the parenthesis is the highest value among five solar cells measured.

Composition Dependence.

Devices with PSOxTT:PC$_{71}$BM ratio of 1:2 (device a3) and 1:1 (device b4) were fabricated under identical conditions, 1:1 composition shows better performance than that of 1:2. The J$_{sc}$, V$_{oc}$, FF, and PCE observed from device b4 are 7.20 mA/cm$^2$ 0.57 V, 0.55, and 2.46%, respectively.

Film Aging Time and Annealing Effects.

Four devices (devices b1 to b4) with PSOxTT: PC$_{71}$BM=1:1 spin-coated under the same condition but dried under different conditions (Table 4) were fabricated and the their performance is shown in Table 4 and FIG. 21b. The highest efficiency was obtained in device without any aging with a power conversion efficiency of 2.46%. Similar results also observed in 1:2 composition (Table 4, device a1 and device a4), indicating film aging (slow drying) has reverse effect on the PSOxTT photovoltaic performance. This is different from the behavior of P3HT solar cells, in which thermal annealing greatly enhanced photovoltaic performance.

Solar Cells Comprising PBTOTT—

Figure 22:
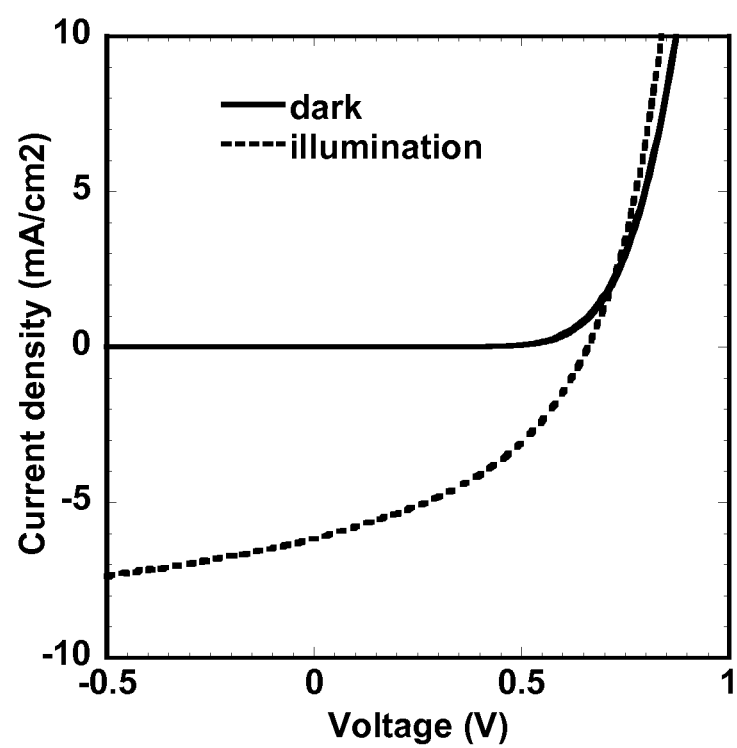
FIG. 22 discloses the current density/voltage characteristics of PBTOTT:$PC_{71}BM$ (1:1) solar cells, under dark and 100 mW/cm$^2$ 1.5AM sun illumination. The film was processed from a warm $CHCl_3$ and annealed on an 180° C. hotplate after overnight film aging. See Example 7.
Figure 23A:
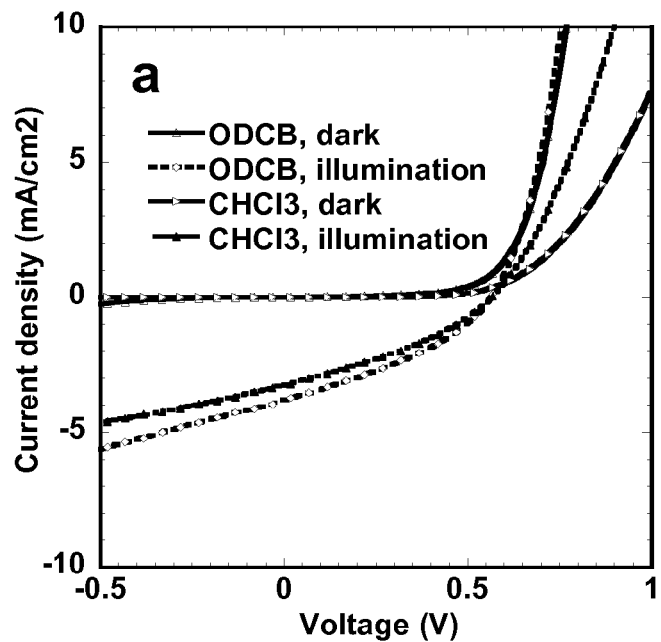
FIG. 23 discloses (a) the current density/voltage characteristics of PBTOxTT:$PC_{71}BM$ (1:2) solar cells processed from different solvents. The solar cell has a structure of ITO/PEDOT/PBTOxTT:$PC_{71}BM$/LiF/Al. (b) The optical absorption spectrum of PBTOxTT:$PC_{71}BM$ (1:2) blend films measured from the solar cell devices in (a). The ITO/PEDOT substrate was used as the reference. See Example 7.
Figure 23B:
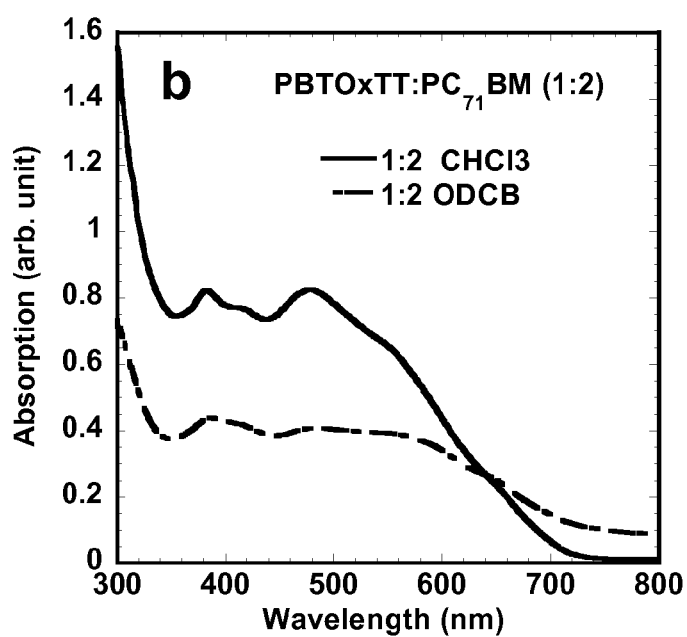
Figures 24A, 24B:
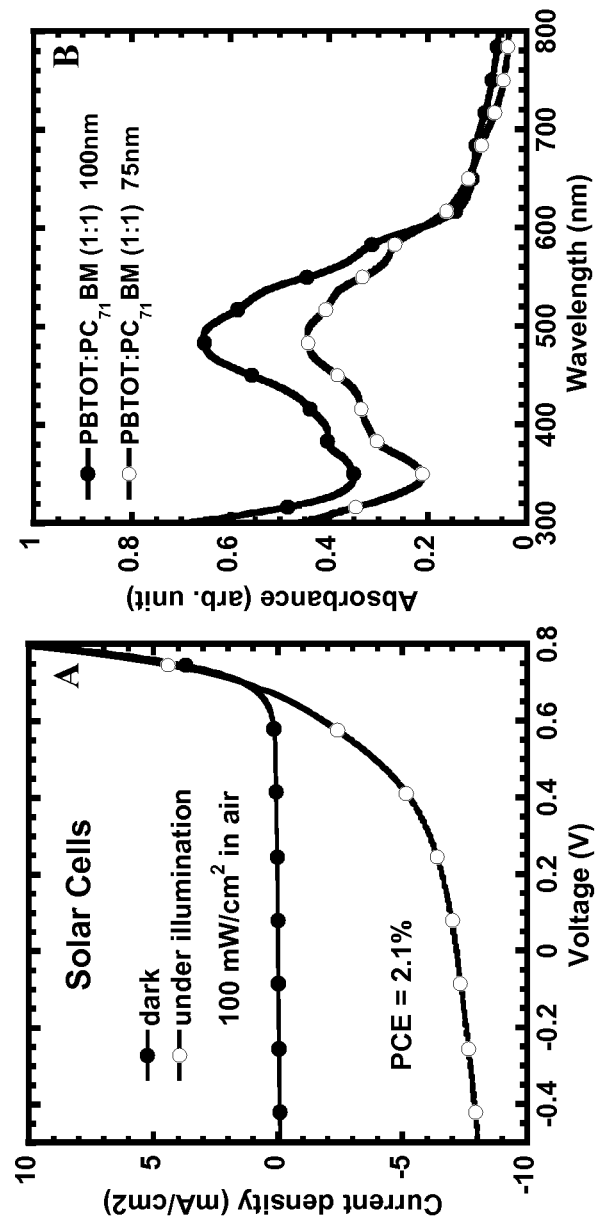
FIG. 24 discloses (a) Current density-voltage curves of a PBTOT-1:$PC_{71}BM$ (1:1) solar cell device under 100 mW/cm$^2$ AM1.5 solar irradiation and in the dark. (b) Optical absorption spectra of PBTOT-1:$PC_{71}BM$ (1:1) blend films on glass/ITO/PEDOT substrates. See Example 7.

A power conversion efficiency of 1.66% with was observed in PBTOTT:PC$_{71}$BM (1:1) bulk heterojunction solar cell prepared using CHCl$_3$ as solvent. The J-V curves under dark and 100 mW/cm$^2$ 1.5 μm sunlight are shown in FIG. 22. The J$_{sc}$, V$_{oc}$, FF, and PCE measured in this device are 6.17 mA/cm$^2$, 0.66 V, and 0.41, respectively.

Due to its high molecular weight, the PBTOTT was insoluble in ortho dichlorobenezene at room temperature, and devices made from hot ODCB solutions were short due to the aggregation of the polymer during film drying, so no current was observed in these devices made from hot ODCB solutions.

Solar Cells Comprising PBTOT-1.

Figure 21A:
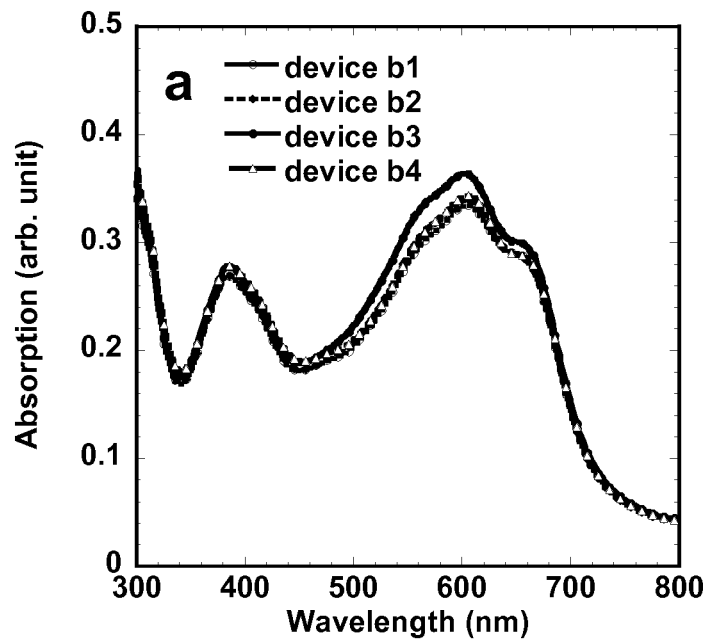
FIG. 21 discloses (a) The optical absorption spectra of PSOxTT:$PC_{71}BM$ (1:1) blend films under different drying conditions, 40 min aging without annealing (device b1); 25 min aging and 120° C. annealing (device b2); 15 min aging and 180° C. annealing (device b3); directly annealed (without aging) at 180° C. (device b4). The annealing time is 10 min for all films. The spectra were measured from solar cells using ITO/PEDOT substrate as reference. (b) The current density/voltage characteristics of devices b1 to b4 under 100 mW/cm$^2$ 1.5AM sun illumination. See Example 7.
Figure 21B:
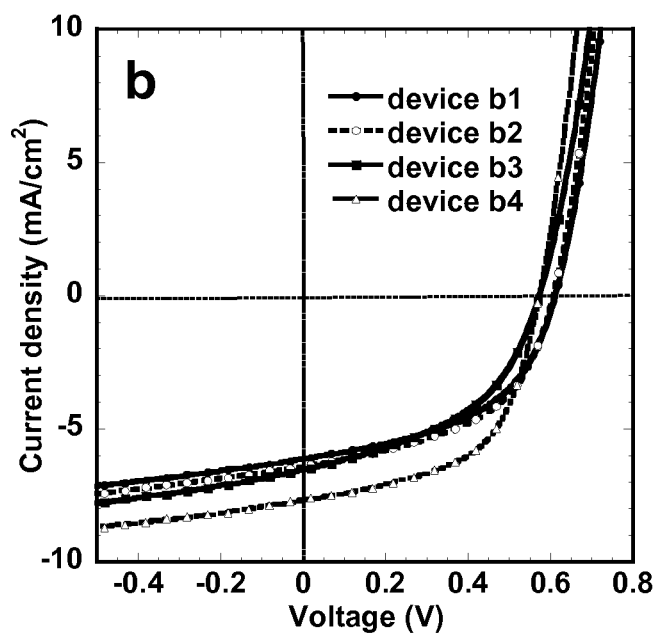

Bulk heterojunction (BHJ) solar cells based on blends of PBTOT-1 and PC$_{71}$BM were constructed in photodiodes with the layer structure ITO/PEDOT:PSS/blend/LiF/Al. The current-density-voltage characteristics of the PBTOT-1:PC$_{71}$BM (1:1) blend solar cell under dark and under 100 mW/cm$^2$ AM1.5 solar illumination are shown in FIG. 21b. The associated photovoltaic parameters, including the short-circuit current density (J$_{sc}$), the open circuit voltage (V$_{oc}$), the fill factor (FF), and power conversion efficiency (PCE) are summarized in Table 3 shown above. The combination of fairly large photocurrent (7.08 mA/cm$^2$) with a good open circuit voltage (0.66 V) translated to a 2.1% PCE.

The higher molecular weight sample, PBTOT-2, was not sufficiently soluble in 1,2-dichlorobenzene to achieve reasonable film thickness (60-100 nm) for the fabrication of BHJ devices.

Example 8

Synthesis of a Copolymer of Formula (IIb)—PTBSTT

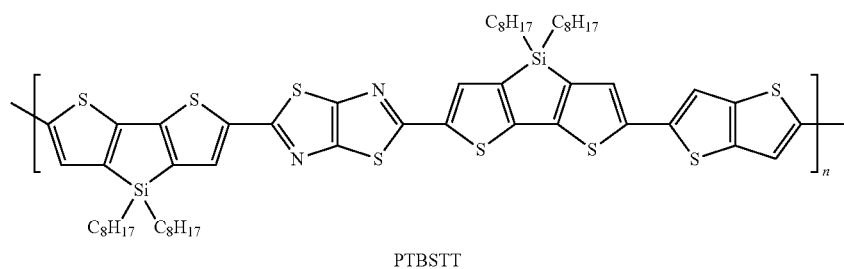

PTBSTT

Synthesis of Polymerizable Thiazolothiazole/Silylene-bithiophene Precursor:

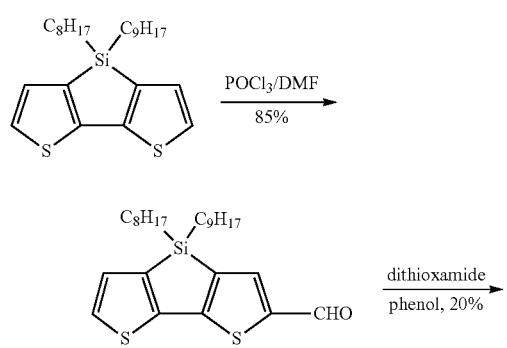

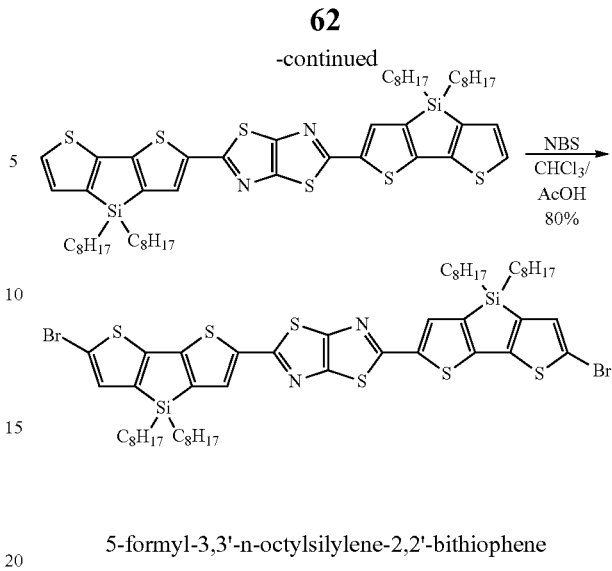

5-formyl-3,3'-n-octylsilylene-2,2'-bithiophene

To the stirred solution of anhydrous DMF (35 mL) at 0° C. in 100 mL three neck RB flask under Nitrogen atmosphere, POCl$_3$ (1.03 mL, 31.27 mmol) was added dropwise for 5 minutes. After addition, the reaction mixture was stirred at room temperature for 1 hour. Then dithienosilole (3.91 g, 26.06 mmol) in 10 mL DMF was added dropwise at 0° C. for 5 minutes. This solution was stirred at 70° C. for 90 minutes and poured it into ice water and then slowly neutralize with 10% NaOH solution (20 mL). Heat the resultant mixture in steambath for 20 min. The aqueous layer was extracted with CHCl$_3$ (3×100 mL), followed by drying over anhydrous Na$_2$SO$_4$. After the removal of solvents, the crude mixture was chromatographed on silica gel (10% ethyl acetate in hexane) to give 5-formyl-3,3'-n-octylsilylene-2,2'-bithiophene as a brown oil. (1.0 g, 85%). 1H NMR (CDCl$_3$, 300 MHz, ppm): δ 9.87 (s, 1H), 7.71 (s, 1H), 7.40 (d, 1H, 4.8 Hz), 7.12 (d, 1H, 4.8 Hz), 1.12-1.37 (m, 24H), 0.84-0.96 (m, 10H). M/e 446.78.

2,5-Bis-(7,7-dioctyl-7H-3,4-dithia-7-sila-cyclopenta[a]pentalen-2-yl)-thiazolo[5,4-d]thiazole Dithiooxamide (0.43 g, 3.58 mmol), 1.35 g of phenol, and 5-formyl-3,3'-n-octylsilylene-2,2'-bithiophene (3.20 g, 7.17 mmol) were combined in a round-bottom flask and were heated in an oil bath at refluxing temperature for 45 min. The crude product was purified by column chromatography on silica gel (5% Ethyl acetate in hexane) to give 2,5-Bis-(7,7-dioctyl-7H-3,4-dithia-7-sila-cyclopenta[a]pentalen-2-yl)-thiazolo[5,4-d]thiazole as a red solid. (0.2 g, 20%). 1H NMR (CDCl$_3$, 300 MHz, ppm): δ 7.52 (s, 2H), 7.31 (d, 2H, 4.8 Hz), 7.09 (d, 2H, 4.8 Hz), 1.27-1.40 (m, 48H), 0.84-0.97 (m, 20H). m/e=975.72.

2,5-Bis-(5-bromo-7,7-dioctyl-7H-3,4-dithia-7-sila-cyclopenta[a]pentalen-2-yl)-thiazolo[5,4-d]thiazole To a solution of 2,5-Bis-(7,7-dioctyl-7H-3,4-dithia-7-sila-cyclopenta[a]pentalen-2-yl)-thiazolo[5,4-d]thiazole (2.33 g, 2.39 mmol) in CHCl$_3$/AcOH (70/35 mL), NBS (0.94 g, 5.25 mmol) solution dissolved in CHCl$_3$/AcOH (70/35 mL) was added dropwise and stirred at 0° C. for 2 hours. Then the reaction solution was stirred at room temperature for one day. The reaction solution was washed with water, and then treated with anhydrous Na$_2$SO$_4$. The crude product was purified by column chromatography on silica gel (40% CHCl$_3$ in hexane) to give dibromo compound as a red solid. (2.16 g, 80%). 1H NMR (CDCl$_3$, 300 MHz, ppm): δ 7.50 (s, 2H), 7.05 (s, 2H), 1.23-1.34 (m, 48H), 0.84-0.96 (m, 20H).

2,5-bis(trimethylstannyl)thieno[3,2-b]thiophene (9)

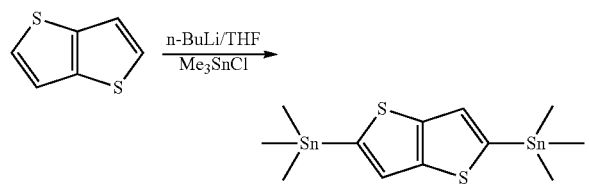

To a solution of thieno[3,2-b]thiophene (1.2 g, 8.56 mmol) in 60 mL THF, 2.5 M solution of n-BuLi in hexane (7.25 mL, 18.0 mmol) was added dropwise at −50° C. under N$_2$. The solution was stirred at −50° C. for 2 h and 1.0 M solution of trimethyltin chloride (18.9 mL, 18.8 mmol) in THF was added in one portion. After stirring at −50° C. for 2 h, the solution was warmed to room temperature and stirred for 24 h. The resulting mixture was poured into deionized water and 100 mL of CHCl$_3$. The organic layer was washed twice with 50 mL of water and dried over anhydrous Na$_2$SO$_4$. The organic layer was evaporated and dried over vacuum to afford brown solid. The solid was then purified by recrystallization from Et$_2$O to give colourless crystals (0.6 g, 82% yield). 1H NMR (CDCl$_3$, 300 MHz, ppm): δ 7.26 (s, 2H), 0.48 (s, 18H).

Synthesis of poly[(thieno[3,2-b]thiophene)-2,5-diyl-alt-(2,5-bis(4,4'-bis(2-octyl)dithieno[3,2-b:",3'-d]silole-2,6-diyl)thiazolo[4,4-d]thiazole] (PTBSTT)

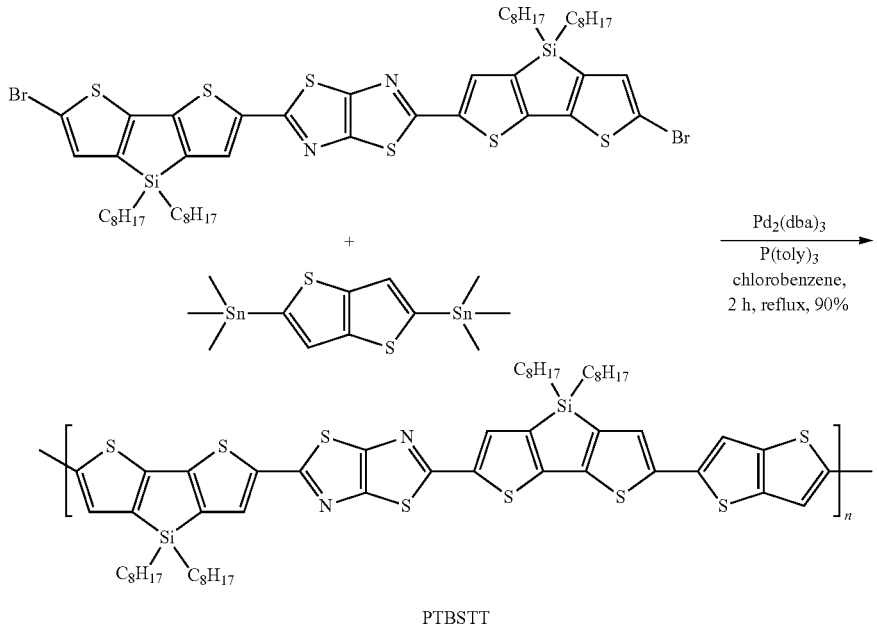

PTBSTT

The dibromo compound 2,5-Bis-(5-bromo-7,7-dioctyl-7H-3,4-dithia-7-sila-cyclopenta[a]pentalen-2-yl)-thiazolo[5,4-d]thiazole (600 mg, 0.53 mmol) and ditin compound 2,5-bis(trimethylstannyl)thieno[3,2-b]thiophene (247 mg, 0.53 mmol), and catalyst tris(dibenzylideneacetone)dipalladium (0) (9.6 mg, 0.01 mmol) and tri-o-tolylphosphine (13 mg, 0.042 mmol) in anhydrous chlorobenzene (40 mL) were heated at reflux for 2 h. Then the heating was reduced to 50° C.; the reaction mixture was poured into 300 mL of methanol containing 7.5 mL of hydrochloric acid and stirred for 12 h. The brown precipitate was collected via filtration, and was further purified by Soxhlet extraction with methanol and hexane; yield a dark brown metallic solid (560 mg, 90%).

Figure 25:
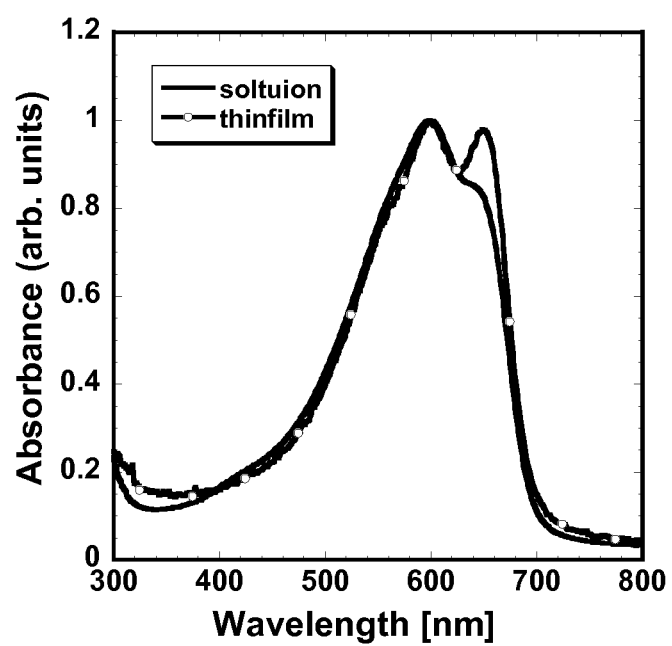
FIG. 25 shows the absorption spectra of PTBSTT in dilute chloroform solution and as a thin film. See Example 8.

The polymer PTBSTT is insoluble in CHCl$_3$ at room temperature but is slightly soluble in chlorobenzene, dichlorobenzene, and 1,2,4-trichlorobenzene at high temperature. The absorption spectra of PTBSTT in dilute o-dichlorobenzene solution and as a thin film are shown in FIG. 25. Absorption spectrum of PTBSTT in solution had an absorption maxima at 599 nm and a shoulder at 649 nm. The thin film similarly showed absorption maxima at 599 nm and 649 nm. The peak at 649 nm suggests strong intermolecular interactions in both solution and solid state.[1] The absorption peak at 649 nm is attributed to strong π-π interaction of PTBSTT molecules. The optical band gap measured at the absorption edge of the thin film was found to be 1.75 eV (FIG. 25).

Fabrication and Characterization of PTBSTT Thin Film Transistors:

Thin film OFETs utilizing PTBSTT as an organic semiconductor were fabricated in conventional bottom-contact, bottom-gate geometry. Gold electrodes with a thin chromium adhesive layer were patterned on top of heavily-doped silicon with silicon dioxide ($t_{ox}$=200 or 300 nm) substrates. The channel widths and lengths of the devices were 400 or 800 μm and 20 or 40 μm, respectively. The surface of the silicon dioxide was cleaned and treated with octyltrichlorosilane (OTS8). PTBSTT copolymer was spun onto hydrophobically modified oxide from a solution in 1,2,4-trichlorobenzene (TCB) and the resulting thin film OFETs were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$.

Figure 26B:
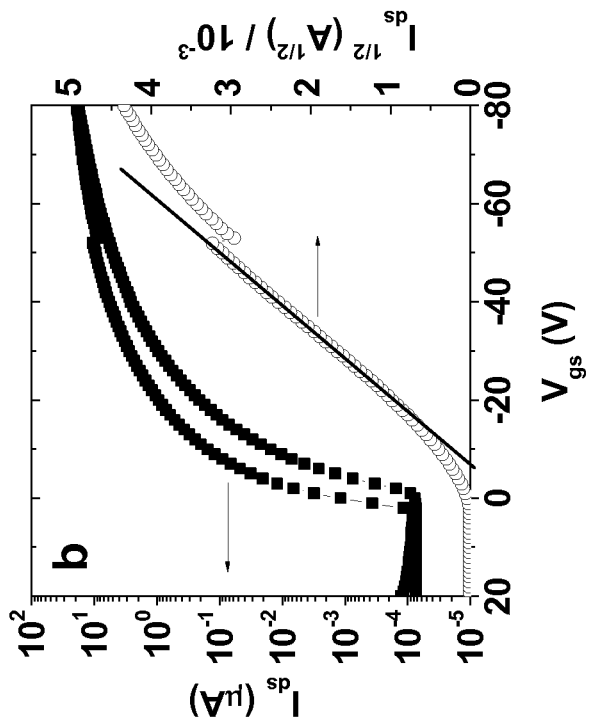
FIGS. 26a and 26b disclose output (a) and transfer (b) characteristics of a PTBSTT OFET. See Example 8.
Figure 26A:
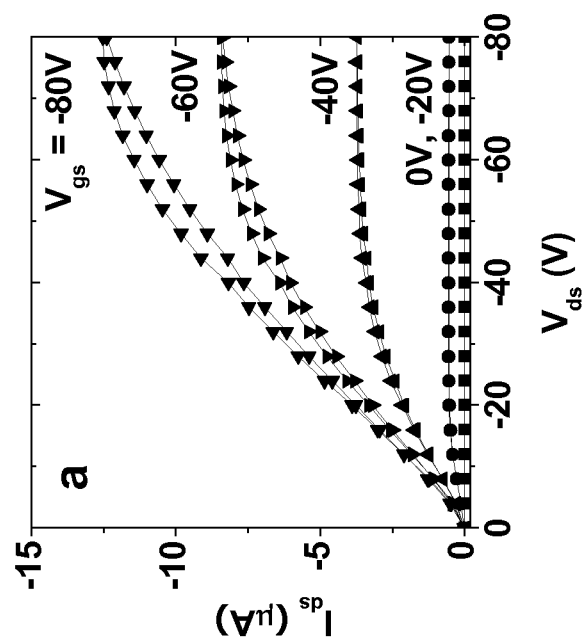

The output and transfer characteristics of the OFETs are shown in FIGS. 26a and 26b. The PTSBTT OFETs showed p-channel characteristics with a large current modulation ($I_{on}/I_{off}>10^5$). PTSBTT had a maximum hole mobility of 0.024 cm²/Vs (FIG. 2) and an average hole mobility of 0.018 cm²/Vs. The average threshold voltage ($V_t$) of PTSBTT was −6.4 V.

Example 9

Synthesis of a Copolymer of Formula (Ia)—Poly[(4,4'-bis(3-(2-ethyl-hexyl)dithieno[3,2-b:",3'-d]silole)-2,6-diyl-alt-(2,5-bis(3-(2-ethyl-hexyl)thiophen-2-yl)thiazolo[5,4-d]thiazole)] (PSEHTT)

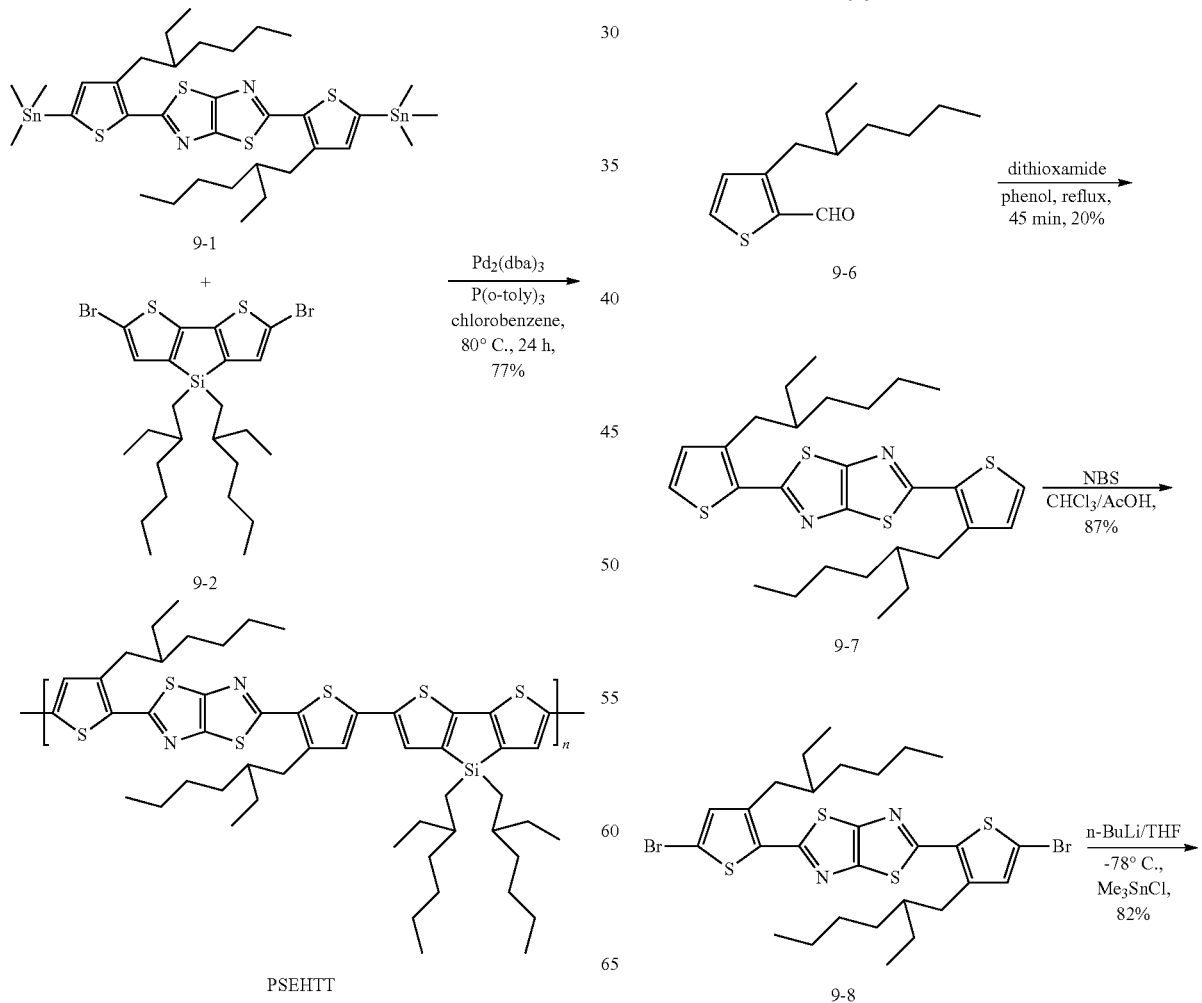

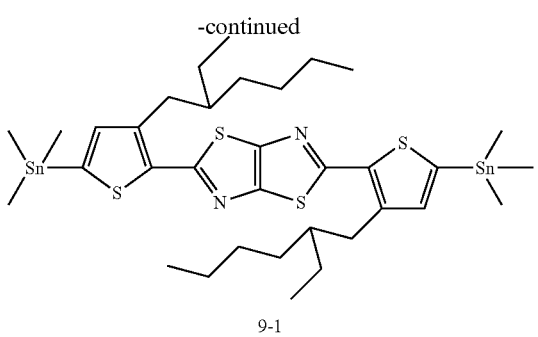

3-(2-Ethyl-hexyl)-thiophene (9-4)

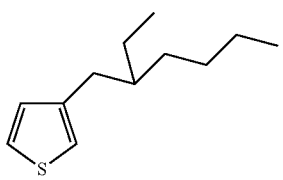

To a mixture of magnesium turnings (3.0 g, 0.12 mol), anhydrous THF (20 mL) and a small amount of iodine in a 300 mL flask, a solution of 2-ethylhexylbromide (23.5 g, 0.12 mol) in anhydrous THF (35 mL) was added slowly at 0° C. under N2. After refluxing for 1 h, the solution was added dropwise to a mixture of 3-bromothiophene (15 g, 0.09 mol, (9-3)), Ni(dppp)Cl$_2$ (0.51 g, 0.001 mmol) and anhydrous THF (35 mL) placed in a 500 mL flask at 0° C. After the mixture was stirred overnight at room temperature, the reaction was quenched by pouring cold HCl aq. (2 N) into the mixture. The product was extracted with CHCl$_3$ and dried over anhydrous Mg$_2$SO$_4$. The crude product was further purified by column chromatography using hexane as the eluent to give (9-4) as a clear liquid (11 g, 61%). $^1$H NMR (CDCl$_3$, 300 MHz, ppm): 7.20-7.22 (m, 1H), 6.88-6.90 (m, 2H), 2.56 (d, 2H, J=6.9 Hz), 1.49-1.57 (m, 1H), 1.24-1.33 (m, 8H), 0.86-0.89 (m, 6H)

2-Bromo-3-(2-Ethyl-hexyl)-thiophene (9-5)

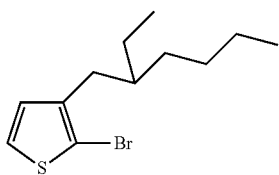

To 150 mL of THF solution of (9-4) (5.3 g, 26.9 mmol), N-bromosuccinimide (4.8 g, 26.9 mmol) was added portionwise at 0° C. and the mixture was stirred at 0° C. overnight. The organic fraction was extracted with water and CHCl$_3$, washed with NaHCO$_3$ aq., and dried over anhydrous Mg$_2$SO$_4$. The crude product was further purified by column chromatography using hexane as the eluent give (9-5) as a colourless liquid (6.9 g, 93%). $^1$H NMR (CDCl3, 300 MHz, ppm): 7.18 (d, 1H, J=5.7 Hz), 6.76 (d, 1H, J=5.7 Hz), 2.50 (d, 2H, J=7.2 Hz), 1.55-1.62 (m, 1H), 1.25-1.34 (m, 8H), 0.85-0.90 (m, 6H).

3-(2-Ethyl-hexyl)-thiophene-2-carbaldehyde (9-6)

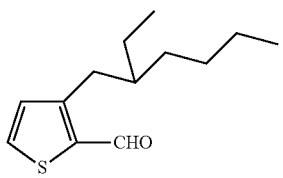

To a mixture of magnesium turnings (0.61 g, 25.1 mmol), anhydrous THF (20 mL) and a small amount of iodine in a 300 mL flask, a solution of bromothiophene (9-5), (6.58 g, 23.9 mmol) in anhydrous THF (35 mL) was added slowly at 0° C. under N$_2$. After refluxing for 1 h, the reaction mixture was transferred into a 250 mL flask at room temperature under N$_2$. DMF (3.24 mL, 41.9 mmol) was added dropwise to the reaction mixture. After the mixture was stirred overnight at room temperature, the reaction was quenched by pouring cold HCl aq. (2 N) into the mixture. The product was extracted with CHCl$_3$ and dried over anhydrous Mg$_2$SO$_4$. The crude product was further purified by column chromatography using hexane/CHCl$_3$ (2:1) as the eluent to give (9-6) as a colourless oil (3.7 g, 69%). $^1$H NMR (CDCl$_3$, 300 MHz, ppm): 10.03 (s, 1H), 7.64 (d, 1H, J=5.1 Hz), 6.98 (d, 1H, J=5.1 Hz), 2.89 (d, 2H, J=7.2 Hz), 1.56-1.64 (m, 1H), 1.27-1.37 (m, 8H), 0.86-0.91 (m, 6H).

2,5-Bis-[3-(2-ethyl-hexyl)-thiophen-2yl]-thiazolo[5,4d]thiazole (9-7)

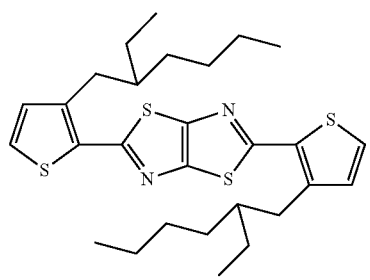

Dithiooxamide (0.95 g, 7.90 mmol), 2.97 g of phenol, and (9-6) (3.54 g, 15.79 mmol) were combined in a round-bottom flask and were heated in an oil bath at refluxing temperature for 45 min. The crude product was purified by column chromatography on silica gel (50% CHCl3 in hexane) to give (9-7) as a yellow solid. (0.85 g, 20%). 1H NMR (CDCl3, 300 MHz, ppm): $^1$H NMR (CDCl3, 300 MHz, ppm): 7.35 (d, 2H, J=5.1 Hz), 6.95 (d, 2H, J=5.1 Hz), 2.93 (d, 2H, J=7.2 Hz), 1.75-1.77 (m, 2H), 1.27-1.43 (m, 18H), 0.85-0.92 (m, 12H). (ESI mode). Found M+1, 531.3. requires 530.8.

2,5-Bis-[5-bromo-3-(2-ethyl-hexyl)-thiophen-2yl]-thiazolo[5,4-c]thiazole (9-8)

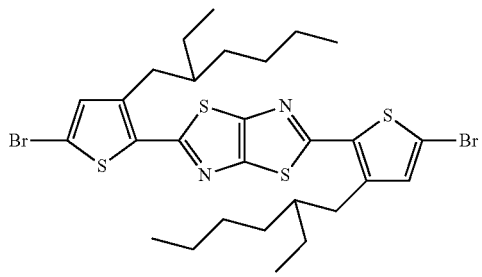

9-8

To a solution of (9-7) (0.71 g, 1.34 mmol) in CHCl$_3$/AcOH (20/10 mL), NBS (0.53 g, 2.95 mmol) solution dissolved in CHCl$_3$/AcOH (20/10 mL) was added dropwise and stirred at 0° C. for 2 hours. Then the reaction solution was stirred at room temperature for 24 hours. The reaction solution was washed with water, and then treated with anhydrous Na$_2$SO$_4$. The crude product was purified by column chromatography on silica gel (40% CHCl$_3$ in hexane) to give (9-8) as a yellow solid. (0.80 g, 87%). $^1$H NMR (CDCl3, 300 MHz, ppm): 6.91 (s, 2H), 2.84 (d, 2H, J=7.5 Hz), 1.73 (bs, 2H), 1.29-1.43 (m, 18H), 0.87-0.98 (m, 12H). (ESI mode). Found M+1, 688.9. requires 688.7.

2,5-Bis-[3-(2-ethyl-hexyl)-5-trimethylstannanyl-thiophen-2yl]-thiazolo[5,4-d]thiazole (9-1)

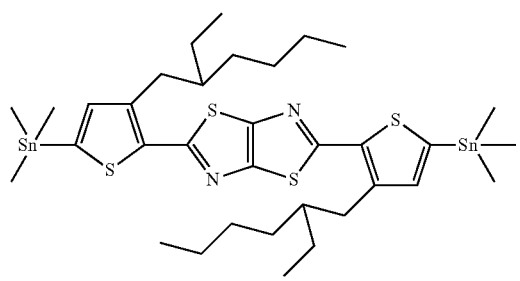

9-1

To a solution of (9-8) (0.62 g, 0.9 mmol) in 40 mL THF, 2.5 M solution of n-BuLi in hexane (0.89 mL, 2.23 mmol) was added dropwise at −78° C. The solution was stirred at −78° C. for 2 h and 1.0 M solution of trimethyltin chloride (2.67 mL, 2.68 mmol) in THF was added in one portion. The solution was warmed to room temperature and 50 mL of water and 50 mL of ethyl acetate were added. The organic layer was washed twice with 50 mL of water and dried over anhydrous Na$_2$SO$_4$. The organic layer was evaporated and dried over vacuum to afford yellow solid. (0.62 g, 82% yield). $^1$H NMR (CDCl$_3$, 300 MHz, ppm): 6.99 (s, 2H), 2.93 (d, 4H, J=7.2 Hz), 1.77 (bs, 2H), 1.26-1.37 (m, 16H), 0.87-0.91 (m, 12H), 0.41 (s, 18H). (ESI mode). Found M+1, 889.3, requires 888.5.

Poly[(4,4'-bis(3-(2-ethyl-hexyl)dithieno[3,2-b:",3'-d]silole)-2,6-diyl-alt-(2,5-bis(3-(2-ethyl-hexyl)thiophen-2-yl)thiazolo[5,4-d]thiazole)] (PSEHTT)

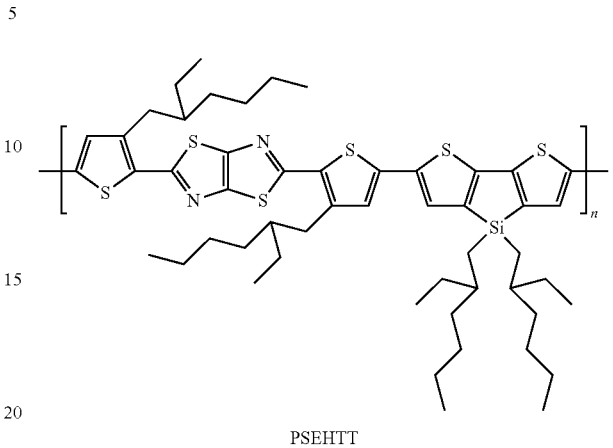

PSEHTT

The distannyl compound (9-1) (0.63 g, 0.73 mmol) and dibromo compound (9-2) (421 mg, 0.73 mmol) and catalyst tris(dibenzylideneacetone)dipalladium (0) (13 mg, 0.02 mmol) and tri-o-tolylphosphine (7 mg, 0.06 mmol) in anhydrous chlorobenzene (53 mL) were heated at 80° C. for 1 day. Then the heating was reduced to 50° C. The reaction mixture was poured into 200 mL of methanol containing 5 mL of hydrochloric acid and stirred for 5 h. The black precipitate was collected via filtration, and was further purified by Soxhlet extraction with methanol, hexane and dichloromethane to give dark brown solid PSEHTT (530 mg, 77%). $^1$H NMR (CDCl$_3$, 300 MHz, ppm): 6.50-7.45 (bs, 4H), 2.83 (bs, 4H), 0.4-2.1 (m, 64H).

Figure 27:
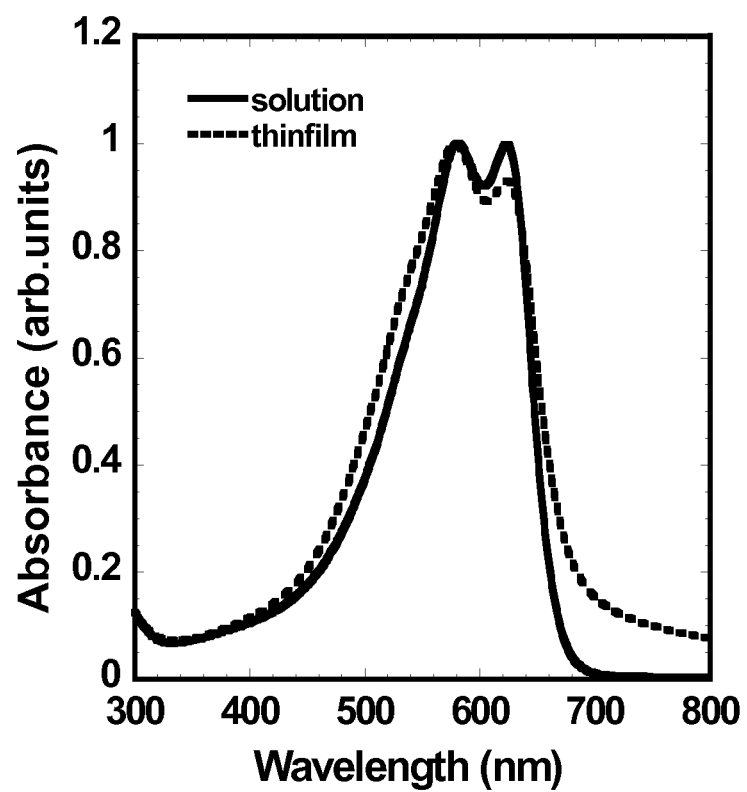
FIG. 27 shows the UV-visible absorption spectrum of PSEHTT (Example 9) in $CHCl_3$ and as a thin film.

Gel permeation chromatography (GPC) of PSEHTT showed a number-averaged molecular weight (Mn) of 33.9 kg/mol with a polydispersity index (PDI) of 3.94. PSEHTT is highly soluble in common organic solvents such as chloroform, chlorobenzene and dichlorobenzene at room temperature. For example, PSEHTT is soluble at 10 mg/mL in 1,2-dichlorobenzene at room temperature. FIG. 27 shows the absorption spectra of PSEHTT in dilute chloroform solution and as a thin film. The absorption maxima in solution was found to be 582 and 623 nm. Absorption spectra of thin films showed absorption maxima at 579 nm and a shoulder at 624 nm. The optical band gap determined from the absorption edge of the thin film is 1.82 eV. The HOMO level of PSEHTT was estimated from cyclic voltammetry (CV) results (not shown). The onset of the oxidation was 0.65 V (versus SCE), from which the HOMO level of the polymer can be calculated to be 5.05 eV.

Transistors Comprising PSEHTT—

Figure 28:
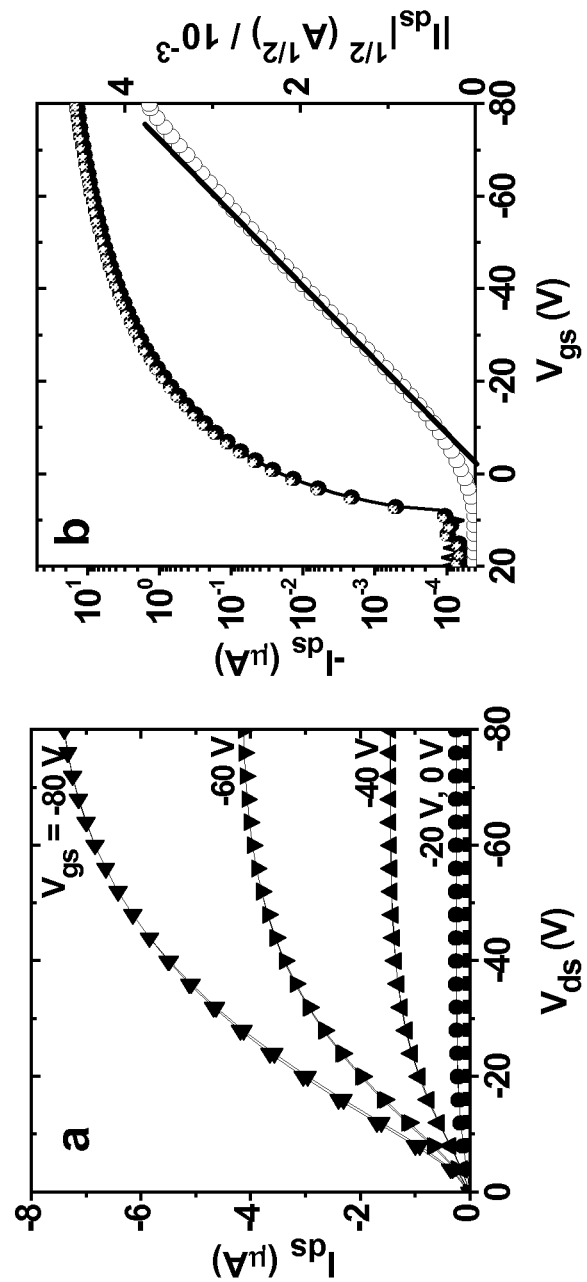
FIG. 28 discloses output (a) and transfer (b) electrical characteristics of a PSEHTT OFET. See Example 9.

The charge transport properties of PSEHTT were investigated by fabricating OFETs with conventional bottom-contact and bottom-gate geometry on top of silicon (gate) and silicon dioxide (dielectric) substrates and patterned gold source/drain electrodes. The typical output and transfer characteristics of PBTOT OFETs are shown in FIGS. 28a and 28b.

An average hole mobility ($\mu_h$) of 0.016 cm$^2$/V·s was observed for transistors comprising PSEHTT. The $I_{on}/I_{off}$ ratios were higher than 10$^5$ and the threshold voltage ($V_t$) was −4.0 V.

Solar Cells Comprising PSEHTT

Figure 29B:
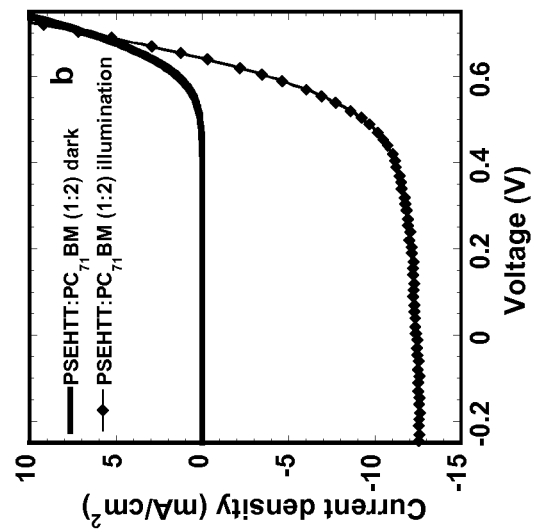
FIG. 29b shows the Current density-voltage curves of a PSEHTT:$PC_{71}BM$ (1:2) solar cell device under 100 mW/cm$^2$ AM1.5 solar irradiation and in the dark, see Example 9.
Figure 29A:
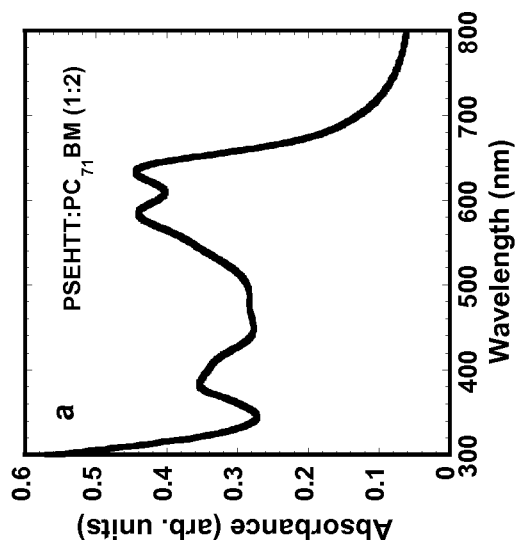
FIG. 29a shows the UV-vis absorption spectra of a film of a $PC_{71}BM$ (1:2) blend on a glass/ITO/PEDOT substrate.

Photovoltaic cells comprising a 1:2 blend of PSEHTT and $PC_{71}BM$ were prepared as outlined in Example 7. The films were spin-coated from a hot solution of $PSEHTT:PC_{71}BM$ blend and the solvent was a mixture of o-dichlorobenzene (ODCB) and 1,8-octanedithiol (ODT). The blend films were dried under vacuum at room temperature for certain of time. UV-Vis absorption spectra $PSEHTT:PC_{71}BM$ (1:2) blend films on glass/ITO/PEDOT substrates are shown in FIG. 29a. Current density-voltage curves of a $PSEHTT:PC_{71}BM$ (1:2) solar cell device under 100 mW/cm² AM1.5 solar irradiation and in the dark is shown in FIG. 29b. A power conversion efficiency of 5.03% with a current density of 12.60 mA/cm², an open circuit voltage of 0.65V and a fill factor of 0.61 are achieved in $PSEHTT:PC_{71}BM$ solar cells.

Example 10

Synthesis of a Copolymer of Formula (Ia)—Poly[(4,4'-bis(3-(2-ethyl-hexyl)-4H-cyclopenta[2,1-b; 3,4-b'] dithiophene)-2,6-diyl-alt-(2,5-bis(3-(2-ethyl-hexyl) thiophen-2yl)thiazolo[5,4-d]thiazole)] (PCPEHTT)

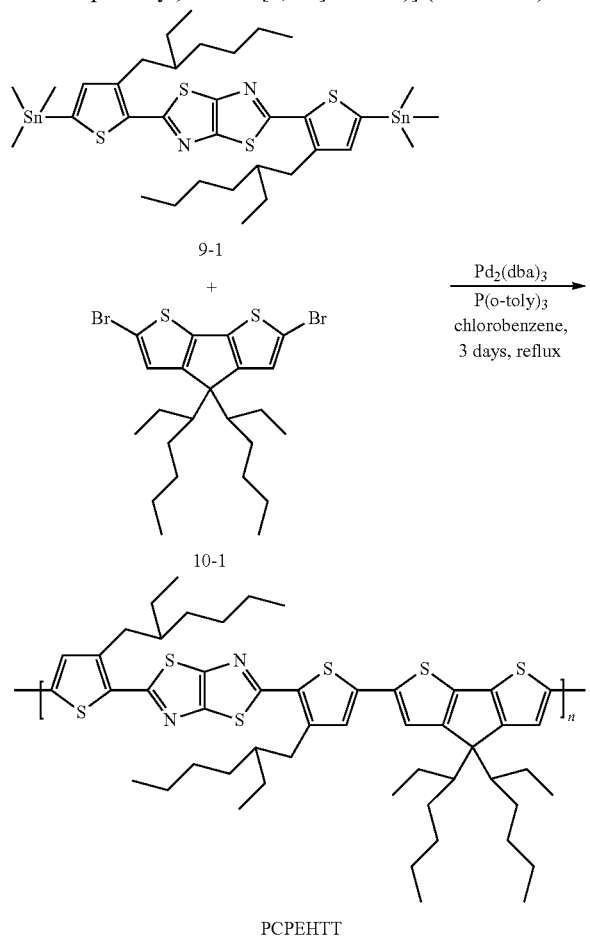

PCPEHTT

The distannyl compound (9-1) described above (0.61 g, 0.71 mmol) and dibromo compound (10⁻¹) (0.40 mg, 0.71 mmol) and catalyst tris(dibenzylideneacetone)dipalladium (0) (13 mg, 0.014 mmol) and tri-o-tolylphosphine (17 mg, 0.06 mmol) in anhydrous chlorobenzene (50 mL) were heated at reflux for 3 days. Then the heating was reduced to 50° C. The reaction mixture was poured into 200 mL of methanol containing 5 mL of hydrochloric acid and stirred for 5 h. The black precipitate was collected via filtration, and was further purified by Soxhlet extraction with methanol and hexane to give PCPEHTT (170 mg, 27%).

Figure 30A:
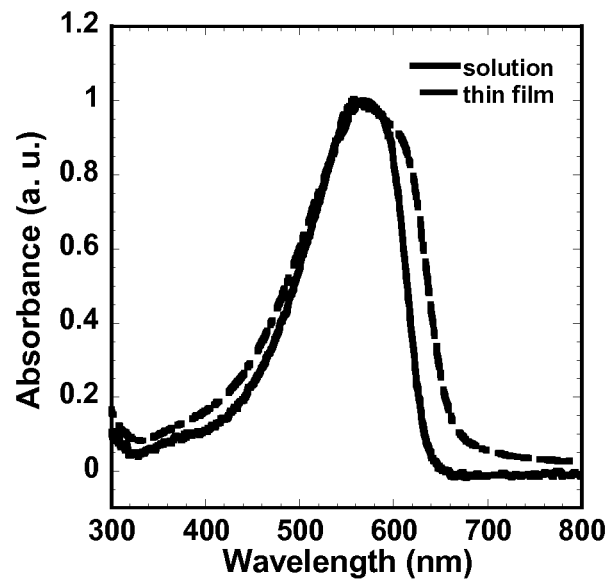
FIG. 30a shows UV-vis absorption spectra of PCPEHTT in $CHCl_3$ and as a thin film.
Figure 30B:
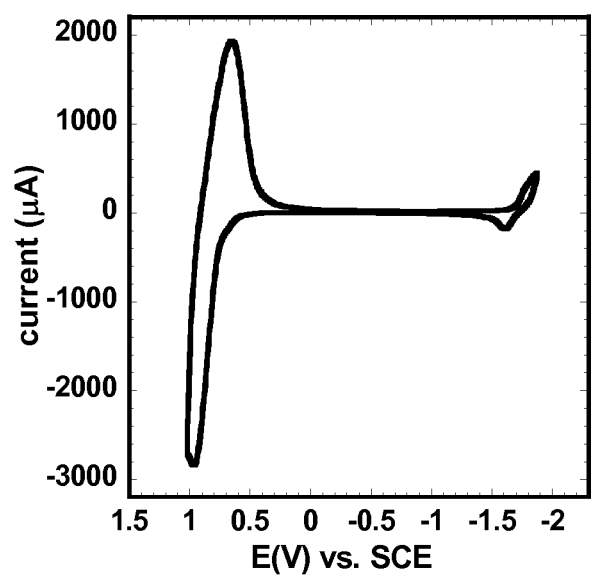
FIG. 30b shows Cyclic Voltammogram of PCPEHTT film on a platinum electrode in 0.1 mole/L $Bu_4NPF_6$, $CH_3CN$ solution. See Example 10.

PCPEHTT is highly soluble in common organic solvents such as chloroform, chlorobenzene and dichlorobenzene at room temperature. FIG. 30a shows the absorption spectra of PCPEHTT in dilute chloroform solution and as a thin film. The absorption maximum in solution was found to be 562 nm. Absorption spectra of thin films showed absorption maxima at 568 nm. The optical band gap determined from the absorption edge of the thin film is 1.85 eV. The HOMO level of PCPEHTT was estimated from cyclic voltammetry (CV) results (FIG. 30b). The onset of the oxidation was 0.61 (versus SCE), from which the HOMO level of the polymer are calculated to be 5.01 eV.

Transistors Comprising PCPEHTT—

Figure 31B:
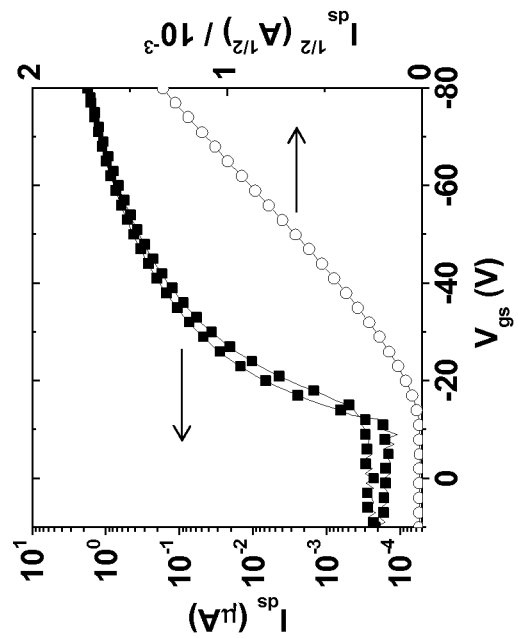
FIGS. 31a and 31b shows the electrical characteristics of PCPEHTT thin film transistors, see Example 10.
Figure 31A:
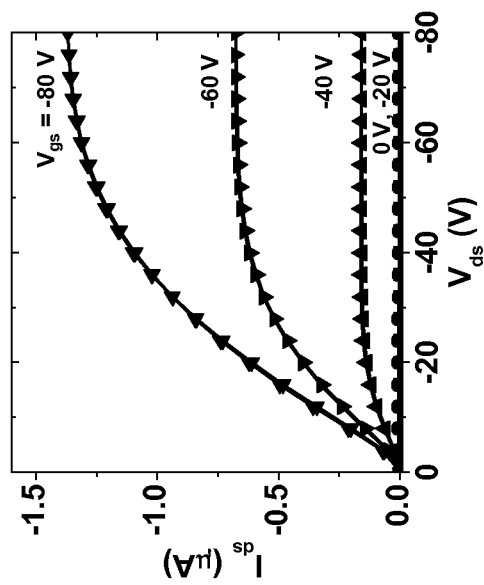

The charge transport properties of PSEHTT were investigated by fabricating OFETs with conventional bottom-contact and bottom-gate geometry on top of silicon (gate) and silicon dioxide (dielectric, $t_{ox}$=200 or 300 nm) substrates and patterned gold source/drain electrodes. The channel widths of the devices were 400 or 800 µm and lengths were 20 or 40 µm. The surface of the silicon dioxide was cleaned and treated with octyltrichlorosilane (OTS8). Polymers were spun onto hydrophobically modified oxide from solutions in 1,2-dichlorobenzene (ODCB). Thin films were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$. The typical output and transfer characteristics of PCPEHTT OFETs are shown in FIGS. 31a and 31b.

An average hole mobility ($\mu_h$) of 0.0033 cm²/V·s was observed for transistors comprising PCPEHTT. The $I_{on}/I_{off}$ ratios were higher than 10⁴ and the threshold voltage ($V_t$) was −21.8 V.

Solar Cells Comprising PCPEHTT

Figure 32B:
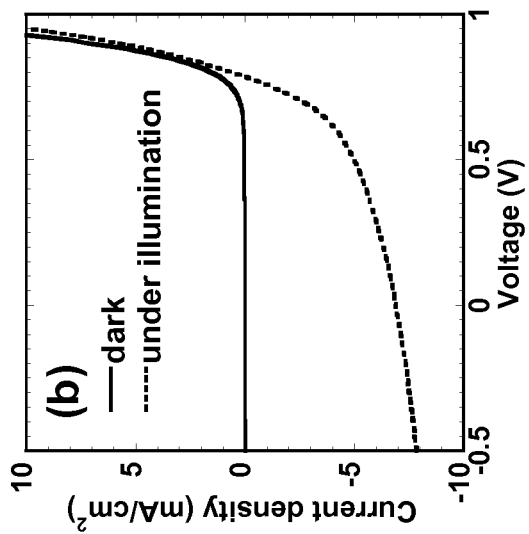
FIG. 32b shows the current density-voltage curves of a PCPEHTT:$PC_{71}BM$ (1:2) solar cell device under 100 mW/cm$^2$ AM1.5 solar irradiation and in the dark. See Example 10.
Figure 32A:
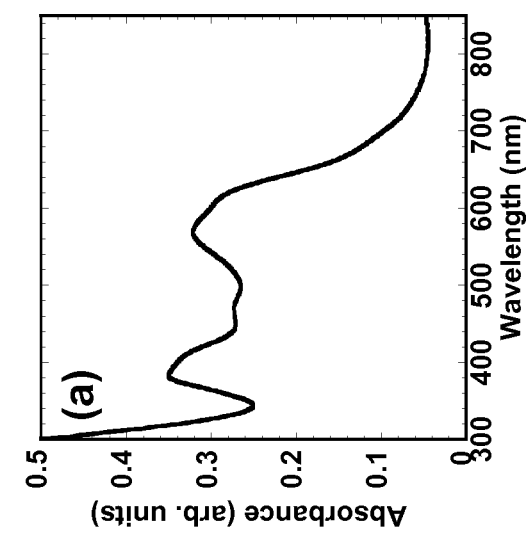
FIG. 32a shows optical absorption spectra of PCPEHTT:$PC_{71}BM$ (1:2) blend films on glass/ITO/PEDOT substrates.

Photovoltaic cells comprising a 1:2 blend of PCPEHTT and $PC_{71}BM$ were prepared as outlined in Example 7: UV-V is absorption spectra $PCPEHTT:PC_{71}BM$ (1:2) blend films on glass/ITO/PEDOT substrates are shown in FIG. 32a. Current density-voltage curves of a $PCPEHTT:PC_{71}BM$ (1:2) solar cell device under 100 mW/cm² AM1.5 solar irradiation and in the dark is shown in FIG. 32b. The current density ($J_{sc}$), open circuit voltage (V), and fill factor (FF) achieved in the $PCPEHTT:PC_{71}BM$ (1:2) solar cell are 6.90 mA/cm², 0.785 V, and 0.47, respectively, which result in a power conversion efficiency of 2.56%.

Example 11

Synthesis of a Copolymer of Formula (Ia)—Poly[(9-[3-ethyl-1-(2-ethyl-hexyl)-heptyl]-9H-carbazole)-2,7-diyl-alt-(2,5-bis(3-(2-ethyl hexyl)thiophen-2-yl) thiazolo[5,4-d]thiazole)] (PCEHTT)

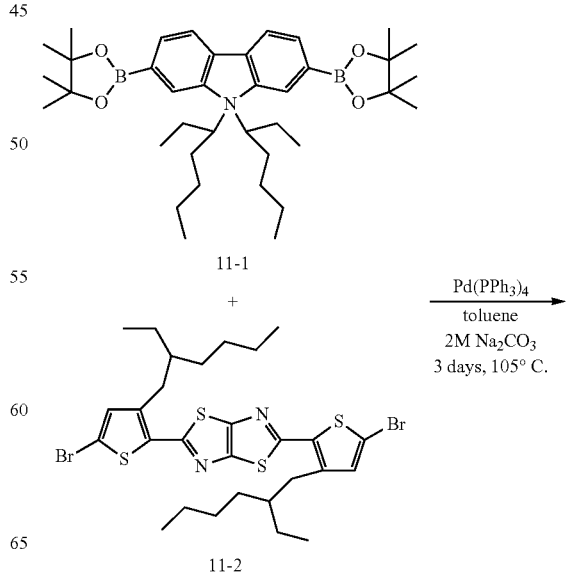

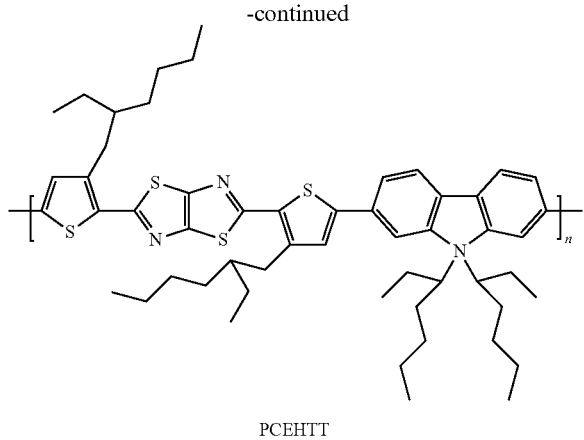

PCEHTT

To a three-necked flask was added carbazole diboronic diester 11-1 (0.5 g, 0.76 mmol), dibromo compound 11-2 (0.52 g, 0.76 mmol), Aliquat 336 (70 mg), and toluene (28 mL). Once the two monomers were dissolved, 2 M aqueous sodium carbonate solution (10 mL) was added. The flask equipped with a condenser was then evacuated and filled with nitrogen several times to remove traces of air. Tetrakis(triphenylphosphine) palladium(0) (Pd(PPh$_3$)$_4$, (18 mg, 0.015 mmol) was then added, and the mixture was stirred for 72 h at 105° C. under argon. The reaction mixture was cooled to room temperature, and the organic layer was separated, washed with water, and precipitated into methanol. The copolymer sample was filtered, washed with excess methanol, dried, and purified by a Soxhlet extraction with acetone for 2 days afforded dark brown solid (375 mg, 57%). To remove higher molecular weight, the polymer was further purified by a soxhlet extraction with chloroform afforded dark brown solid (106 mg).

PCEHTT is soluble in many common organic solvents such as chloroform, chlorobenzene and dichlorobenzene at room temperature. The visible absorption maximum in solution was found to be 506 nm. The absorption spectrum of thin films was red shifted and showed a broad absorption maximum from 519-660 nm. The optical band gap measured at the absorption edge of the film was calculated to be 1.84 eV.

Figure 33B:
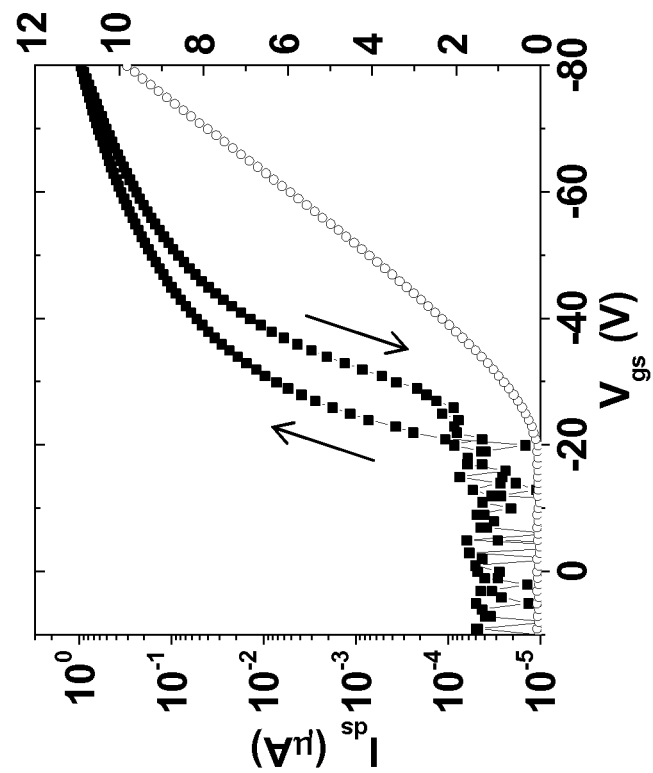
FIGS. 33a and 33b show the electrical characteristics of PCEHTT thin film transistors. See Example 11.
Figure 33A:
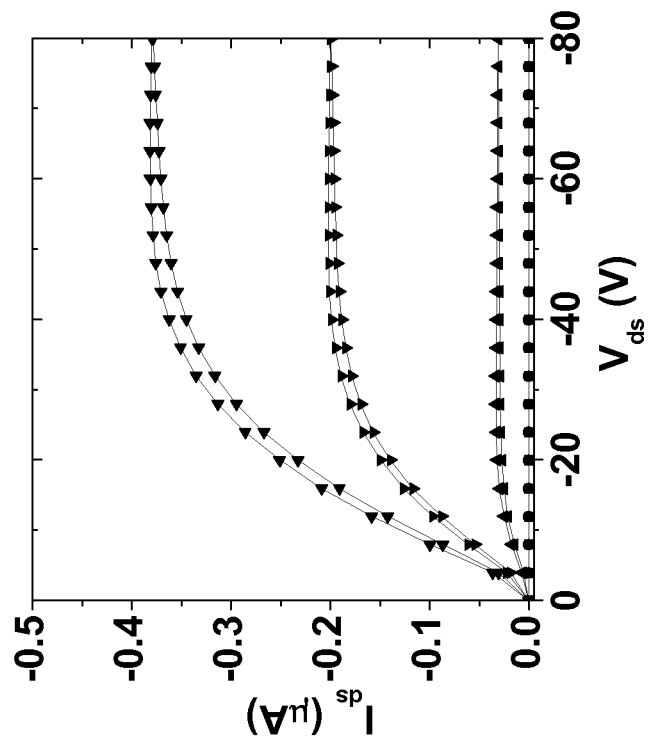

Fabrication and Characterization of Thin Film Transistors:

Transistors based on PCEHTT were fabricated and tested with conventional bottom-contact and bottom-gate geometry on top of silicon (gate) and silicon dioxide (dielectric, $t_{ox}$=200-300 nm) substrates and patterned gold source/drain electrodes. The channel widths of the devices were 400-1000 μm and lengths were 20-100 μm. The surface of the silicon dioxide was cleaned and treated with octyltrichlorosilane (OTS8). Polymer solutions were spun onto a substrate. Thin films were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$. The typical output and transfer characteristics of PCEHTT OFETs are shown in FIGS. 33a and 33b.

PCEHTT showed p-channel characteristics with a large current modulation ($I_{on}/I_{off}>10^4$). PCEHTT had a maximum hole mobility of 0.0022 cm$^2$/Vs and an average hole mobility of 0.0018 cm$^2$/Vs. The average threshold voltage ($V_t$) of PCEHTT was –24.0 V.

Figure 34:
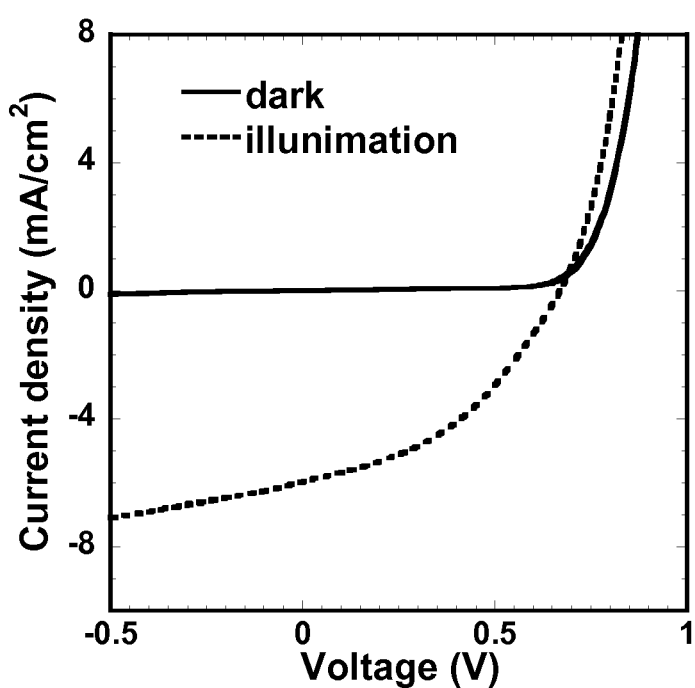
FIG. 34 shows current density-voltage (J-V) curves of PCEHTT:$PC_{71}BM$ (1:2) solar cells measured under dark and 100 mw/cm$^2$ 1.5AM sun light. See Example 11.

Fabrication and testing of Solar Cells of PCEHTT:

Solar cells using PCEHTT as donor and PC$_{71}$BM as acceptor components have been fabricated. The solar cells were made by spin-coating the PCEHTT:PC$_{71}$BM blend (1:2 wt:wt) active layer on PEDOT:PSS coated ITO substrates followed by deposition of the cathodes, consisting of 1 nm LiF and 100 nm Al, in a thermal evaporator. The PCEHTT: PC$_{71}$BM blend solution was made by mixing 6 mg/ml PCEHTT chloroform solution with 60 mg/ml PC$_{71}$BM ODCB solution under stirring. The spin-coating of the active layer was performed in a glove box and the films were annealed at 180° C. for 10 min. The solar cells had an active area of 9 mm$^2$. The current density-voltage (J-V) curves of PCEHTT: PC$_{71}$BM (1:2 wt:wt) solar cells measured under dark and illumination are shown in FIG. 34. Peak power conversion efficiency (PCE) of 1.70% was achieved in this solar cell with a current density ($J_{sc}$), an open circuit voltage (V), and a fill factor (FF) of 5.96 mA/cm$^2$, 0.68V, and 0.42, respectively.

Example 12

Synthesis of a Copolymer of Formula (Ia)—Poly(3-octyloxythiophen-2-yl)benzo[1,2-b:4,5-b']dithiophene)-2,6-diyl-alt-(2,5-bis(3-octylthiophen-2-yl)thiazolo[5,4-d]thiazole) PBDOTT

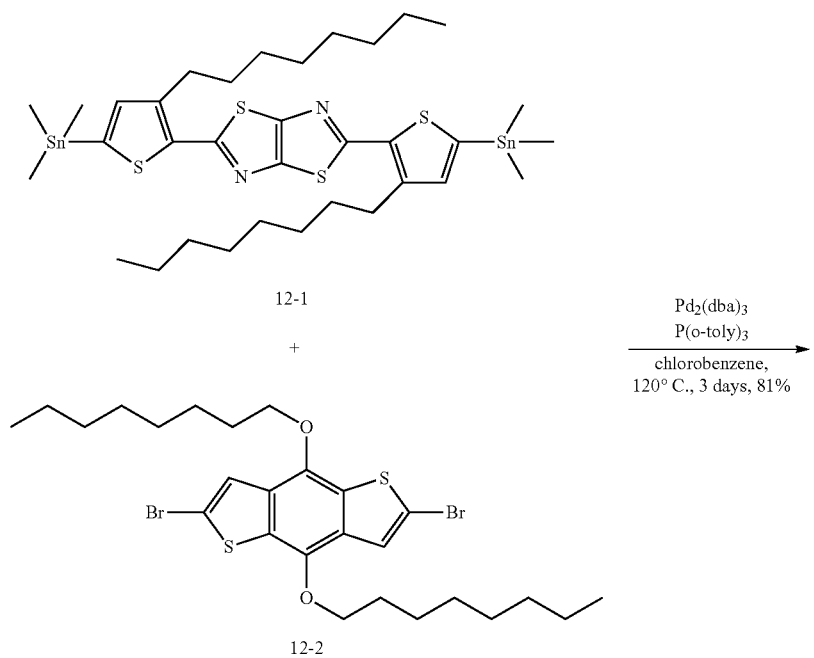

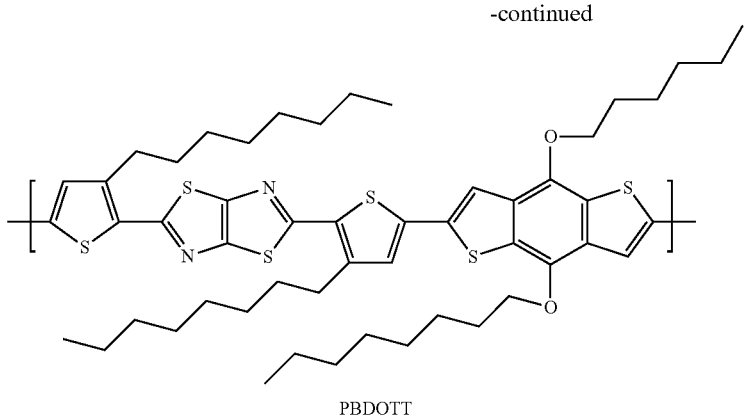

PBDOTT

Synthetic Procedure:

The distannyl compound 12-1 (0.5 g, 0.58 mmol) and dibromo compound 12-2 (0.35 mg, 0.58 mmol) and catalyst tris(dibenzylideneacetone)dipalladium (0) (11 mg, 0.06 mmol) and tri-o-tolylphosphine (14 mg, 0.12 mmol) in anhydrous chlorobenzene (40 mL) were heated at 120° C. for 3 days. Then the heating was reduced to 50° C. The reaction mixture was poured into 200 mL of methanol containing 5 mL of hydrochloric acid and stirred for 5 h. The brown precipitate was collected via filtration, and was further purified by Soxhlet extraction with methanol and hexane.

PBDOTT is not soluble in organic solvents such as chloroform, chlorobenzene and dichlorobenzene even at high temperatures (60-180° C.). It is partially soluble in 1,2,4-trichlorobenzene at very high temperature (200° C.). The absorption maximum in 1,2,4-trichlorobenzene ($\sim 10^{-5}$M) solution was found to be 542 and 587 nm. Absorption spectra of thin films showed absorption maxima at 538 nm and 583 nm. The optical band gap determined from the absorption edge of the thin film is 1.91 eV.

Fabrication and Characterization of Thin Film Transistors:

The transistors based on PBDOTT were fabricated and tested with conventional bottom-contact and bottom-gate geometry on top of silicon (gate) and silicon dioxide (dielectric, $t_{ox}$=200-300 nm) substrates and patterned gold source/drain electrodes. The channel widths of the devices were 400-1000 μm and lengths were 20-100 μm. The surface of the silicon dioxide was cleaned and treated with octyltrichlorosilane (OTS8). Polymer solutions were spun onto a substrate. Thin films were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$. PBDOTT showed p-channel characteristics with a large current modulation ($I_{on}/I_{off} > 10^4$). PBDOTT had a maximum hole mobility of 0.00026 cm²/Vs and an average hole mobility of 0.00026 cm²/Vs. The average threshold voltage ($V_t$) of PBDOTT was −3.4 V.

Example 13

Synthesis of a Copolymer of Formula (Ib)—Poly[(4,8-di(2-butyloctyloxy)benzo[1,2-b;d,4-b]dithiophene)-2,6'-diyl-alt-(2,5-bis(4,4'-bis(2-octyl)dithieno[3,2-b:'',3'-d]silole-2,6-diyl)thiazolo[4,4-d]thiazole] (PSDTTT)

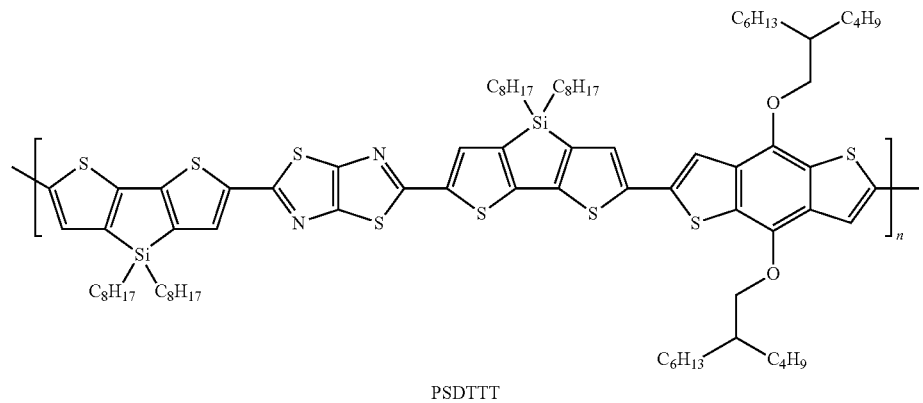

PSDTTT

Synthesis of Comonomer 13-2:

The synthesis of co-monomer 13-2 shown below has been reported in the literature, Huo, L.; Hou, J.; Chen, H. Y.; Zhang, S.; Jiang, Y.; Chen, T. L.; Yang, Y. *Macromolecules* 2009, 42, 6564, hereby incorporated herein in its entirety.

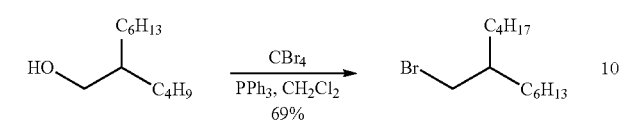

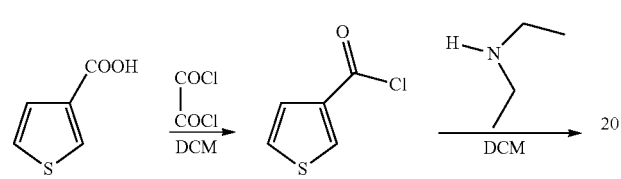

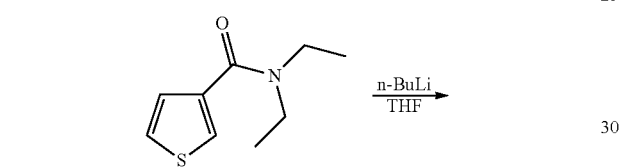

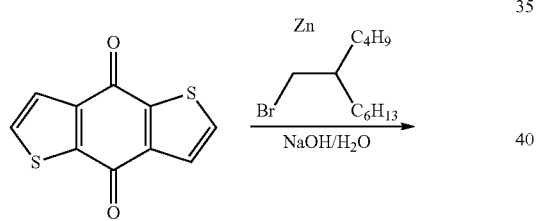

-continued

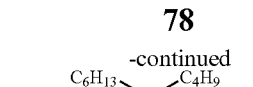

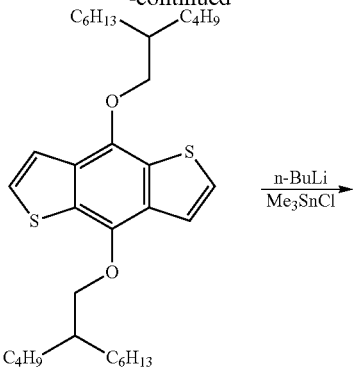

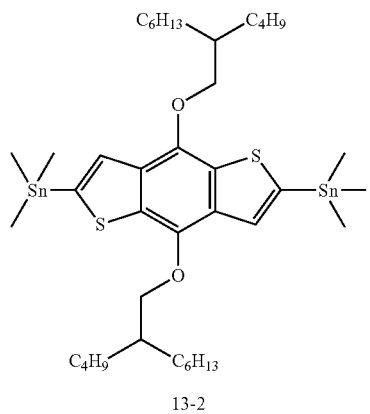

13-2

Synthesis of the Poly[(4,8-di(2-butyloctyloxy)benzo[1,2-b;d,4-b]dithiophene)-2,6'-diyl-alt-(2,5-bis(4,4'-bis(2-octyl)dithieno[3,2-b:",3'-d]silole-2,6-diyl)thiazolo[4,4-d]thiazole] (PSDTTT) Polymer

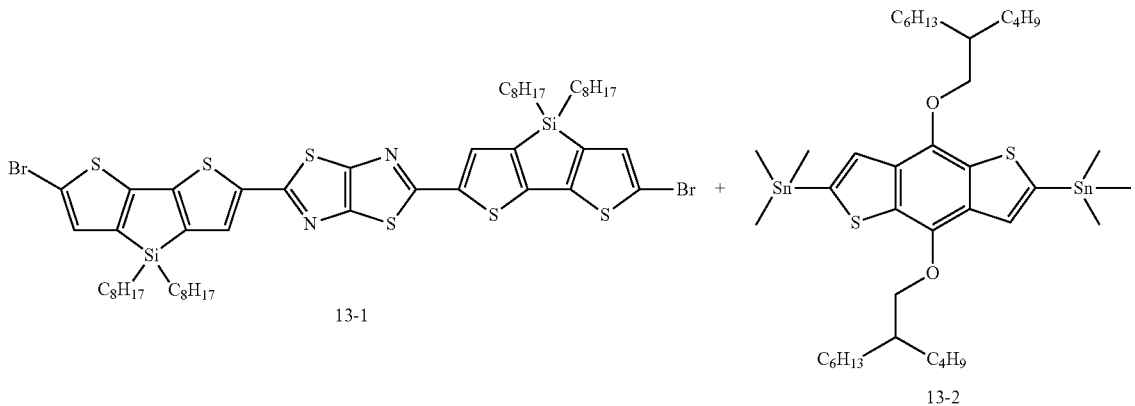

Pd$_2$(dba)$_3$ | chlorobenzene,
P(o-tolyl)$_3$ | 90° C., 36 h, 67%

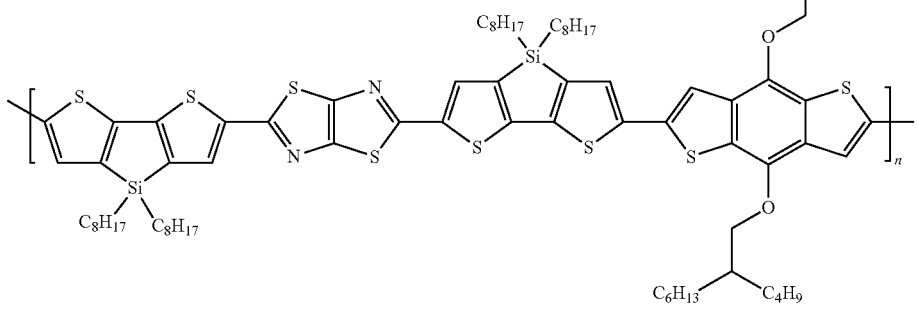

PSDTTT

The distannyl compound 2 (0.26 g, 0.30 mmol) and dibromo compound 1 (0.33 mg, 0.30 mmol) and catalyst tris(dibenzylideneacetone)dipalladium (0) (5 mg, 0.06 mmol) and tri-o-tolylphosphine (7 mg, 0.2 mmol) in anhydrous chlorobenzene (23 mL) were heated at 80° C. for 36 h. Then the heating was reduced to 50° C. The reaction mixture was poured into 200 mL of methanol containing 5 mL of hydrochloric acid and stirred for 5 h. The brown precipitate was collected via filtration, and was further purified by Soxhlet extraction with methanol and hexane. PSDTTT is soluble in common organic solvents such as chloroform, chlorobenzene and dichlorobenzene at room temperature.

PSDTTT has excellent film-forming properties and mechanical strength with broad absorption in the visible region. FIG. 34 shows the absorption spectra of PSDTTT in dilute chloroform (~$10^{-5}$M) and as a thin film. The absorption maximum in solution was found to be 571 and 614 nm. Absorption spectra of smooth shiny golden thin films showed absorption maxima at 576 nm and 618 nm. The optical band gap determined from the absorption edge of the thin film is 1.77 eV.

Transistors Comprising PSDTTT—

Figure 35:
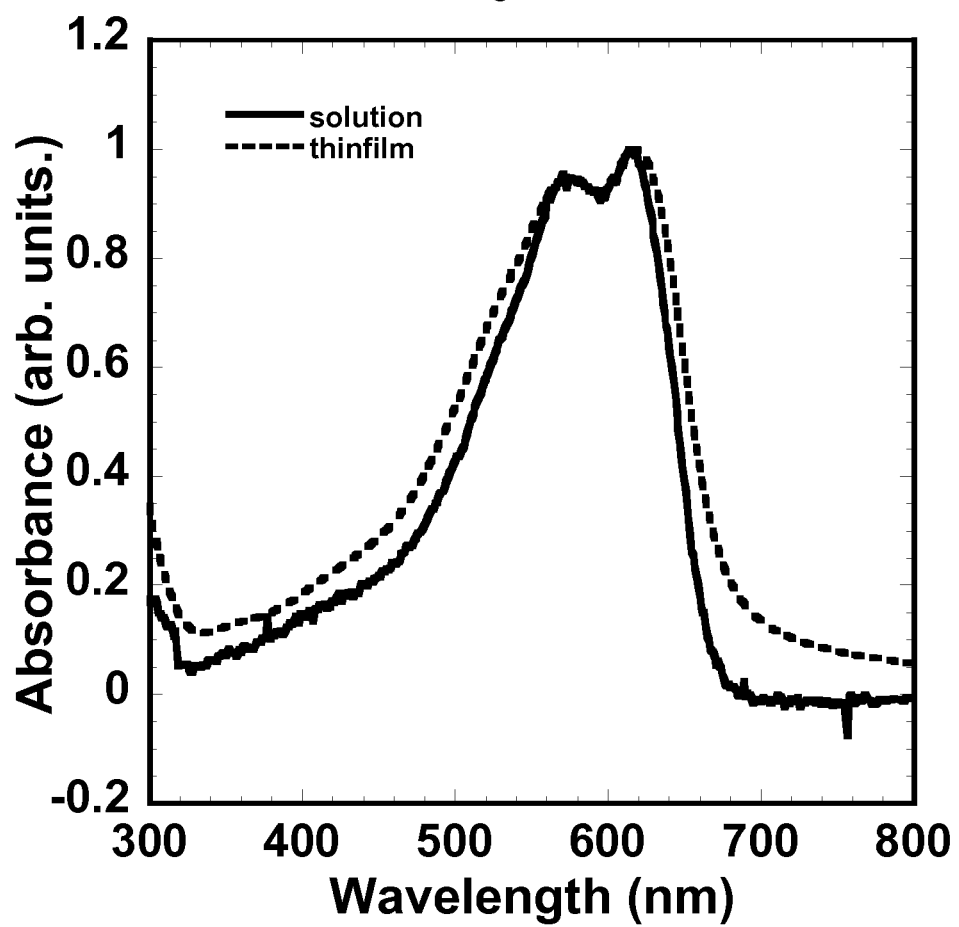
FIG. 35 shows the absorption spectra of PSDTTT in dilute chloroform solution and as a thin film. See Example 13.

The transistors based on PSDTTT were fabricated and tested with conventional bottom-contact and bottom-gate geometry on top of silicon (gate) and silicon dioxide (dielectric, $t_{ox}$=200-300 nm) substrates and patterned gold source/drain electrodes. The channel widths of the devices were 400-1000 μm and lengths were 20-100 μm. The surface of the silicon dioxide was cleaned and treated with octyltrichlorosilane (OTS8). Polymer solutions were spun onto a substrate. Thin films were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$. The typical output and transfer characteristics of PSDTTT OFETs are shown in FIGS. 35a and 35b. PSDTTT showed p-channel characteristics with a large current modulation ($I_{on}/I_{off}>10^4$). PSDTTT had a maximum hole mobility of 0.0088 cm²/Vs and an average hole mobility of 0.0085 cm²/Vs. The average threshold voltage ($V_t$) of PSDTTT was −23.3 V.

Figures 36A, 36B:
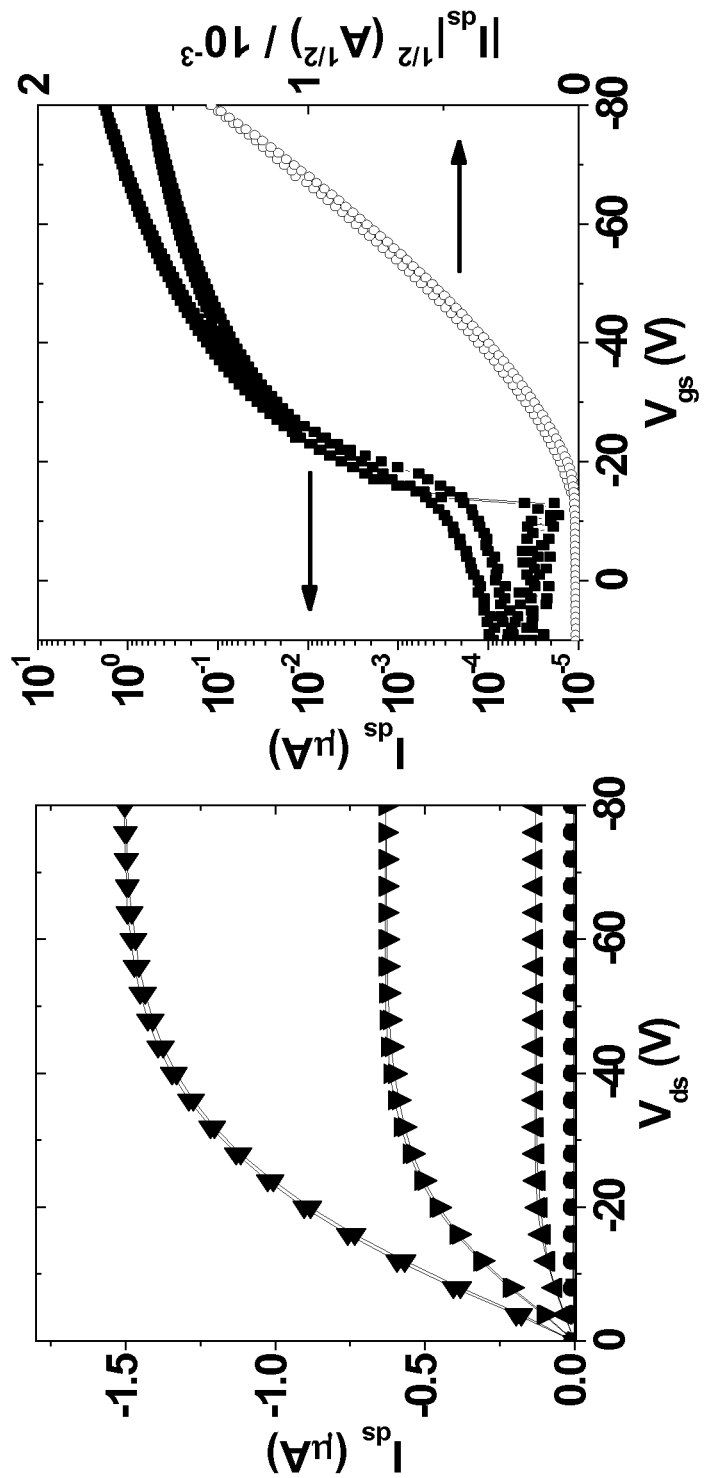
FIGS. 36a and 36b show typical output and transfer characteristics of PSDTTT OFETs. See Example 13.
Figure 37:
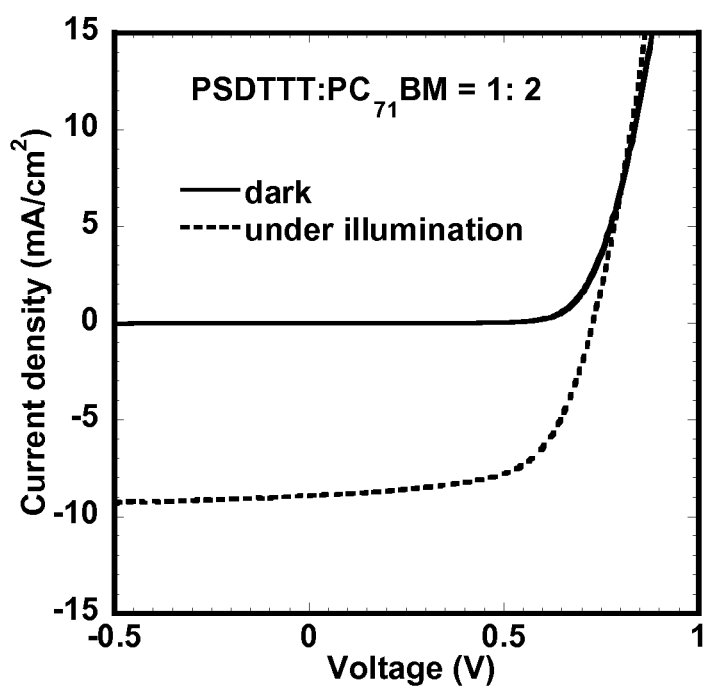
FIG. 37 shows current density-voltage (J-V) curves of PSDTTT:$PC_{71}BM$ (1:2) solar cells measured under dark and 100 mw/cm$^2$ 1.5AM sun light. See Example 13.

Fabrication and Testing of Solar Cells of PSDTTT:

Photovoltaic properties of PSDTTT were evaluated by fabricating bulk heterojunction solar cells using fullerene derivative $PC_{71}BM$ as an acceptor component. The solution of PSDTTT:$PC_{71}BM$ (1:2 wt:wt) blend solution was prepared by mixing 6 mg/ml PSDTTT solution in ODCB and 60 mg/ml $PC_{71}BM$ solution in ODCB under stirring. The solar cells were made by spin-coating the PSDTTT:$PC_{71}BM$ blend (1:2 wt:wt) layer on PEDOT:PSS coated ITO substrates followed by deposition of the cathodes, consisting of 1 nm LiF and 100 nm Al, in a thermal evaporator. The spin-coating of the active layer was performed in a glove box and the films were annealed at 180° C. for 10 min. The solar cells had an active area of 9 mm². The current density-voltage (J-V) curves of PSDTTT:$PC_{71}BM$ (1:2 wt:wt) solar cells measured under dark and illumination are shown in FIG. 36. Peak power conversion efficiency (PCE) of 4.3% was achieved in this solar cell with a current density (Jsc), an open circuit voltage (V), and a fill factor (FF) of 9.47 mA/cm², 0.73V, and 0.62, respectively.

Example 14

Synthesis of Poly(2,5-bis(3-(2-ethyl-hexyl)thiophen-2yl)thiazolo[5,4-d]thiazole)vinylen] (PTTEHV)

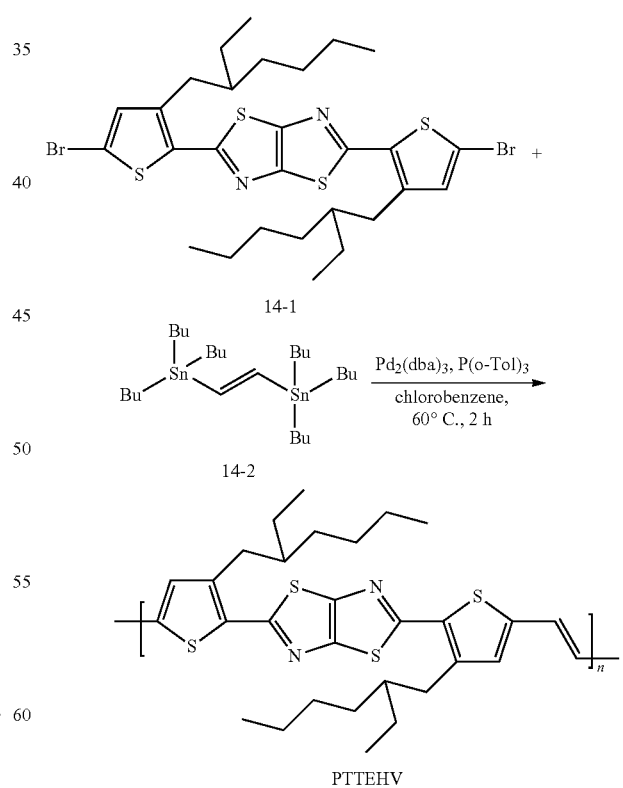

PTTEHV

Synthesis of PTTEHV:

The ditin compound 14-22 (426 mg, 0.7 mmol) and dibromo compound 14-1 (0.48 mg, 0.7 mmol), and catalyst tris(dibenzylideneacetone)dipalladium (0) (13 mg, 0.01 mmol) and tri-o-tolylphosphine (17 mg, 0.05 mmol) in anhydrous chlorobenzene (40 mL) were heated at 60° C. for 2 h. Then the heating was reduced to 50° C.; the reaction mixture was poured into 300 mL of methanol containing 7.5 mL of hydrochloric acid and stirred for 5 h. The brown precipitate was collected via filtration, and was further purified by Soxhlet extraction with methanol, hexane, dichloromethane and chloroform. The evaporation of chloroform fraction afforded dark brown solid (115 mg, 38%).

PTTEHV is soluble in chloroform solution at room temperature and soluble in chlorobenzene and dichlorobenzene at 100° C. The absorption maximum in solution in dilute $CHCl_3$ (~$10^{-5}$M) was found to be 536 nm. The absorption spectrum of the thin films is red shifted and showed a broad absorption maximum at 579 and 629 nm. The optical band gap measured at the absorption edge of the film was calculated to be 1.80 eV. The HOMO level of PTTEHV was estimated from cyclic voltammetry (CV) results. The onset and of the oxidation and reduction was 1.0 V and –0.87 V (versus SCE), from which the HOMO and LUMO level of the polymer are calculated to be 5.4 and 3.5 eV. The electrochemical band gap of the polymer PCPEHTT is 1.87 eV.

Transistors Comprising PTTEHV—

Figure 38B:
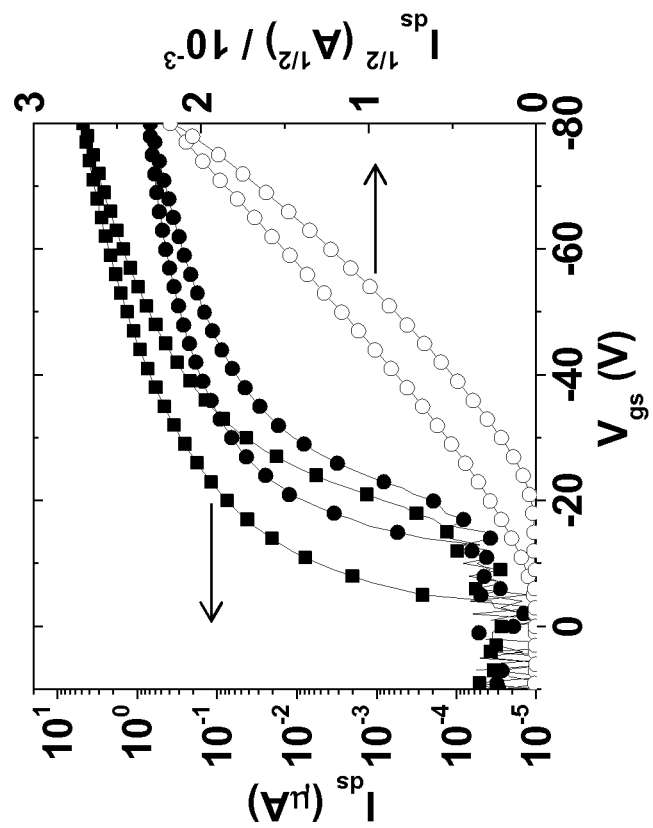
FIGS. 38a and 38b show typical output and transfer characteristics of PTTEHV OFETs. See Example 14.
Figure 38A:
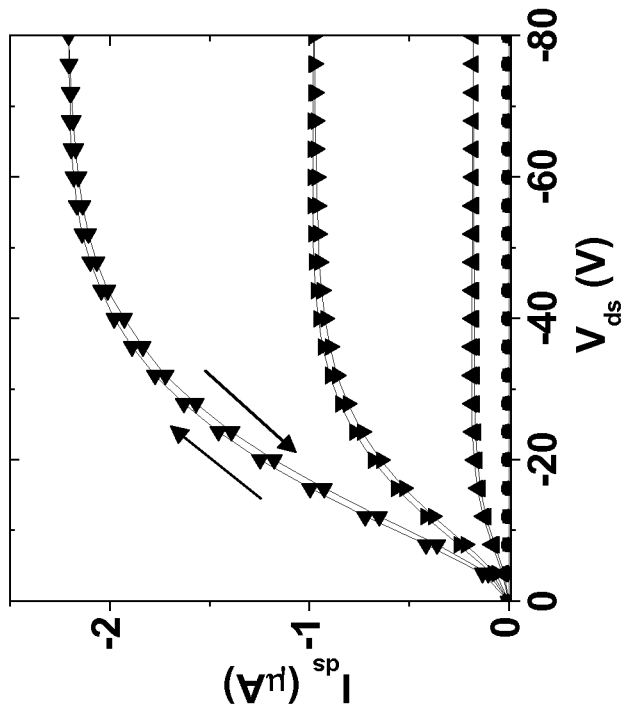

Transistors based on PTTEHV were fabricated and tested with conventional bottom-contact and bottom-gate geometry on top of silicon (gate) and silicon dioxide (dielectric, $t_{ox}$=200-300 nm) substrates and patterned gold source/drain electrodes. The channel widths of the devices were 400-1000 μm and lengths were 20-100 μm. The surface of the silicon dioxide was cleaned and treated with octyltrichlorosilane (OTS8). Polymer solutions were spun onto a substrate. Thin films were then annealed at 200° C. for 10 min under inert atmosphere. Devices were tested in nitrogen-filled dry box. Electrical parameters were calculated by using the standard equation for metal-oxide-semiconductor field-effect transistors in saturation region: $I_{ds}=(\mu C_o W/2L)(V_g-V_t)^2$. The typical output and transfer characteristics of PTTEHV OFETs are shown in FIGS. 38a and 38b. PTTEHV showed p-channel characteristics with a large current modulation ($I_{on}/I_{off}$>$10^4$). PTTEHV had a maximum hole mobility of 0.0087 $cm^2$/Vs and an average hole mobility of 0.0078 $cm^2$/Vs. The average threshold voltage ($V_t$) of PTTEHV was –19.0 V.

Fabrication and Testing of Solar Cells of PTTEHV:

Solar cells using PTTEHV as donor and $PC_{71}BM$ as acceptor components have been fabricated. The active layer of the solar cells were spin-coated from PTTEHV:$PC_{71}BM$ (1:2 wt:wt) blend solution in chloroform on top of PEDOT:PSS coated ITO substrates. The solar cell devices were finished by deposition of the cathodes, consisting of 1 nm LiF and 100 nm Al, in a thermal evaporator. The spin-coating of the active layer was performed in a glove box and the films were annealed at 180° C. for 10 min. The solar cells had an active area of 9 $mm^2$.

Figure 39B:
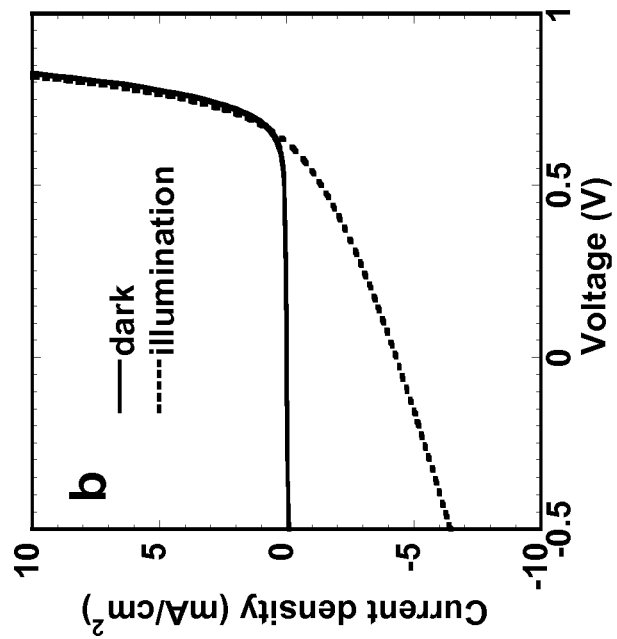
FIG. 39b shows Current density-voltage curves of a PTTEHV:$PC_{71}BM$ (1:2) solar cell device under 100 mW/cm$^2$ AM1.5 solar irradiation and in the dark. See Example 14.
Figure 39A:
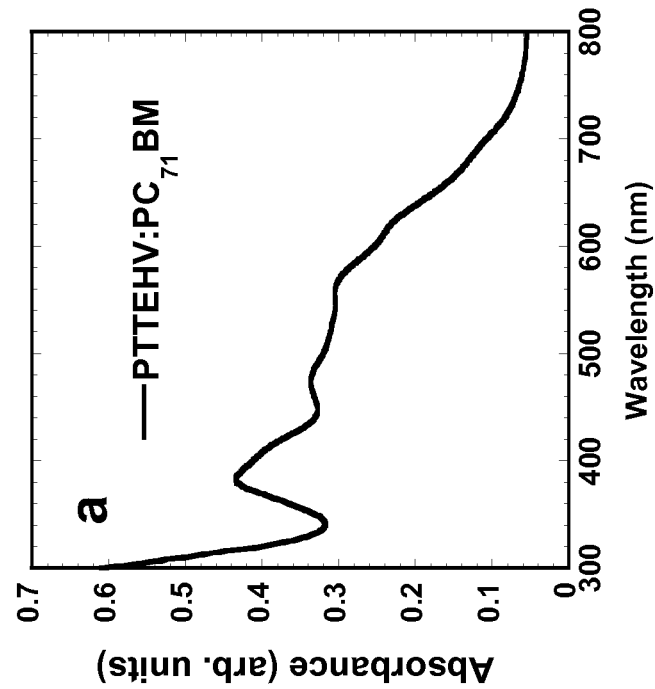
FIG. 39a shows Optical absorption spectra of PTTEHV:$PC_{71}BM$ (1:2) blend films on glass/ITO/PEDOT substrates.

FIG. 39a shows Optical absorption spectra of PTTEHV: $PC_{71}BM$ (1:2) blend films on glass/ITO/PEDOT substrates. FIG. 39b shows Current density-voltage curves of a PTTEHV:$PC_{71}BM$ (1:2) solar cell device under 100 mW/$cm^2$ AM1.5 solar irradiation and in the dark. A performance with a power conversion efficiency of 0.87% with Jsc of 4.31 mA/$cm^2$, Voc of 0.63 V, and FF of 0.32 was observed in PTTEHV:$PC_{71}BM$ (1:2) bulk heterojunction solar cells.

CONCLUSIONS

The above specification, examples and data provide exemplary description of the manufacture and use of the various compositions and devices of the inventions, and methods for their manufacture and use. In view of those disclosures, one of ordinary skill in the art will be able to envision many additional embodiments of the inventions disclosed and claimed herein to be obvious, and that they are within scope of the inventions disclosed and claimed. The claims hereinafter appended define some of those embodiments.

The invention claimed is:

1. A copolymer comprising the structure:

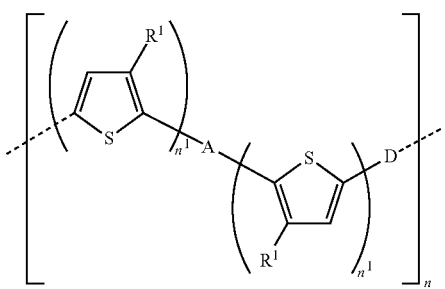

wherein
a) n is a positive integer of 2 or greater,
b) $n^1$ is 1, 2, 3, or 4,
c) each $R^1$ is independently selected from hydrogen, a halogen, cyano, or a $C_1$-$C_{18}$ organic radical selected from optionally substituted normal or branched alkyls, alkoxys, or thioalkyls;
d) A has the structure

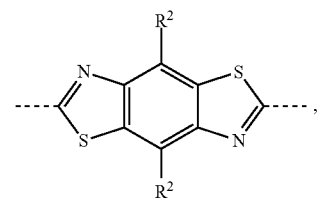

wherein each $R^2$ is independently selected from hydrogen, a halogen, cyano, or a $C_1$-$C_{18}$ organic radical selected from optionally substituted normal or branched alkyls, alkoxys, or thioalkyls;
e) D has one of the structures

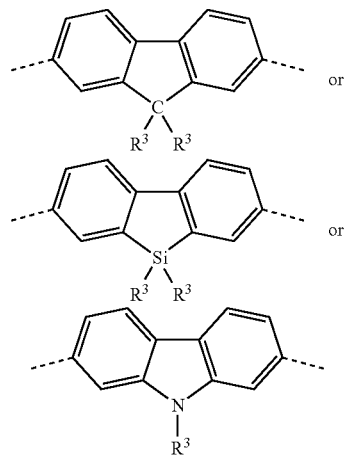

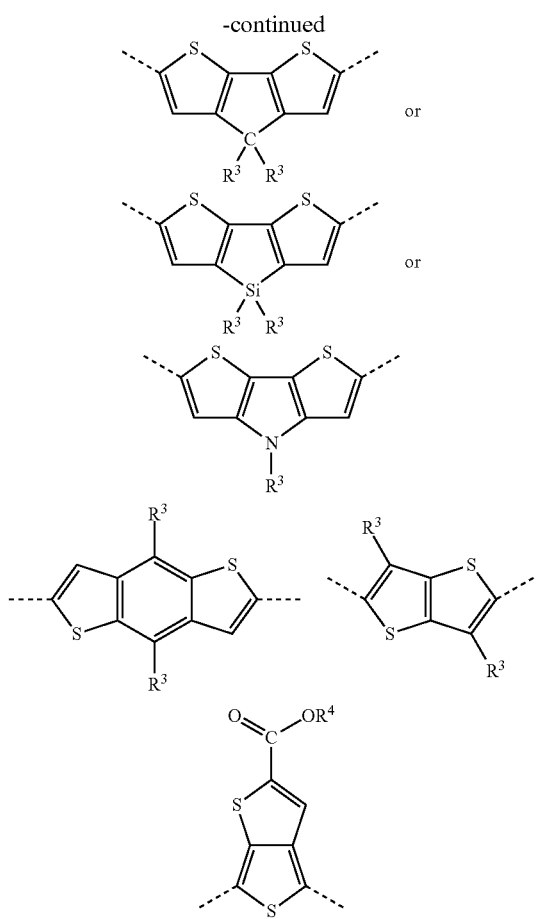

wherein each R³ is independently selected from hydrogen, a halogen, cyano, or a C1-C₁₈ organic radical selected from optionally substituted normal or branched alkyls, alkoxys, or thioalkyls, and R⁴ is a $C_1$-$C_{18}$ optionally substituted normal or branched alkyl, or phenyl.

2. An electronic device comprising one or more copolymers from claim 1.

3. The electronic device of claim 2 that is a transistor.

4. A transistor of claim 3 that has been thermally annealed at a temperature of at least about 150° C.

5. The electronic device of claim 2 that is a solar cell.

6. The solar cell of claim 5 that comprises an active layer comprising the one or more copolymers that is applied, from a hot solvent and dried under vacuum immediately after the deposition the copolymers.

7. A composition comprising at least one polymer of claim 1 and one or more electron accepting materials.

8. The composition of claim 7 wherein the electron accepting material is selected from Phenyl-[6,6]-C-61-butyric acid methyl ester ($PC_{61}BM$) and Phenyl-[6,6]-C-71-butyric acid methyl ester ($PC_{71}BM$).

9. he copolymers of claim 1, wherein each of R¹, R³ and R⁴ are independently selected from a $C_4$-$C_{12}$ organic radical selected from n-alkyl, n-alkoxy, or n-thioalkyl, and each R² is independently selected from hydrogen, flouride, cyano, or a $C_4$-$C_{12}$ organic radical selected from n-alkyl, n-alkoxy, or thioalkyl.

10. A copolymer comprising the structure:

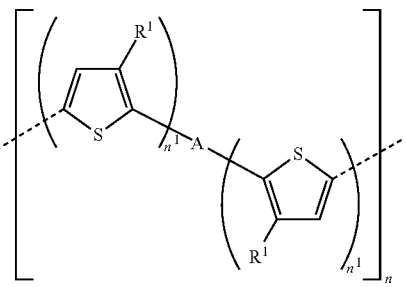

wherein a) n is a positive integer of 2 or greater, b) n¹ is 1, 2, 3, or 4, c) each R¹ is independently selected from hydrogen, a halogen, cyano, or a $C_1$-$C_{18}$ organic radical selected from optionally substituted normal or branched alkyls, alkoxys, or thioalkyls;

d) A has one of the structures

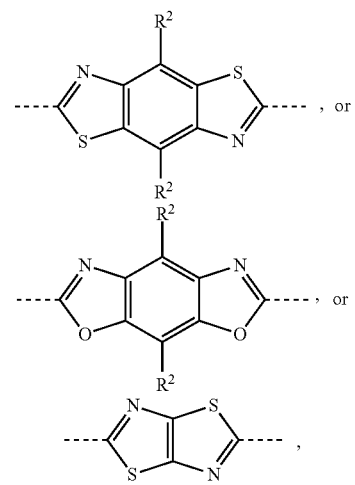

wherein each R² is independently selected from hydrogen, a halogen, cyano, or a $C_1$-$C_{18}$ organic radical selected from optionally substituted normal or branched alkyls, alkoxys, or thioalkyls;

e) D has the structure

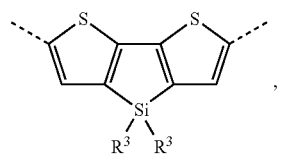

wherein each R³ is independently selected from hydrogen, a halogen, cyano, or a $C_1$-$C_{18}$ organic radical selected from optionally substituted normal or branched alkyls, alkoxys, or thioalkyls, and R⁴ is a $C_1$-$C_{18}$ optionally substituted normal or branched alkyl, or phenyl.

11. An electronic device comprising one or more copolymers from claim 10.

12. The electronic device of claim 11 that is a transistor.

13. A transistor of claim 12 that has been thermally annealed at a temperature of at least about 150° C.

14. The electronic device of claim 11 that is a solar cell.

15. The solar cell of claim 14 that comprises an active layer comprising the one or more copolymers that is applied from a hot solvent and dried under vacuum immediately after the deposition the copolymers.

16. A composition comprising at least one polymer of claim 10 and one or more electron accepting materials.

17. The composition of claim 16 wherein the electron accepting material is selected from Phenyl-[6,6]-C-61-butyric acid methyl ester ($PC_{61}BM$) and Phenyl-[6,6]-C-71-butyric acid methyl ester ($PC_{71}BM$).

18. The copolymers of claim 10, wherein each of $R^1$, $R^3$ and $R^4$ are independently selected from a $C_4$-$C_{12}$ organic radical selected from n-alkyl, n-alkoxy, or n-thioalkyl, and each $R^2$ is independently selected from hydrogen, flouride, cyano, or a $C_4$-$C_{12}$ organic radical selected from n-alkyl, n-alkoxy, or thioalkyl.

19. A copolymer having a structure selected from the group consisting of:

a)

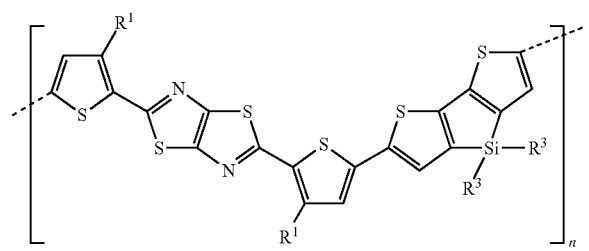

wherein $R^1$ and $R^3$ are $C_4$-$C_{12}$ n-alkyls or n-alkoxides, n is a positive integer of 2 or greater;

b)

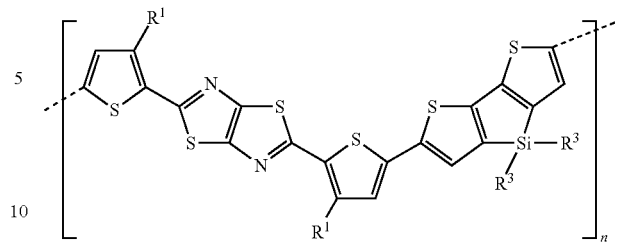

wherein $R^1$ and $R^3$ are $C_4$-$C_{12}$ branched alkyls, n is a positive integer of 2 or greater;

c)

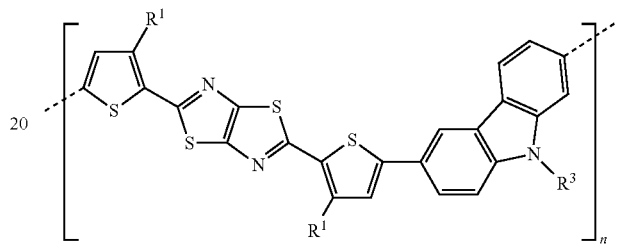

wherein $R^1$ and $R^3$ are $C_4$-$C_{12}$ branched alkyls, n is a positive integer of 2 or greater; and d)

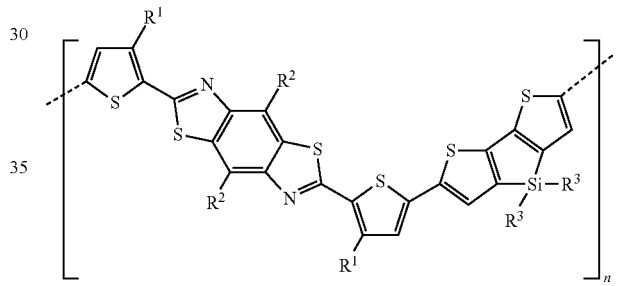

wherein $R^1$ and $R^3$ are independently $C_4$-$C_{12}$ n-alkyl or n-alkoxides and $R^2$ is hydrogen, $C_4$-$C_{12}$ n-alkyl or n-alkoxides, n is a positive integer of 2 or greater.

* * * * *